(12) United States Patent
Yoon et al.

(10) Patent No.: US 11,610,898 B2
(45) Date of Patent: Mar. 21, 2023

(54) METHOD OF FABRICATING SEMICONDUCTOR DEVICE USING MULTIPE PHOTOLITHOGRAPHY FOR PATTERNING

(71) Applicant: Samsung Electronics Co., Ltd., Suwon-si (KR)

(72) Inventors: Hyun-Chul Yoon, Seongnam-si (KR); Sungun Kwon, Suwon-si (KR); Hanseung Kwak, Hwaseong-si (KR); Jihee Kim, Yongin-si (KR); Sunghoon Choi, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/237,208

(22) Filed: Apr. 22, 2021

(65) Prior Publication Data
US 2022/0115383 A1    Apr. 14, 2022

(30) Foreign Application Priority Data

Oct. 8, 2020   (KR) ......................... 10-2020-0130554

(51) Int. Cl.
*H01L 27/108* (2006.01)

(52) U.S. Cl.
CPC .. *H01L 27/10894* (2013.01); *H01L 27/10814* (2013.01); *H01L 27/10823* (2013.01); *H01L 27/10855* (2013.01); *H01L 27/10876* (2013.01); *H01L 27/10885* (2013.01); *H01L 27/10897* (2013.01)

(58) Field of Classification Search
None
See application file for complete search history.

(56) References Cited

U.S. PATENT DOCUMENTS 5,578,519 A  * 11/1996 Cho ..................... H01L 23/544
                                                257/E23.179
7,534,695 B2 *  5/2009 Suzuki ............. H01L 27/10894
                                                257/E23.179

(Continued)

FOREIGN PATENT DOCUMENTS

KR       10-0165353 B1    9/1998
KR    1020000066094 A    11/2000

(Continued)

*Primary Examiner* — Steven M Christopher
(74) *Attorney, Agent, or Firm* — Muir Patent Law, PLLC

(57) ABSTRACT

Disclosed are semiconductor devices and their fabrication methods. The method includes forming an etching target on a substrate including cell and key regions, forming lower and upper mask layers on the etching target, performing photolithography to form an upper mask pattern including a hole on the cell region, a preliminary key pattern on the key region, a bar pattern on the key region, and a trench between the preliminary key pattern and the bar pattern, forming pillar and dam patterns filling the hole and the trench, performing photolithography to remove the upper mask pattern except for the bar pattern, using the pillar pattern, the dam pattern, and the bar pattern as an etching mask to form a lower mask pattern, and using the lower mask pattern as an etching mask to form an etching target pattern on the cell region and a key pattern on the key region.

20 Claims, 63 Drawing Sheets

(56) References Cited

U.S. PATENT DOCUMENTS

| | | | |
|---|---|---|---|
| 8,502,355 B2* | 8/2013 | Lee | H01L 23/544 |
| | | | 257/E21.24 |
| 10,026,694 B2* | 7/2018 | Lee | H01L 27/10885 |
| 10,395,976 B1 | 8/2019 | Shih et al. | |
| 2014/0065524 A1* | 3/2014 | Lee | H01L 21/302 |
| | | | 438/689 |
| 2015/0340246 A1* | 11/2015 | Woo | G03F 7/16 |
| | | | 430/323 |
| 2017/0053802 A1* | 2/2017 | Park | G03F 7/0002 |
| 2017/0125248 A1 | 5/2017 | Siew et al. | |
| 2017/0148643 A1* | 5/2017 | Ham | H01L 21/3086 |
| 2018/0151362 A1* | 5/2018 | Kang | H01L 21/02118 |

FOREIGN PATENT DOCUMENTS

| | | |
|---|---|---|
| KR | 1020080034568 A | 4/2008 |
| KR | 1020140028916 A | 3/2014 |
| TW | I694519 B | 5/2020 |

\* cited by examiner

FIG. 1
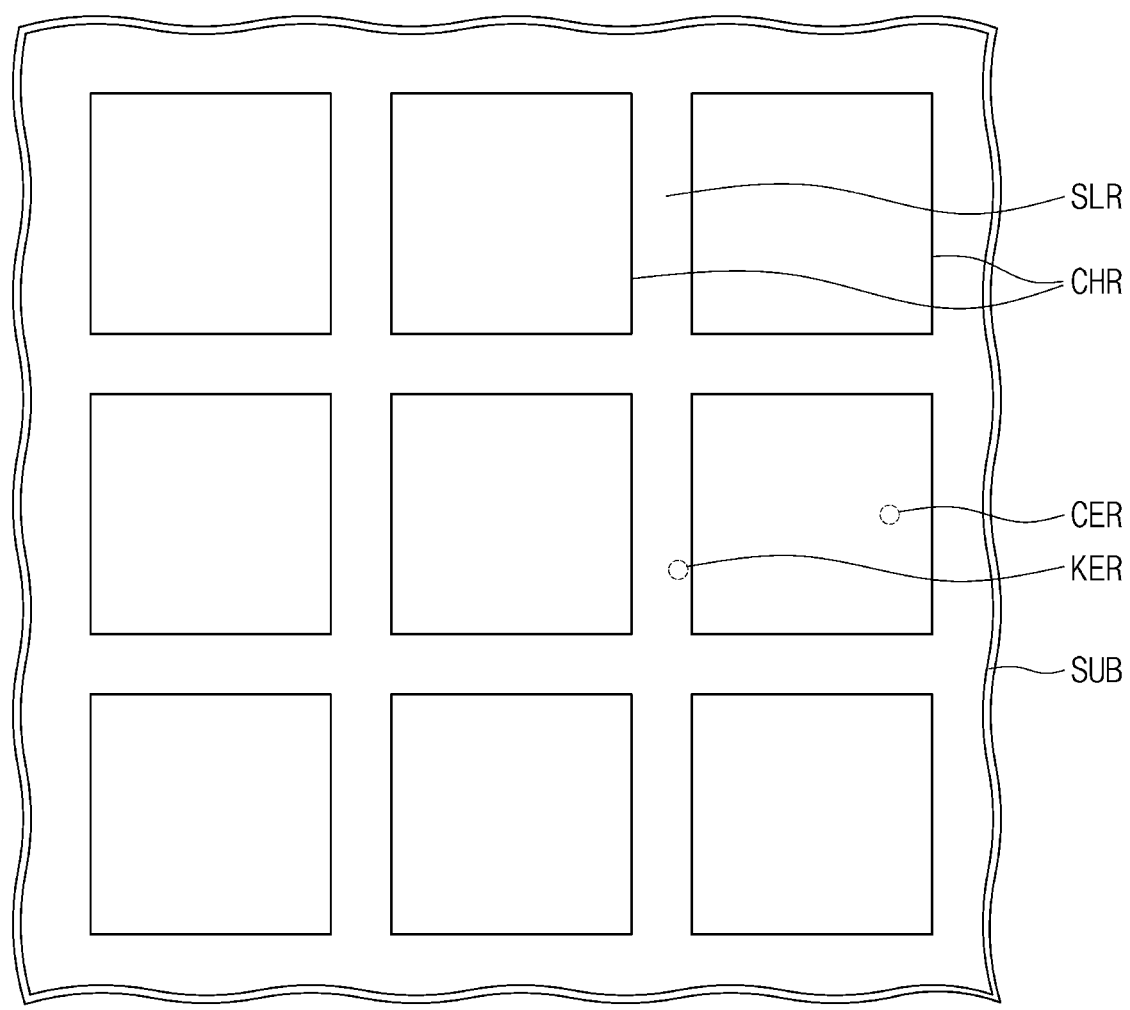
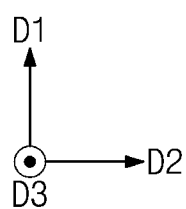

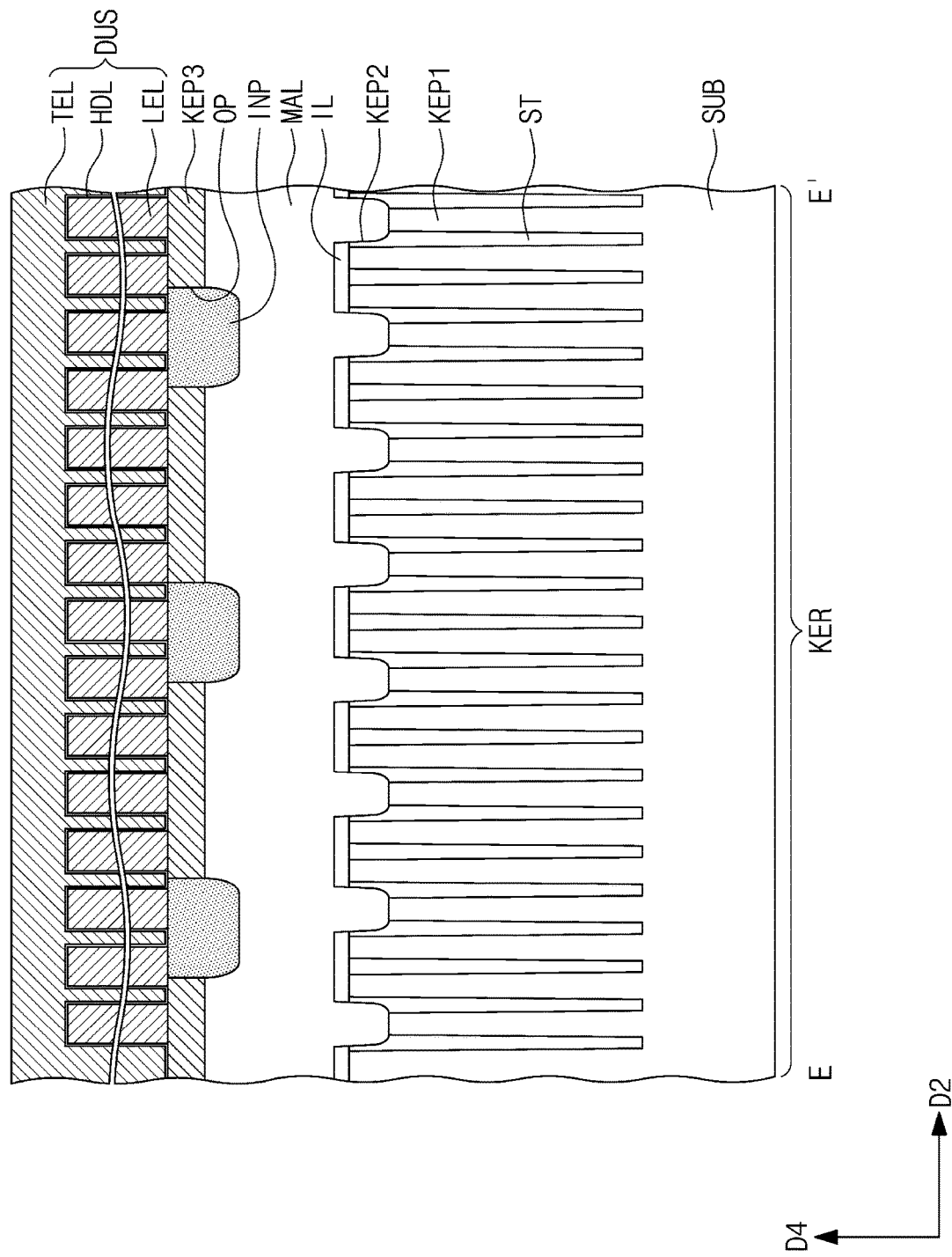

METHOD OF FABRICATING SEMICONDUCTOR DEVICE USING MULTIPE PHOTOLITHOGRAPHY FOR PATTERNING

CROSS-REFERENCE TO RELATED APPLICATION

This U.S. nonprovisional application claims priority under 35 U.S.C § 119 to Korean Patent Application No. 10-2020-0130554 filed on Oct. 8, 2020 in the Korean Intellectual Property Office, the disclosure of which is hereby incorporated by reference in its entirety.

BACKGROUND

The present inventive concepts relate to a semiconductor device and a method of fabricating the same, and more particularly, to a semiconductor device with increased reliability and a method of fabricating the same.

Semiconductor devices have an important role in the electronic industry because of their small size, multi-functionality, and/or low fabrication costs. Data storage devices among the semiconductor devices can store logic data. The data storage devices are increasingly integrated with the development of the electronic industry. As a result, line widths of components constituting the data storage devices continue to decrease.

Additionally, high reliability has been desirable with the high integration of the data storage devices. However, the high integration may reduce the reliability of the data storage devices. Therefore, various studies have been conducted to improve the reliability of the data storage devices.

SUMMARY

Some example embodiments of the present inventive concepts provide a semiconductor device with increased reliability.

Some example embodiments of the present inventive concepts provide a method of fabricating a semiconductor device with increased reliability.

According to some example embodiments of the present inventive concepts, a method of fabricating a semiconductor device may comprise forming an etching target layer on a substrate that includes a cell region and a key region, sequentially forming a lower mask layer and an upper mask layer on the etching target layer, performing a first photolithography process to pattern the upper mask layer to form an upper mask pattern, the upper mask pattern including a plurality of holes on the cell region, a preliminary key pattern on the key region, a bar pattern on the key region, and a trench between the preliminary key pattern and the bar pattern, forming a pillar pattern and a dam pattern that correspondingly fill the plurality of holes and the trench of the upper mask pattern, performing a second photolithography process to selectively remove the upper mask pattern except for the bar pattern, patterning, using the pillar pattern, the dam pattern, and the bar pattern as an etching mask, the lower mask layer to form a lower mask pattern, and patterning, using the lower mask pattern as an etching mask, the etching target layer to form an etching target pattern on the cell region and a key pattern on the key region.

According to some example embodiments of the present inventive concepts, a method of fabricating a semiconductor device may comprise forming a metal layer on a substrate that includes a cell region and a key region, forming a mask pattern on the metal layer, the mask pattern on the cell region including a plurality of holes, and the mask pattern on the key region including a trench that extends in a first direction, forming on the mask pattern a dielectric layer that fills the plurality of holes and the trench, performing an etch-back process on the dielectric layer to expose a top surface of the mask pattern on the cell region, thereby forming a plurality of pillar patterns to fill the plurality of holes and a dam pattern to fill the trench, removing the mask pattern, and patterning, using the plurality of pillar patterns and the dam pattern as an etching mask, the metal layer to form a plurality of landing pads on the cell region and a key pattern on the key region.

According to some example embodiments of the present inventive concepts, a method of fabricating a semiconductor device may comprise forming a first trench by performing a patterning process on a substrate that includes a cell region and a key region, the first trench defining an active pattern on the cell region, forming a device isolation layer that fills the first trench, forming a second trench by patterning an upper portion of the active pattern and an upper portion of the device isolation layer, the second trench extending in a first direction, forming a gate electrode in the second trench, forming on the active pattern a line structure that extends in a second direction different from the first direction, the line structure including a contact part and a bit line on the contact part, the contact part being coupled to a first region of the active pattern, forming on a first sidewall of the line structure a contact coupled to a second region of the active pattern, forming a metal layer on the cell region and the key region, patterning the metal layer to form a landing pad on the cell region and a key pattern on the key region, the landing pad being connected to the contact, and forming a capacitor on the landing pad. The step of forming the landing pad and the key pattern may include: sequentially forming a lower mask layer and an upper mask layer on the metal layer, performing a first photolithography process to pattern the upper mask layer to form an upper mask pattern, the upper mask pattern including a hole on the cell region and a trench on the key region, forming a pillar pattern and a dam pattern that correspondingly fill the hole and the trench of the upper mask pattern, removing the upper mask pattern, patterning, using the pillar pattern and the dam pattern as a first etching mask, the lower mask layer to form a lower mask pattern, and patterning, using the lower mask pattern as a second etching mask, the metal layer to form the landing pad on the cell region and the key pattern on the key region.

According to some example embodiments of the present inventive concepts, a semiconductor device may comprise a substrate that includes a cell region provided with an active pattern and a key region, a gate electrode that extends lengthwise across the active pattern in a first direction, a line structure that extends lengthwise in a second direction on the active pattern, the line structure including a contact part and a bit line on the contact part, the contact part being coupled to a first region of the active pattern, a contact on a sidewall of the line structure, the contact being coupled to a second region of the active pattern, a landing pad on the contact, a capacitor on the landing pad, and a key pattern on the key region. The key pattern and the landing pad may include the same metallic material as each other. The landing pad may be provided in plural. The plurality of landing pads may be arranged in a first column and a second column such that the plurality of landing pads in each of the first column and the second column are zigzag arranged in the second direction. The landing pads of the first column may be spaced apart from each other at a first pitch. The landing pads of the second column may be spaced apart from each other at a second pitch substantially the same as the first pitch. The first pitch may be different from a distance between a center of a first landing pad included in the first column and a center of a second landing pad included in the second column. The second landing pad may be adjacent to the first landing pad.

BRIEF DESCRIPTION OF THE DRAWINGS

FIG. 1 illustrates a simplified plan view showing a wafer or a substrate on which is formed a semiconductor device according to some example embodiments of the present inventive concepts.

FIGS. 3A, 3B, 3C, 3D, and 3E illustrate cross-sectional views respectively taken along lines A-A', B-B', C-C', D-D', and E-E' of FIG. 2.

DETAILED DESCRIPTION OF EMBODIMENTS

Figure 2:
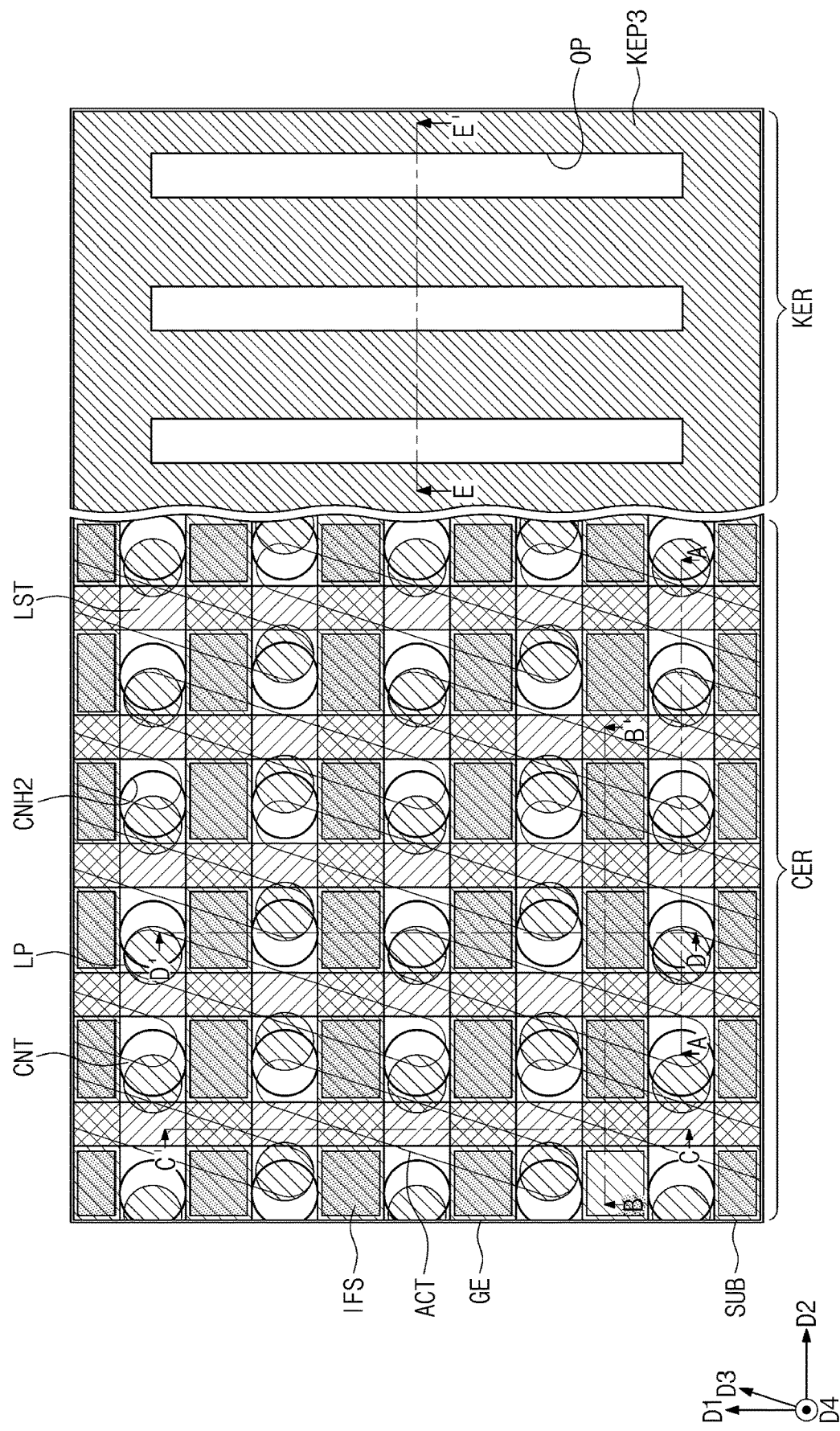
FIG. 2 illustrates a plan view showing a semiconductor device according to some example embodiments of the present inventive concepts.
Figure 3A:
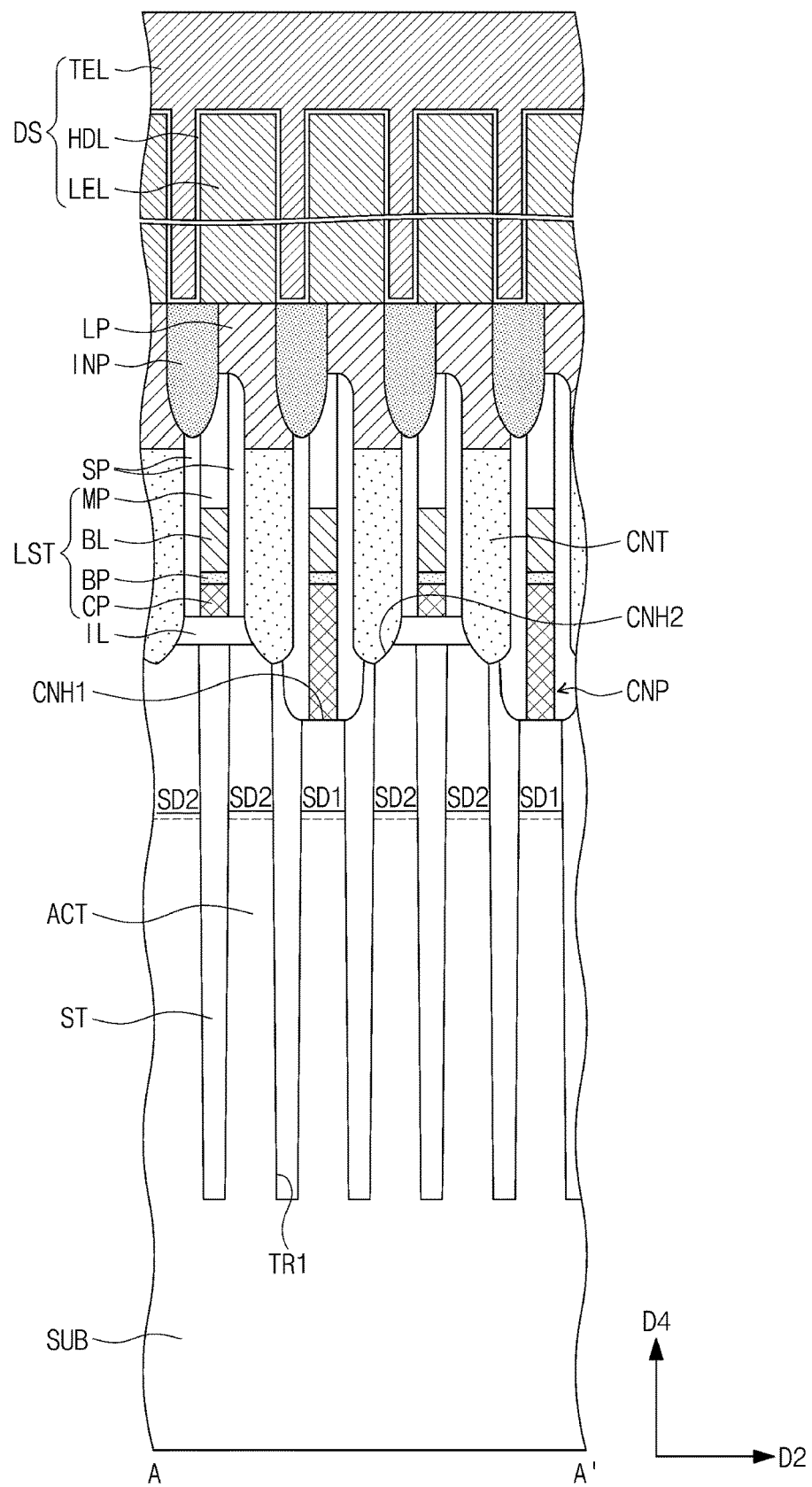
Figure 3B:
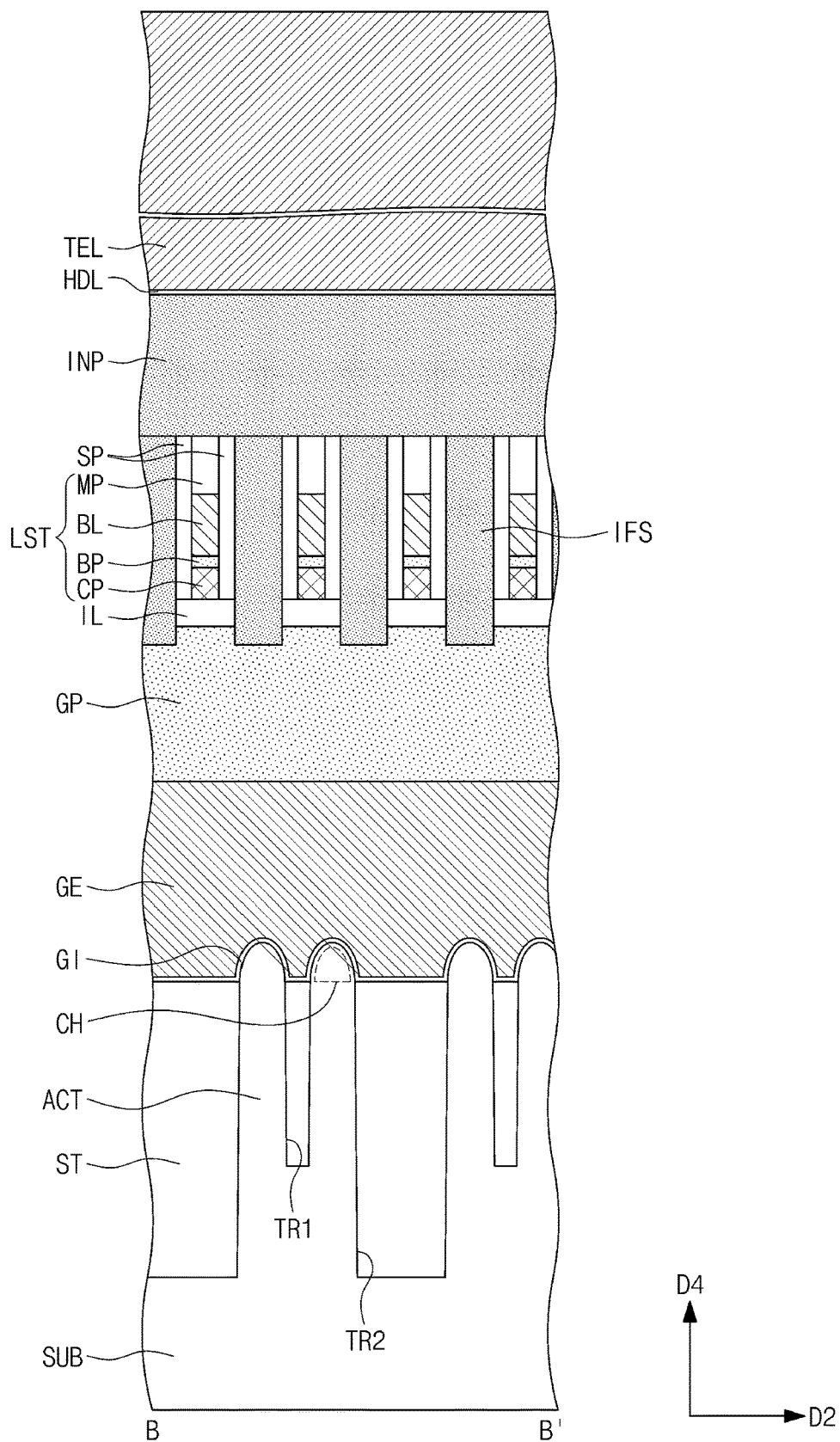

FIG. 1 illustrates a simplified plan view showing a wafer or a substrate on which is formed a semiconductor device according to some example embodiments of the present inventive concepts. FIG. 2 illustrates a plan view showing a semiconductor device according to some example embodiments of the present inventive concepts. FIGS. 3A, 3B, 3C, 3D, and 3E illustrate cross-sectional views respectively taken along lines A-A', B-B', C-C', D-D', and E-E' of FIG. 2. FIG. 4 illustrates a plan view showing landing pads according to some example embodiments of the present inventive concepts.

Referring to FIG. 1, a substrate SUB may include a plurality of chip regions CHR that are two-dimensionally arranged, and may also include a scribe line region SL between the chip regions CHR. After a semiconductor process is completed, a cutting may be performed along the scribe line region SL to separate the chip regions CHR into a plurality of dies. The chip region CHR may include a cell region CER on which memory cells are disposed. The scribe line region SL may include a key region KER on which are disposed one or more of an alignment key and an overlay key. The following will now describe in detail cell and key regions of a semiconductor device according to some example embodiments of the present inventive concepts.

First, the cell region CER will be discussed in detail with reference to FIGS. 2 and 3A to 3D. The substrate SUB may include a device isolation layer ST that defines active patterns ACT. For example, the substrate SUB may be a semiconductor substrate including silicon, germanium, or silicon-germanium. The device isolation layer ST may include a silicon oxide layer.

The active patterns ACT may be formed when an upper portion of the substrate SUB is patterned. The present inventive concepts are not limited thereto. For example, the active patterns ACT may be epitaxially formed on an upper surface of the substrate SUB. Each of the active patterns ACT may extend in a third direction D3 parallel to a top surface of the substrate SUB. For example, each of the active patterns ACT may have a major axis in the third direction D3. The active patterns ACT may be two-dimensionally arranged along first and second directions D1 and D2. The active patterns ACT may be spaced apart from each other in the third direction D3.

Each of the active patterns ACT may have a width that decreases in a vertical direction (e.g., a fourth direction D4) to the top surface of the substrate SUB. For example, the width of each active pattern ACT may decrease with increasing distance from a bottom surface of the substrate SUB.

First and second trenches TR1 and TR2 may be defined between the active patterns ACT. The device isolation layer ST may fill the first and second trenches TR1 and TR2 between the active patterns ACT. The first trench TR1 may be defined between a pair of active patterns ACT that are adjacent to each other in the second direction D2. The second trench TR2 may be defined between a pair of active patterns ACT that are adjacent to each other in the third direction D3.

A distance between a pair of active patterns ACT adjacent to each other in the second direction D2 may be less than that between a pair of active patterns ACT adjacent to each other in the third direction D3. The second trench TR2 may be deeper than the first trench TR1. For example, the second trench TR2 may have a floor lower than that of the first trench TR1 (see FIG. 3B).

Each of the active patterns ACT may have, on its upper portion, a first source/drain region SD1 and a pair of second source/drain regions SD2. The first source/drain region SD1 may be placed between the pair of second source/drain regions SD2. In such a configuration, when the substrate SUB is viewed in a plan view, the second source/drain region SD2, the first source/drain region SD1, and the second source/drain region SD2 may be sequentially arranged along the third direction D3.

Figure 3C:
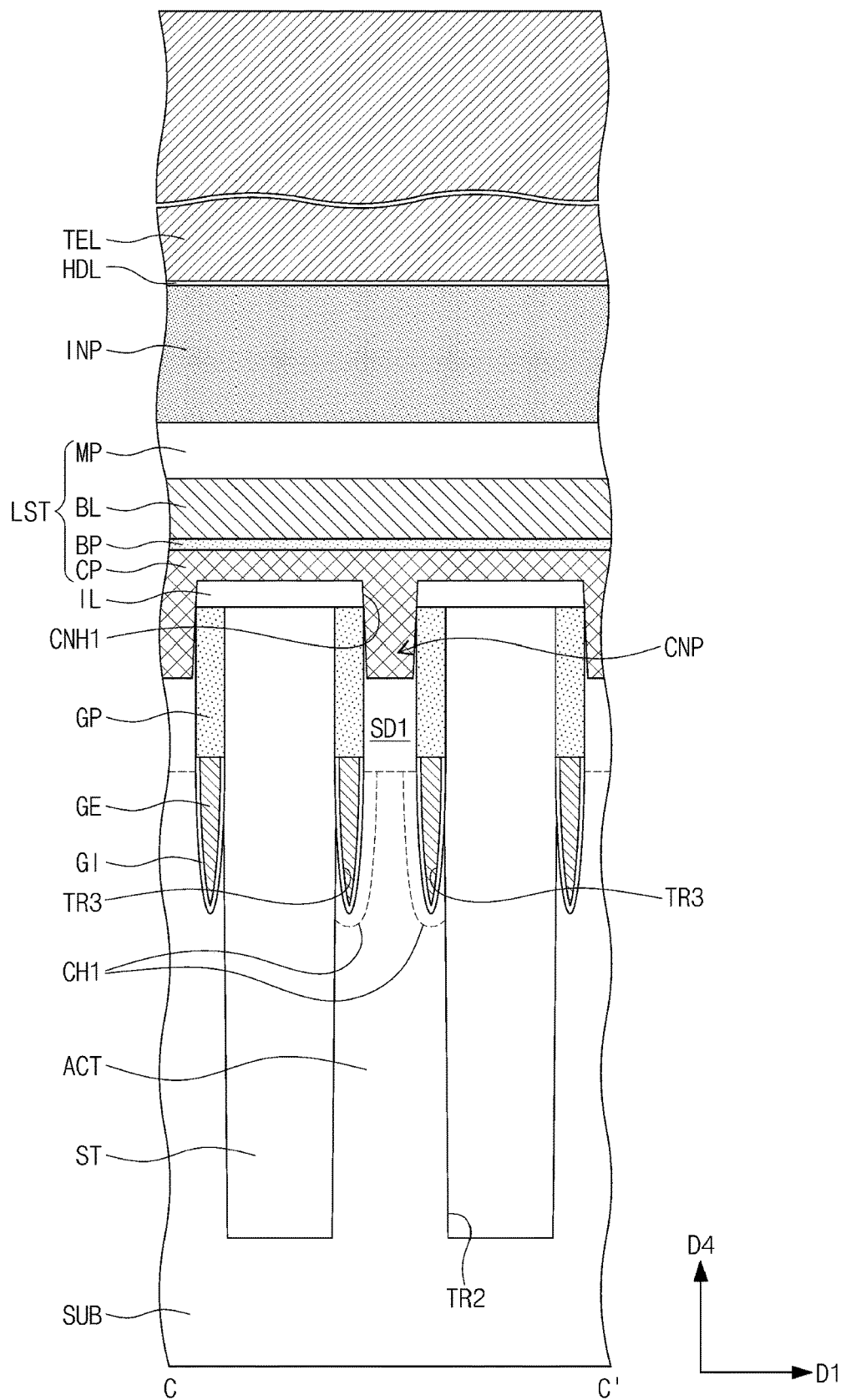
Figure 3D:
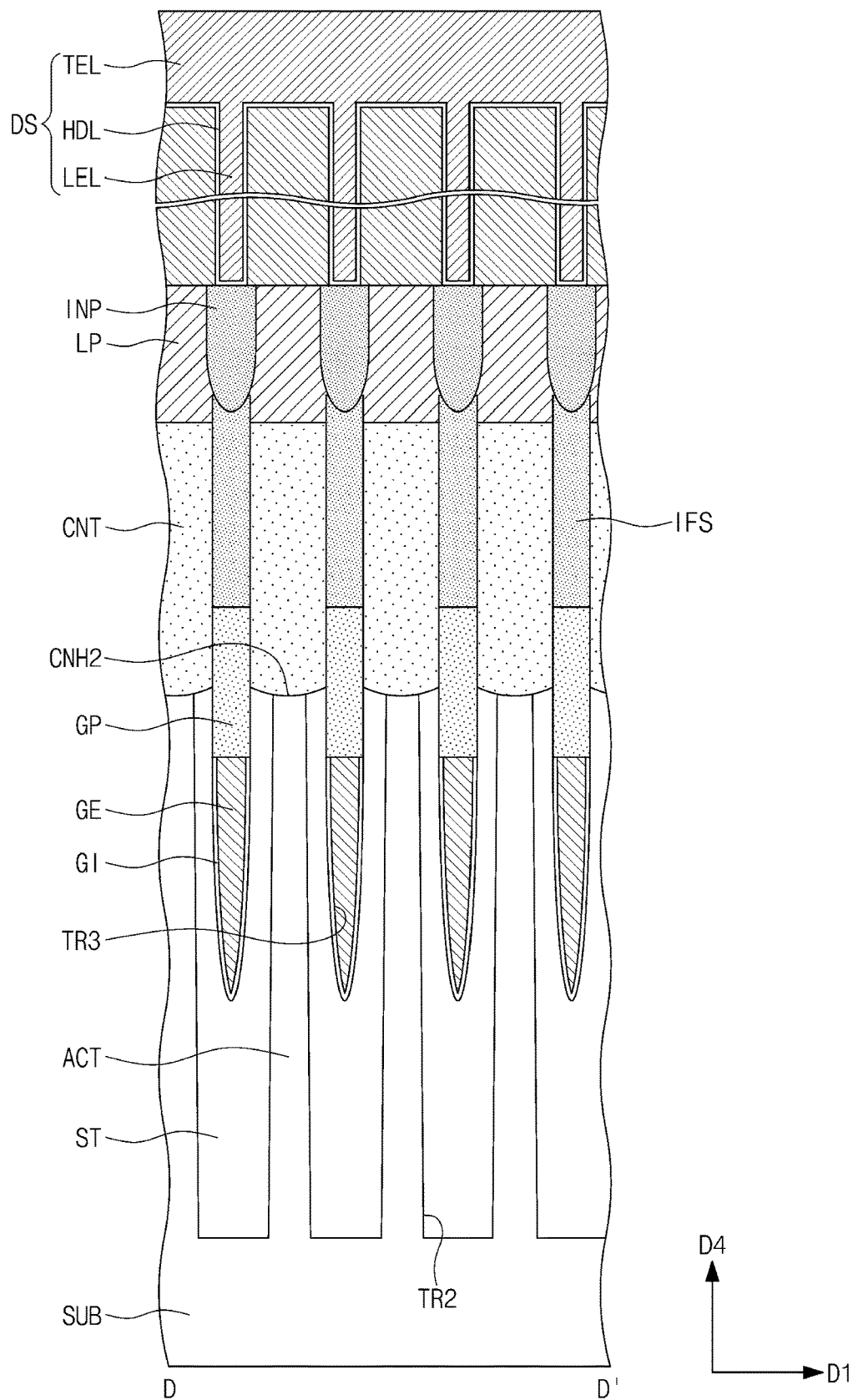
Figure 4:
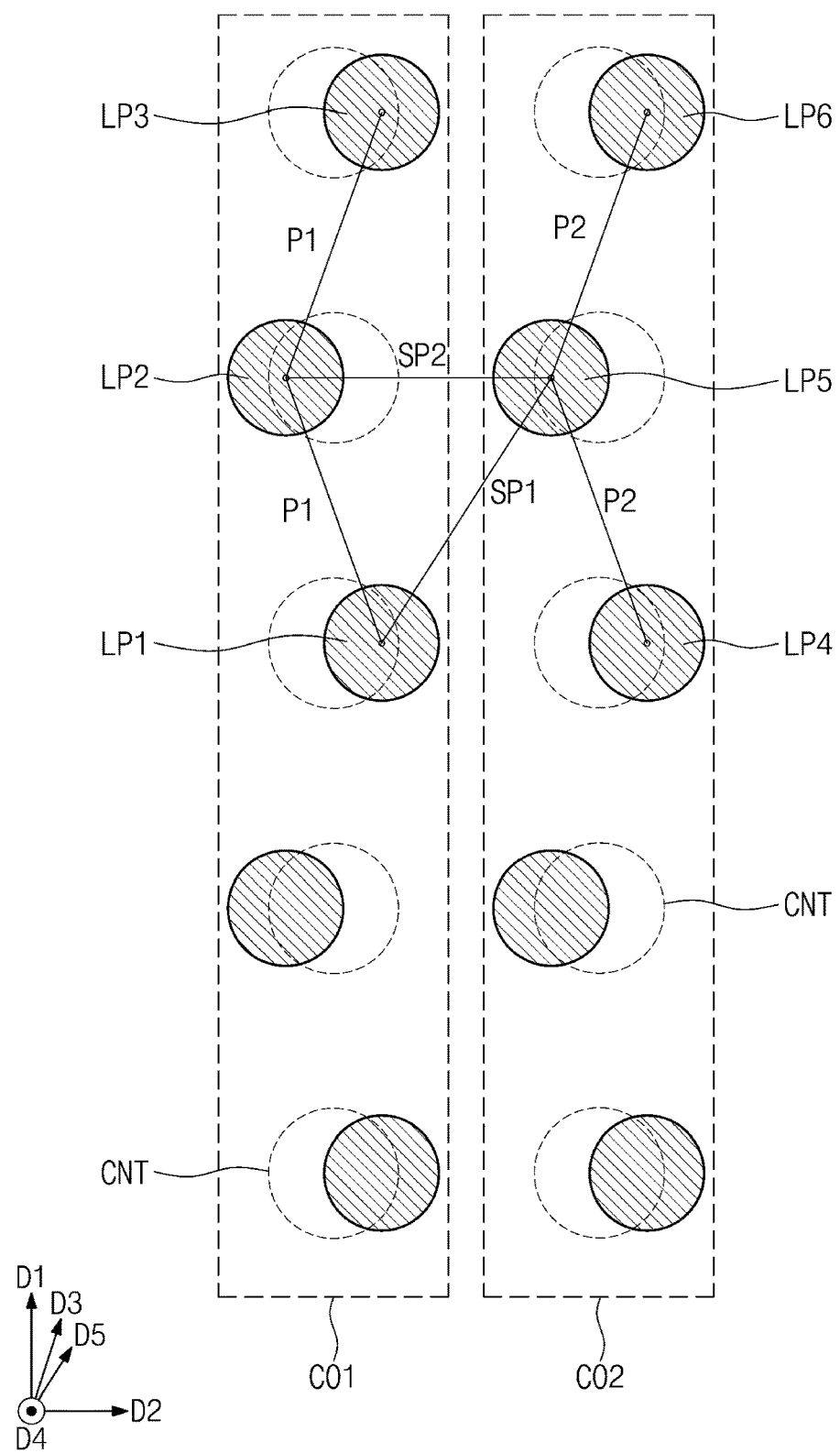
FIG. 4 illustrates a plan view showing landing pads according to some example embodiments of the present inventive concepts.
Figure 5:
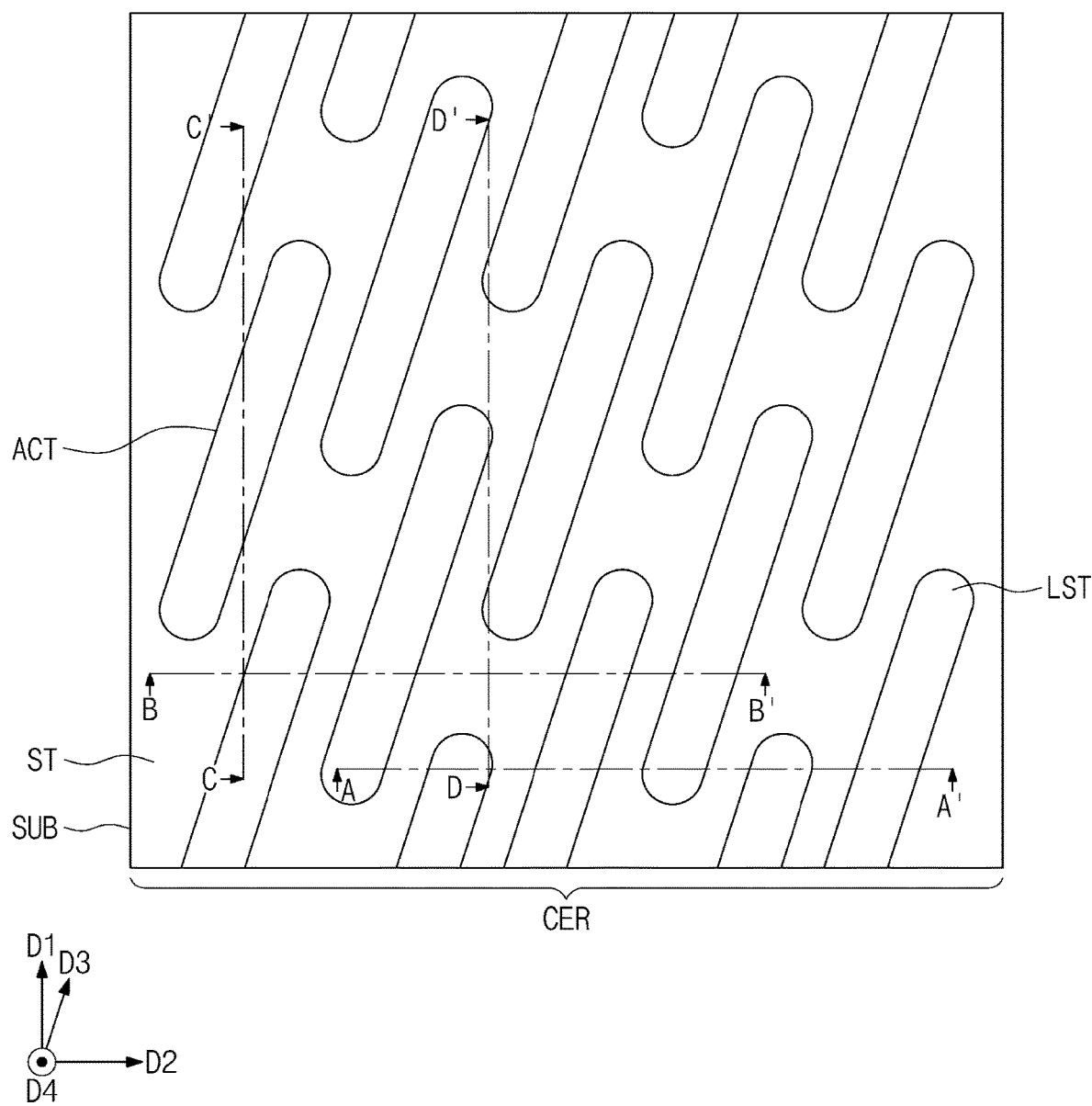
FIGS. 5, 7, 9, 11, 13, 15, and 17 illustrate plan views showing a method of fabricating a semiconductor device according to some example embodiments of the present inventive concepts.
Figure 6A:
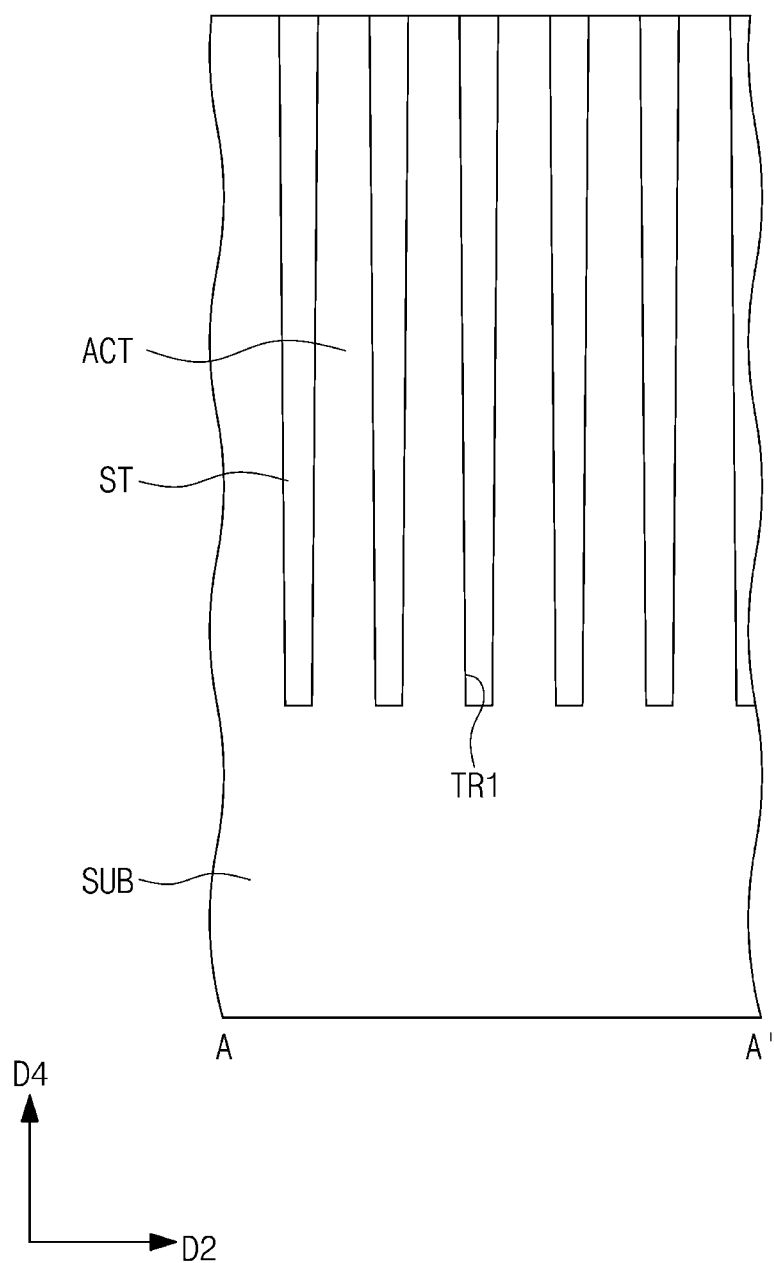
FIGS. 6A, 8A, 10A, 12A, 14A, 16A, and 18A illustrate cross-sectional views taken along line A-A' of FIGS. 5, 7, 9, 11, 13, 15, and 17, respectively.
Figure 6B:
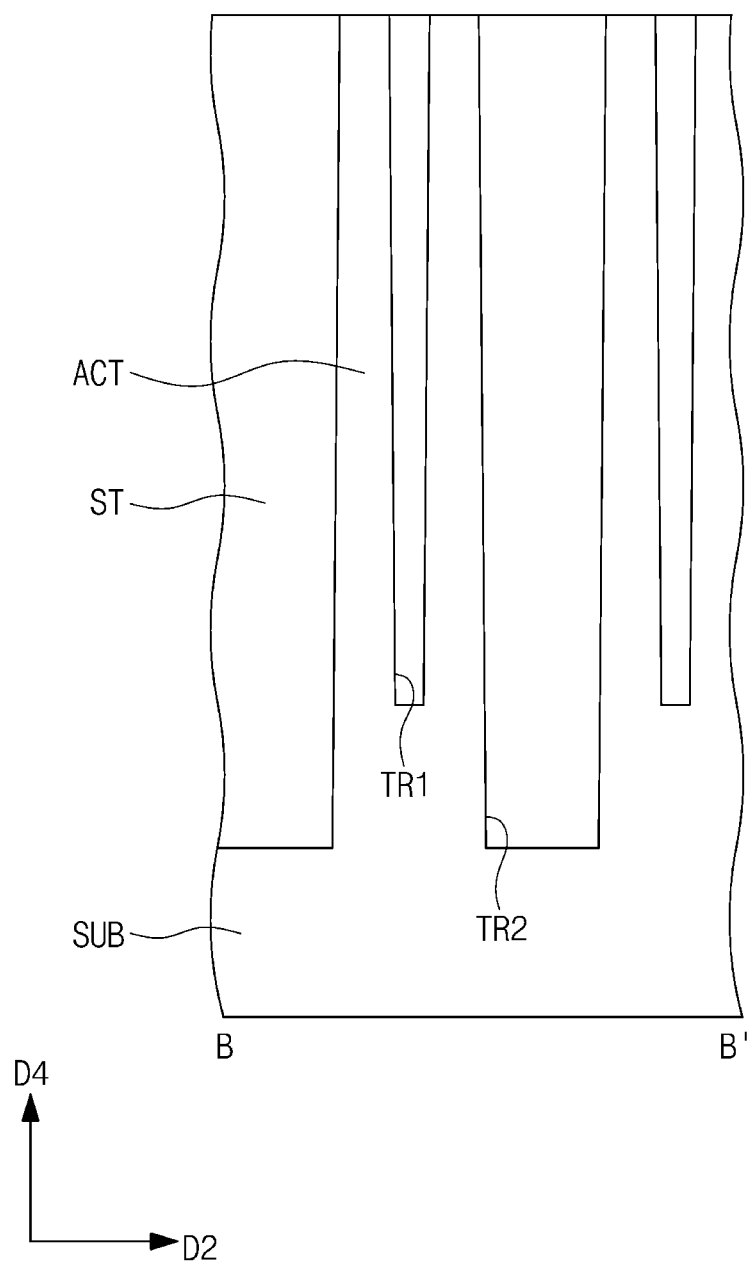
FIGS. 6B, 8B, 10B, 12B, 14B, 16B, and 18B illustrate cross-sectional views taken along line B-B' of FIGS. 5, 7, 9, 11, 13, 15, and 17, respectively.
Figure 6C:
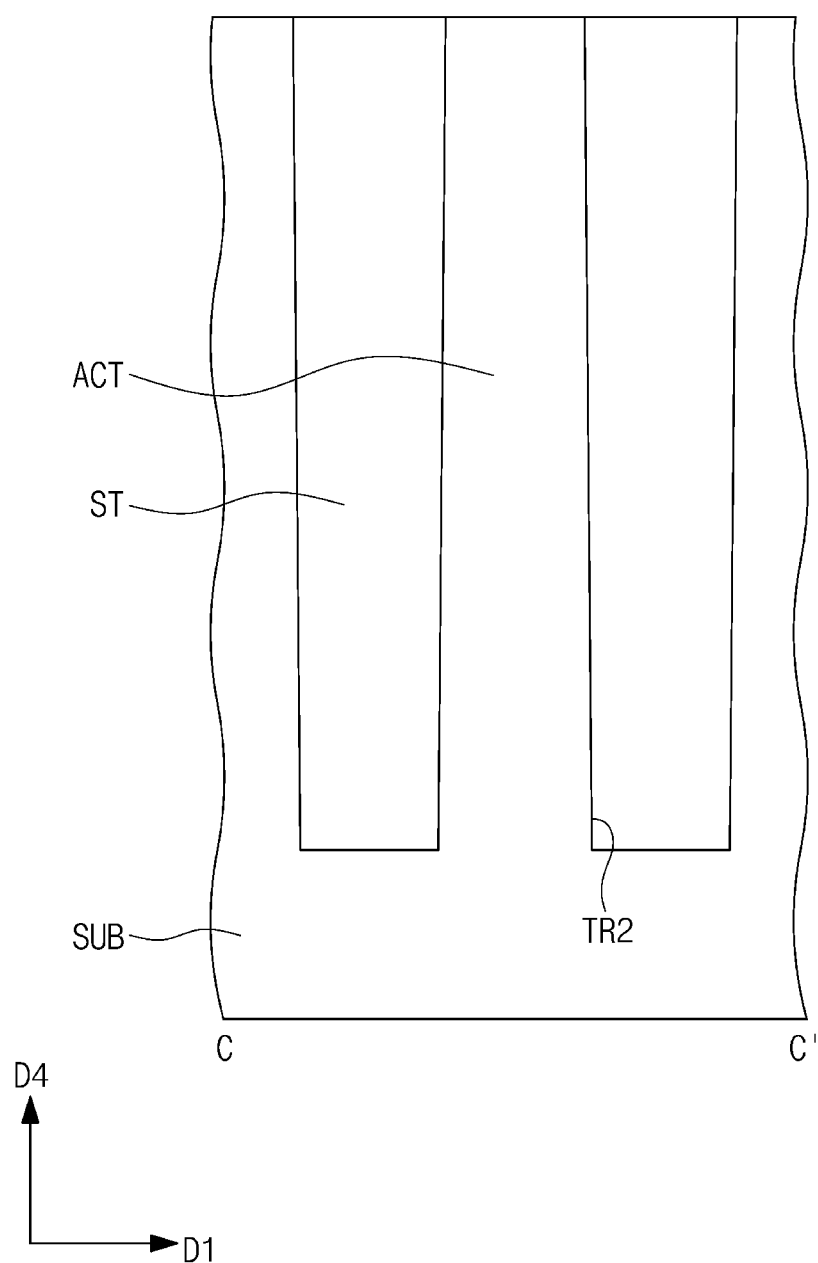
FIGS. 6C, 8C, 10C, 12C, 14C, 16C, and 18C illustrate cross-sectional views taken along line C-C' of FIGS. 5, 7, 9, 11, 13, 15, and 17, respectively.
Figure 6D:
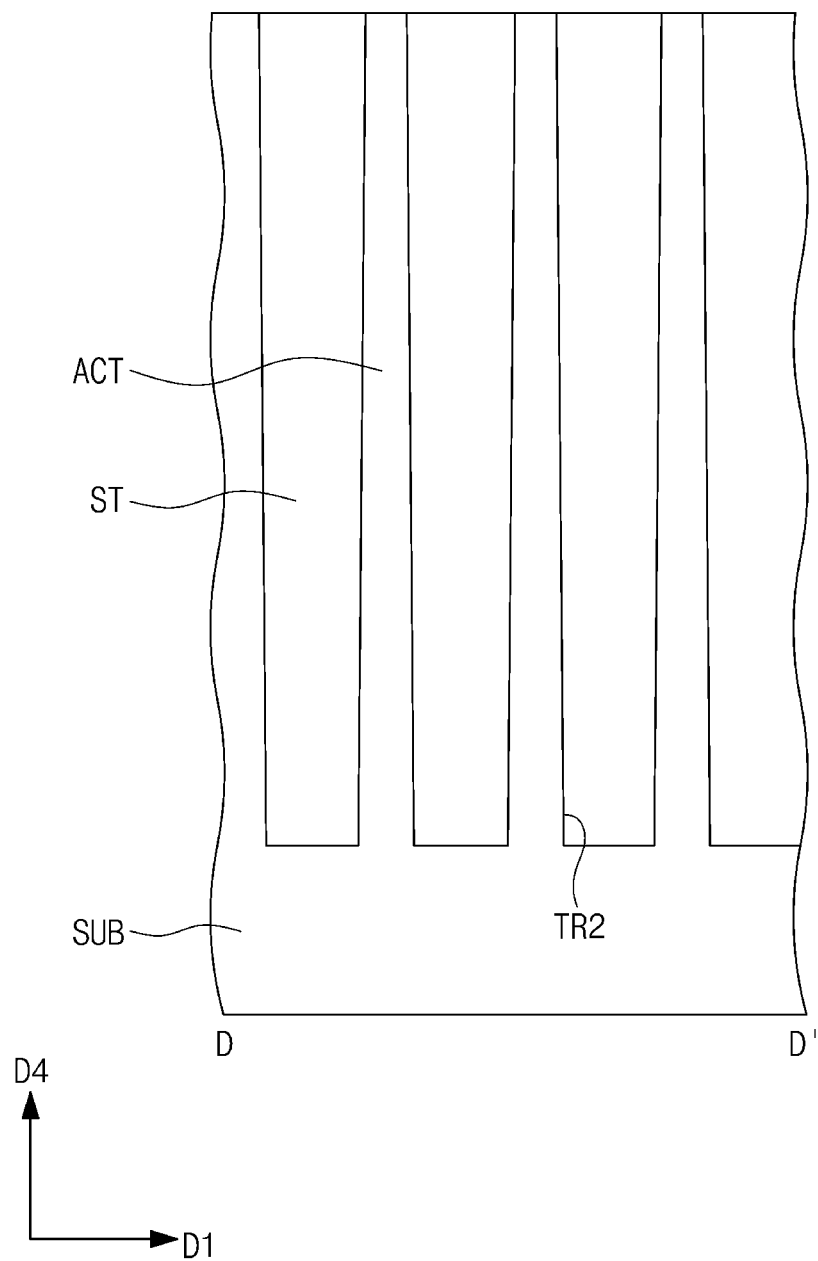
FIGS. 6D, 8D, 10D, 12D, 14D, 16D, and 18D illustrate cross-sectional views taken along line D-D' of FIGS. 5, 7, 9, 11, 13, 15, and 17, respectively.
Figure 7:
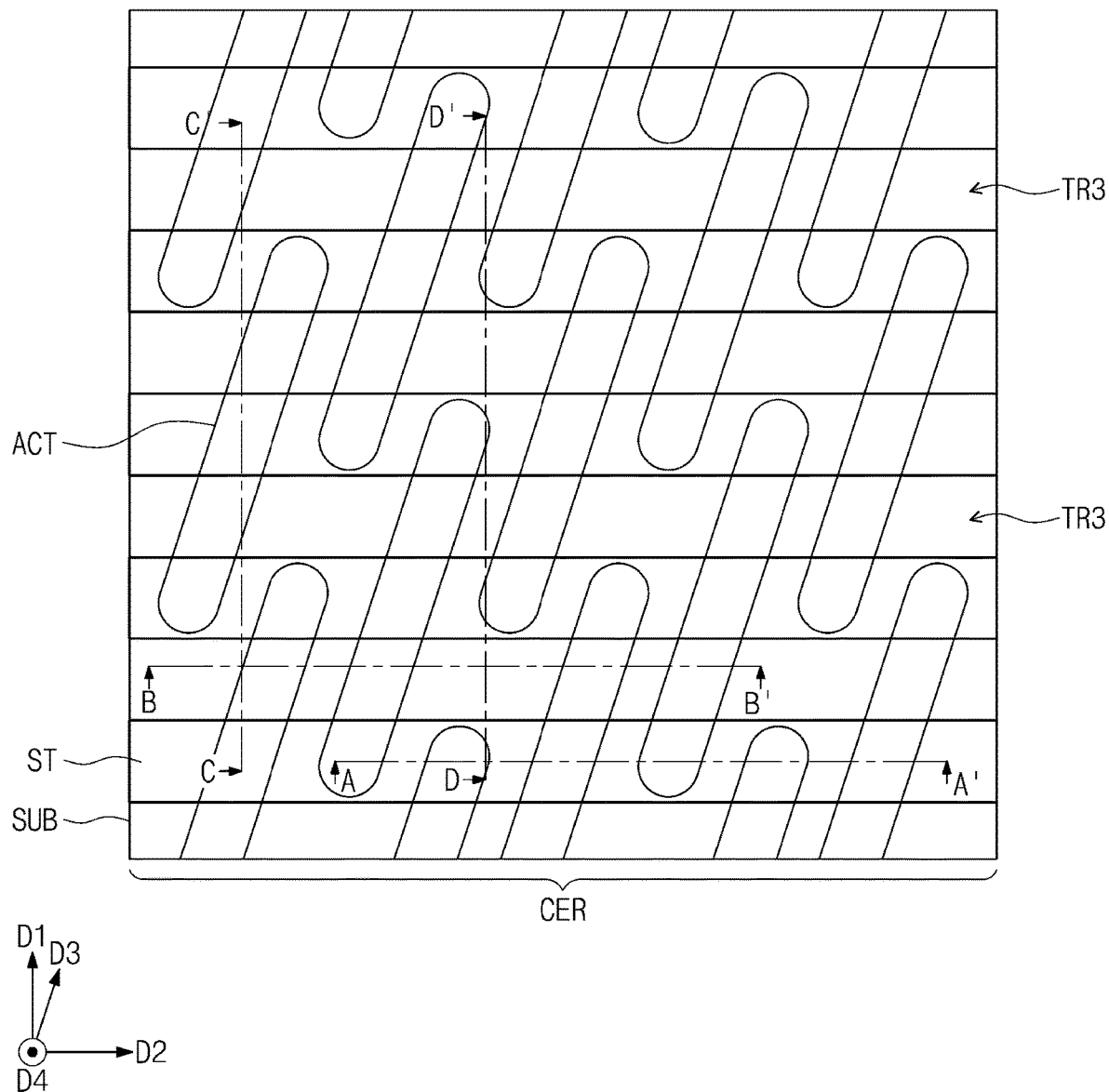
Figure 8A:
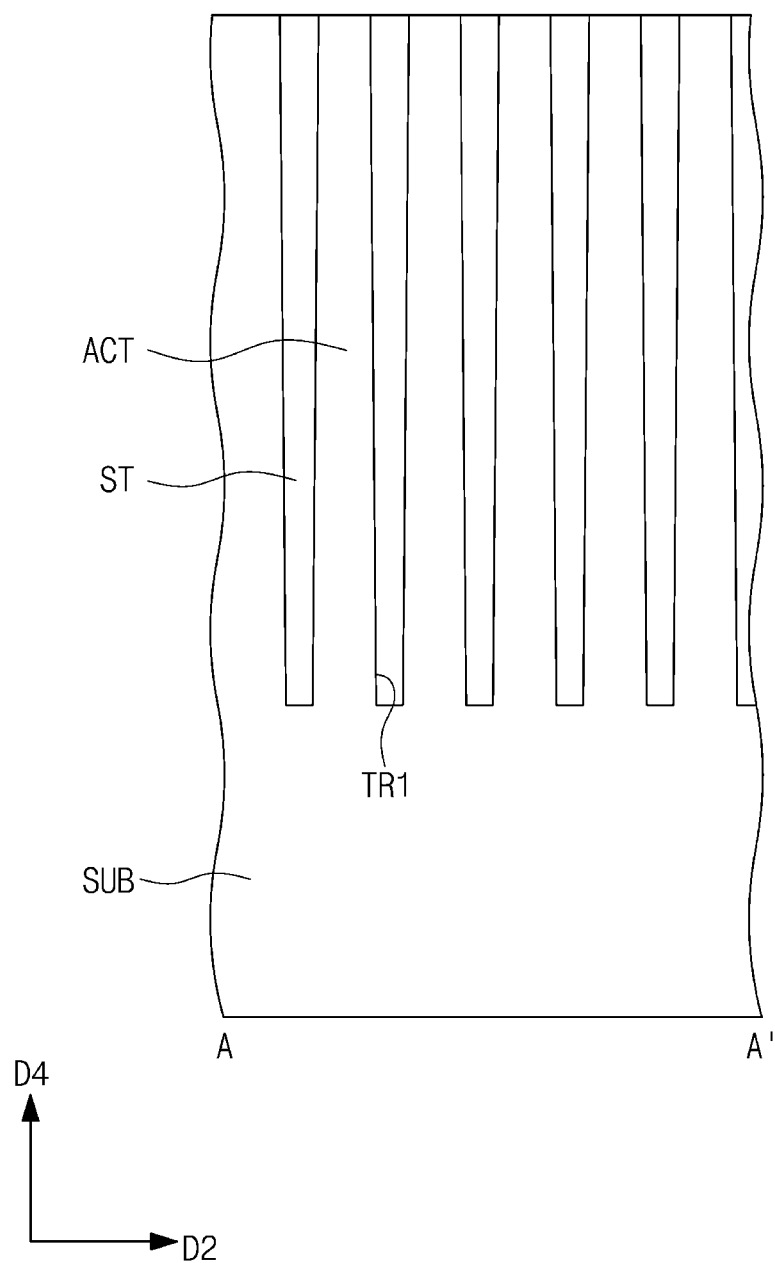
Figure 8B:
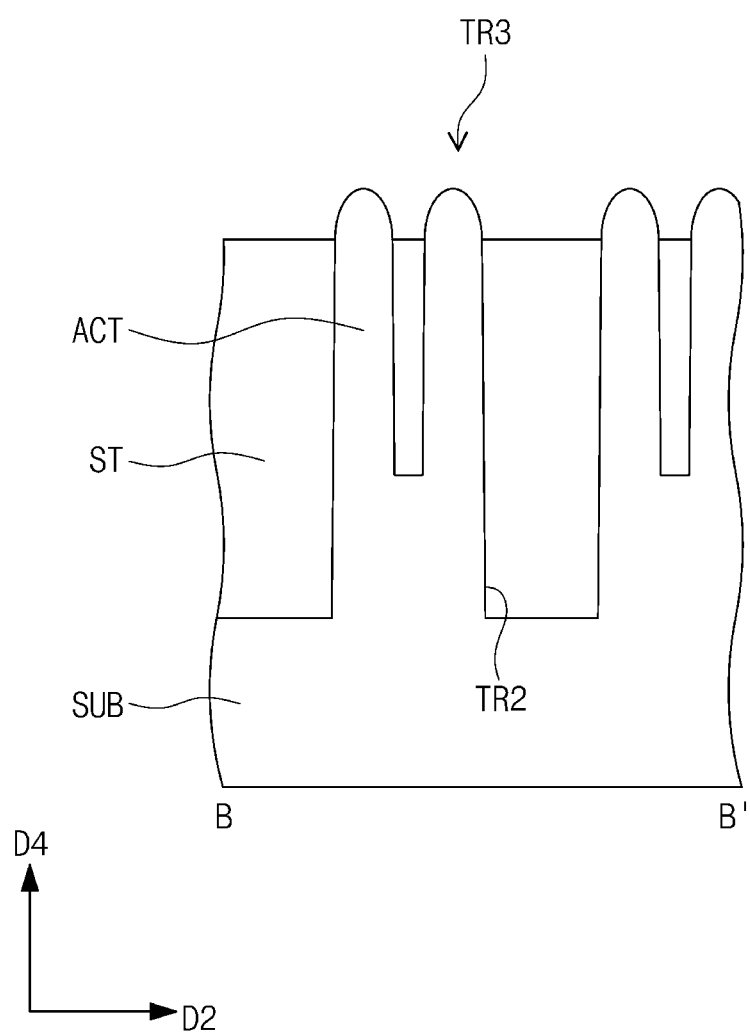
Figure 8C:
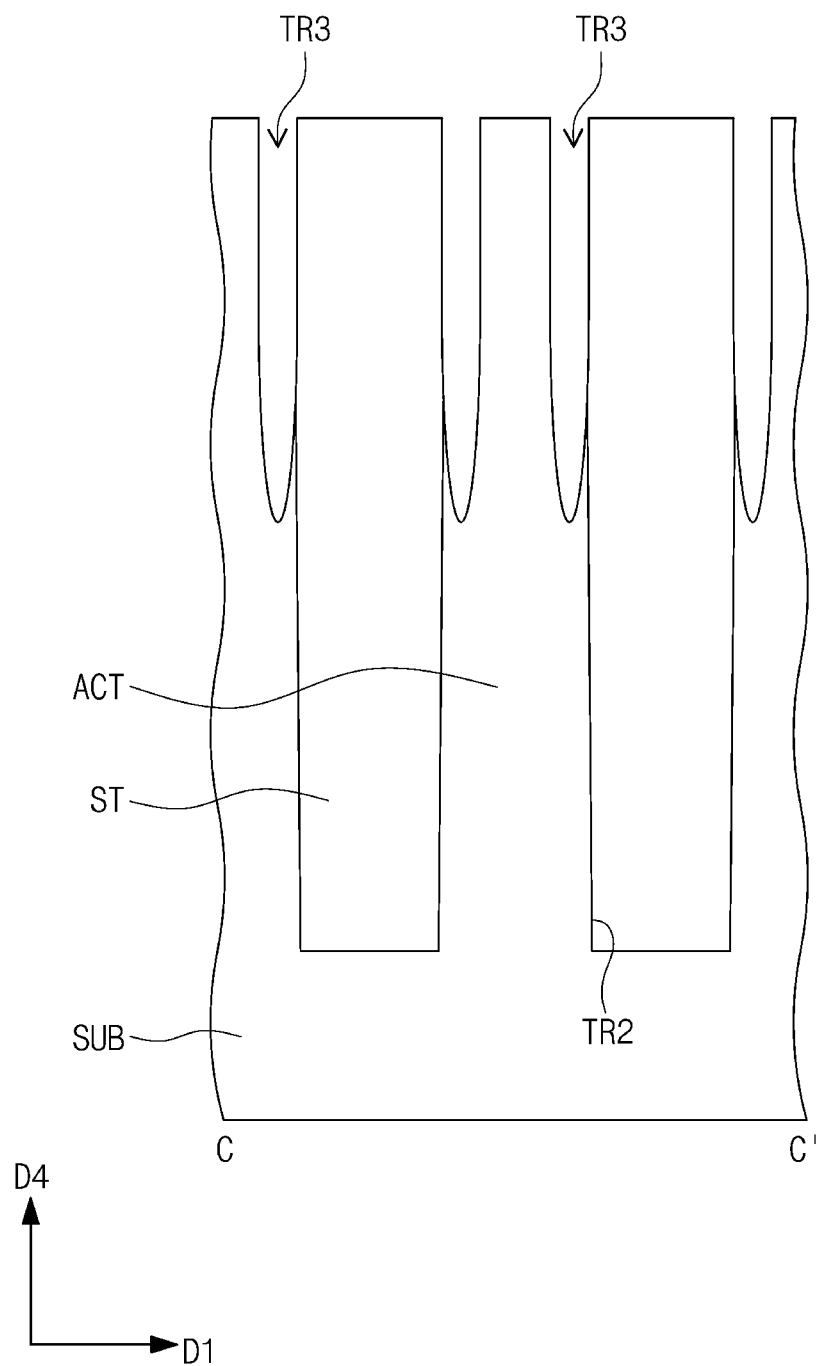
Figure 8D:
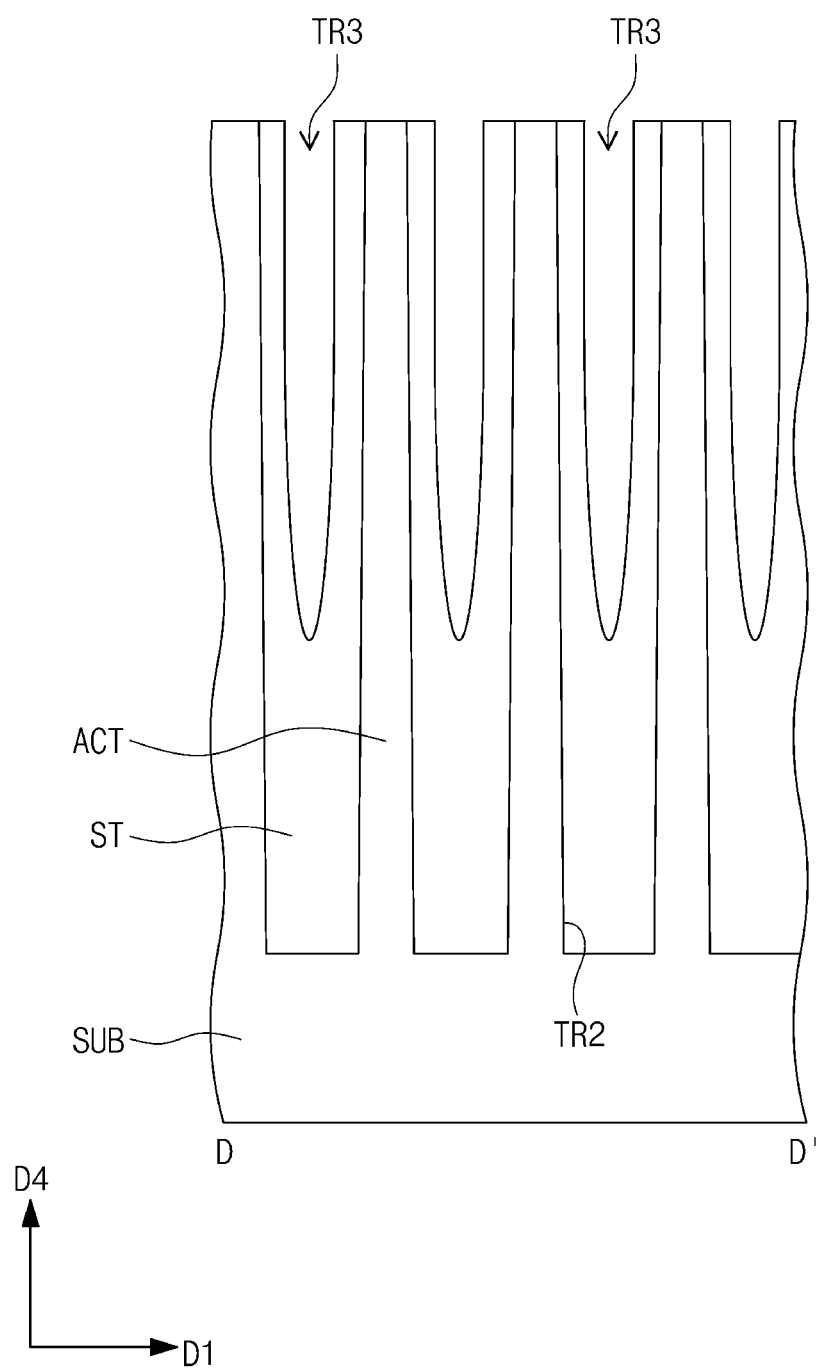
Figure 9:
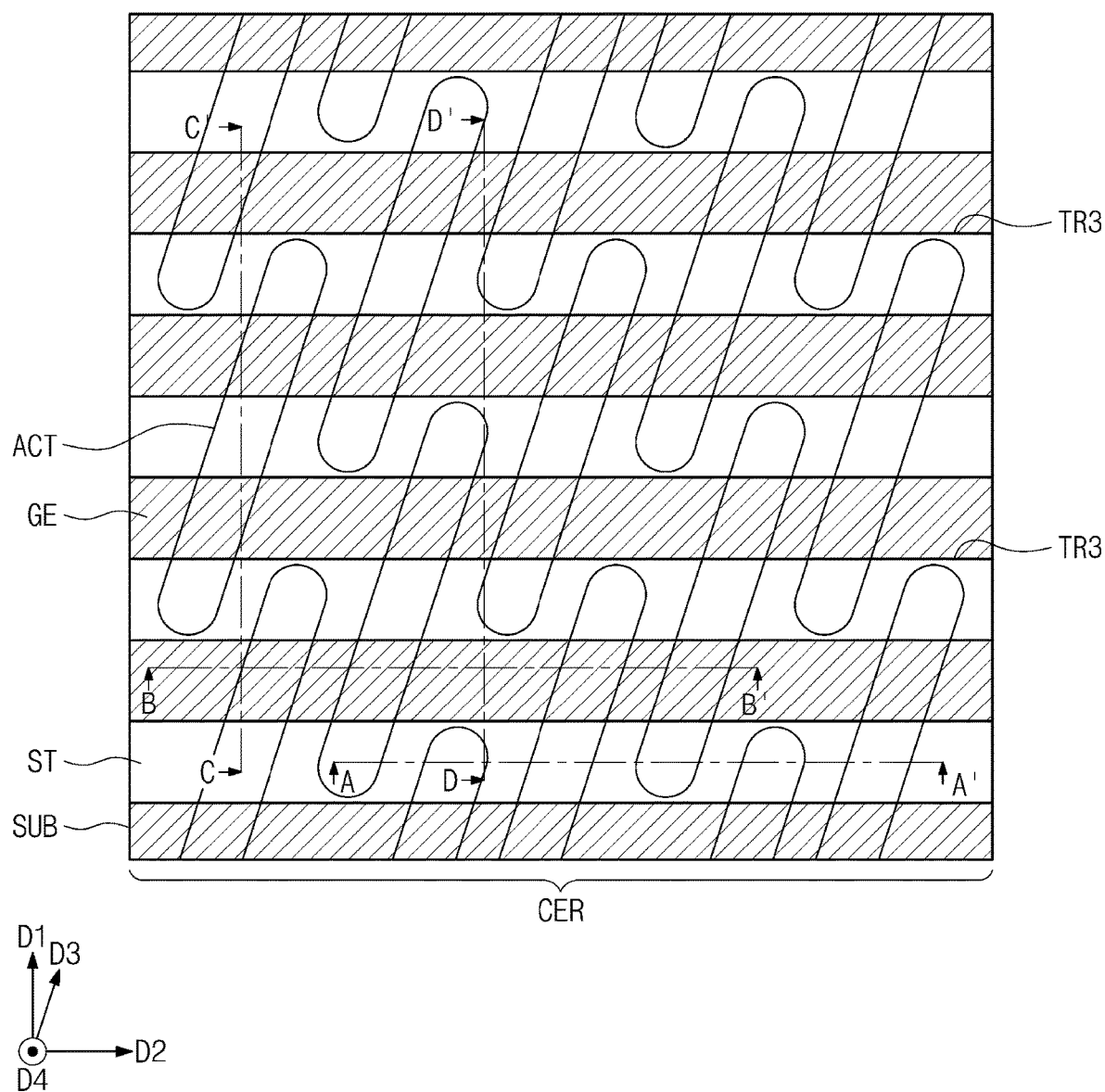
Figure 10A:
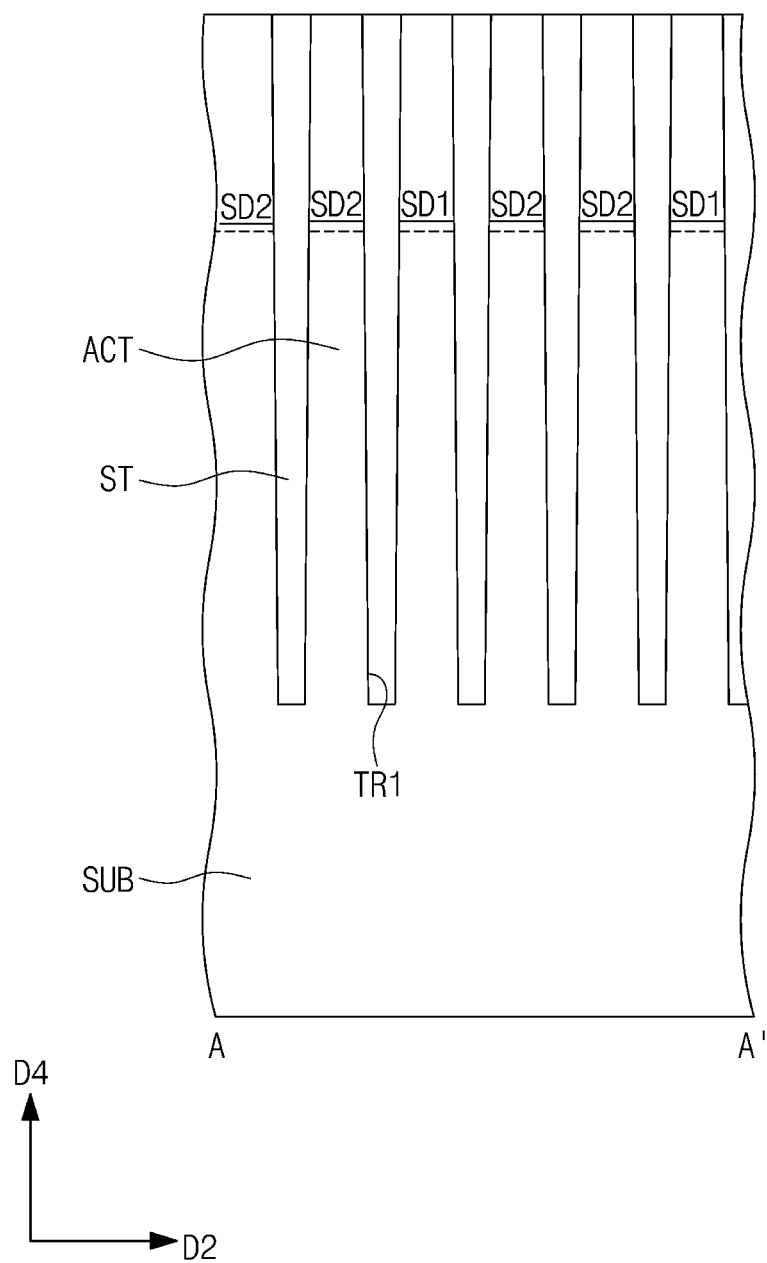
Figure 10B:
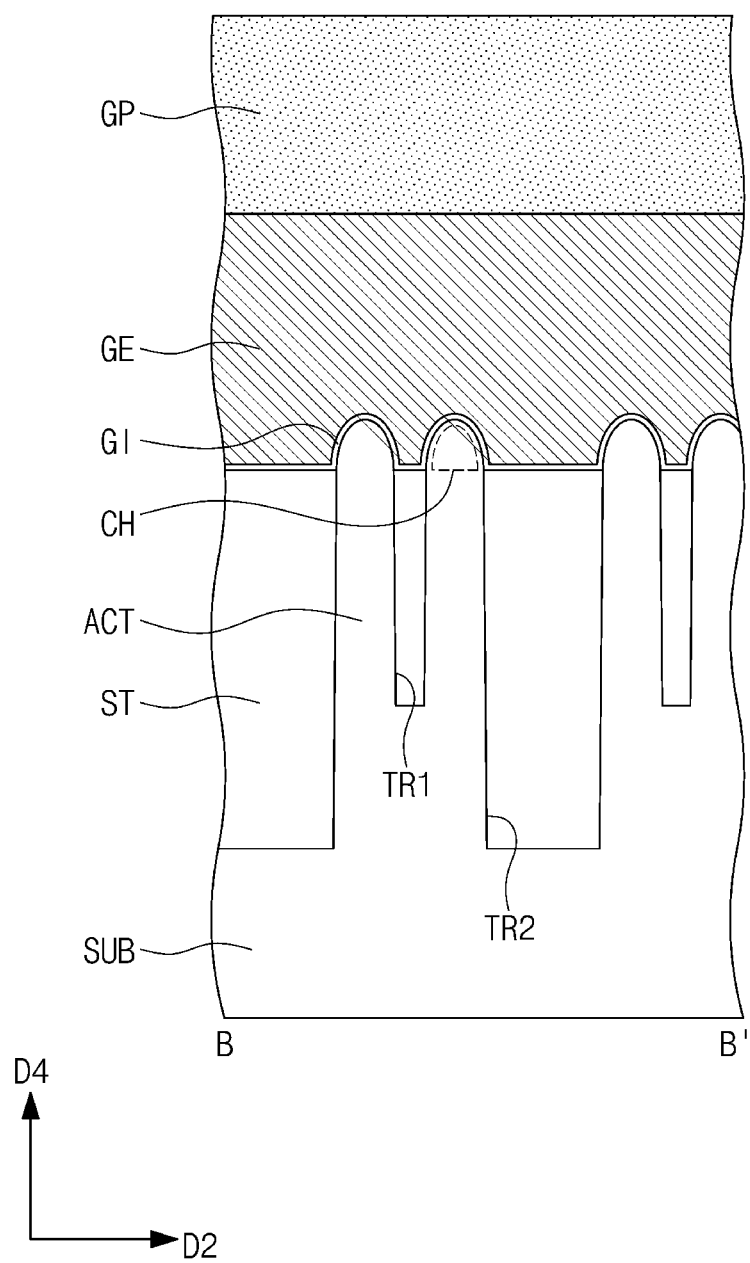
Figure 10C:
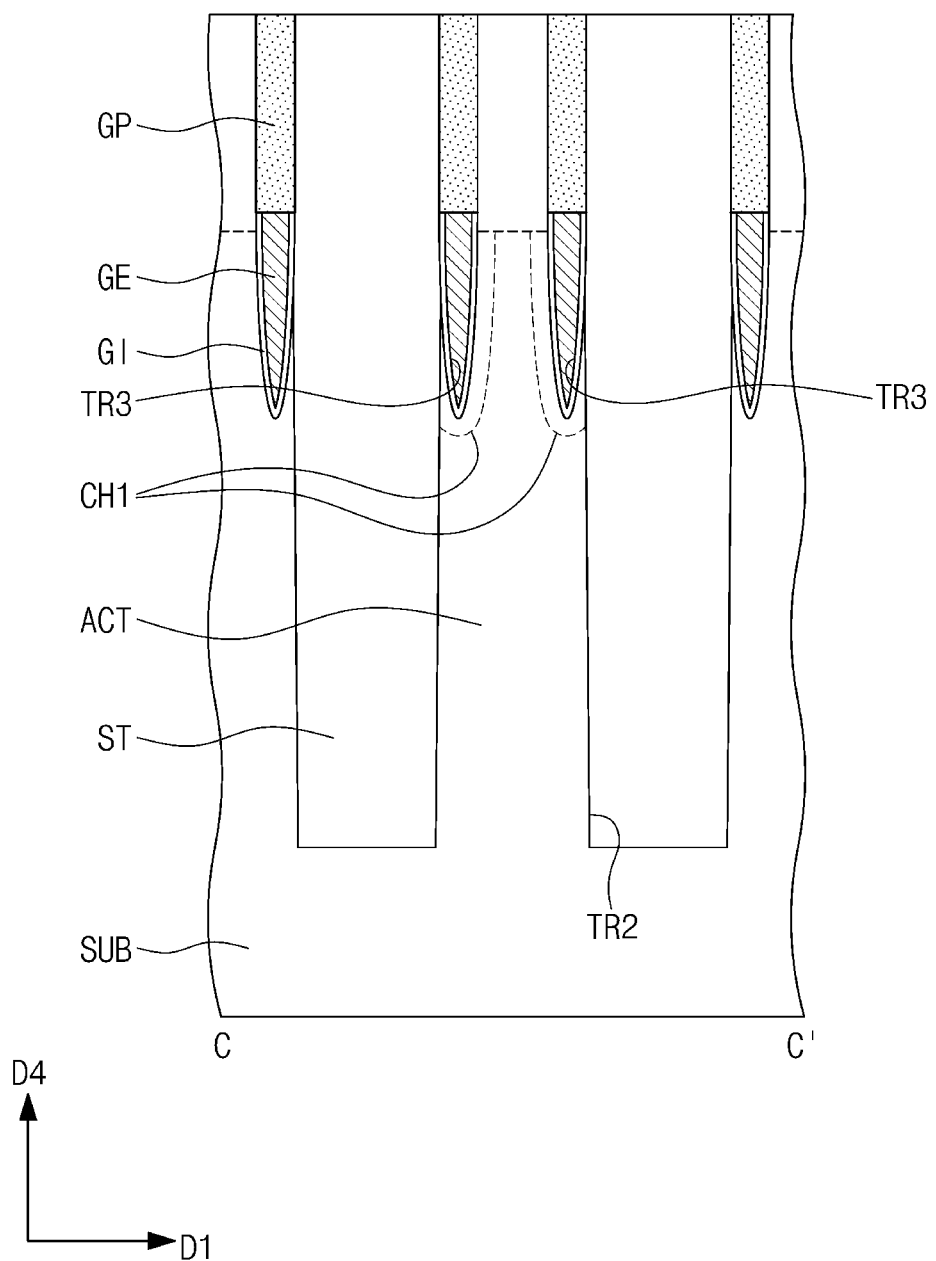
Figure 10D:
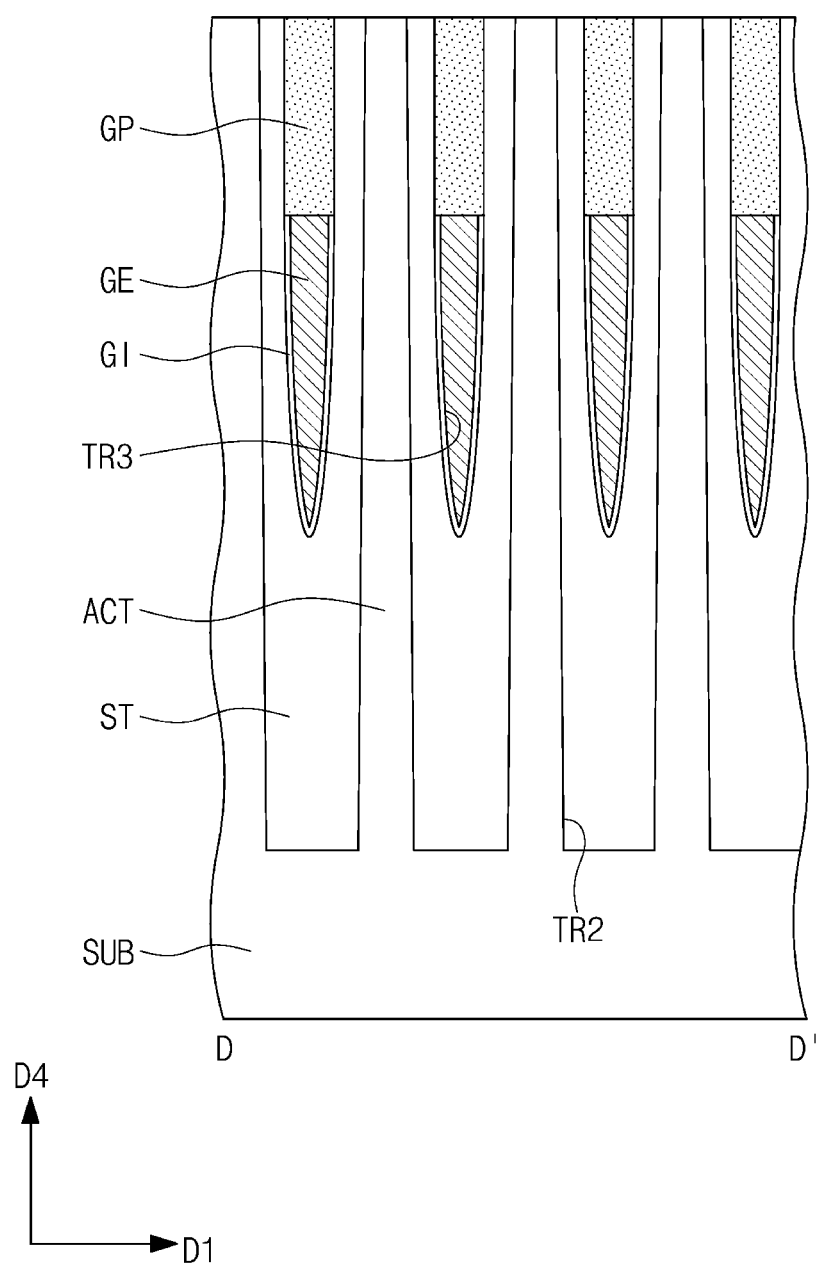
Figure 11:
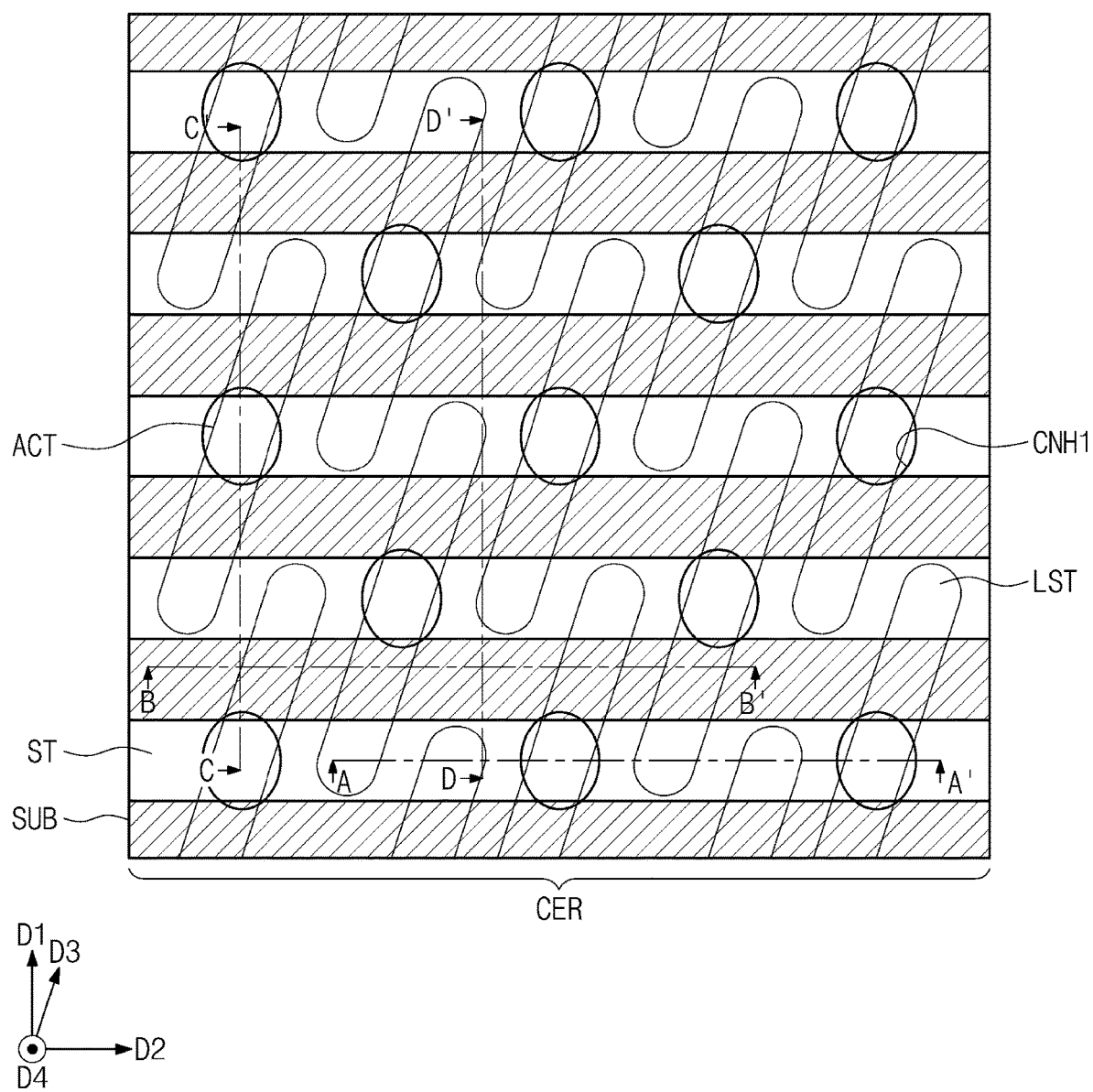
Figure 12A:
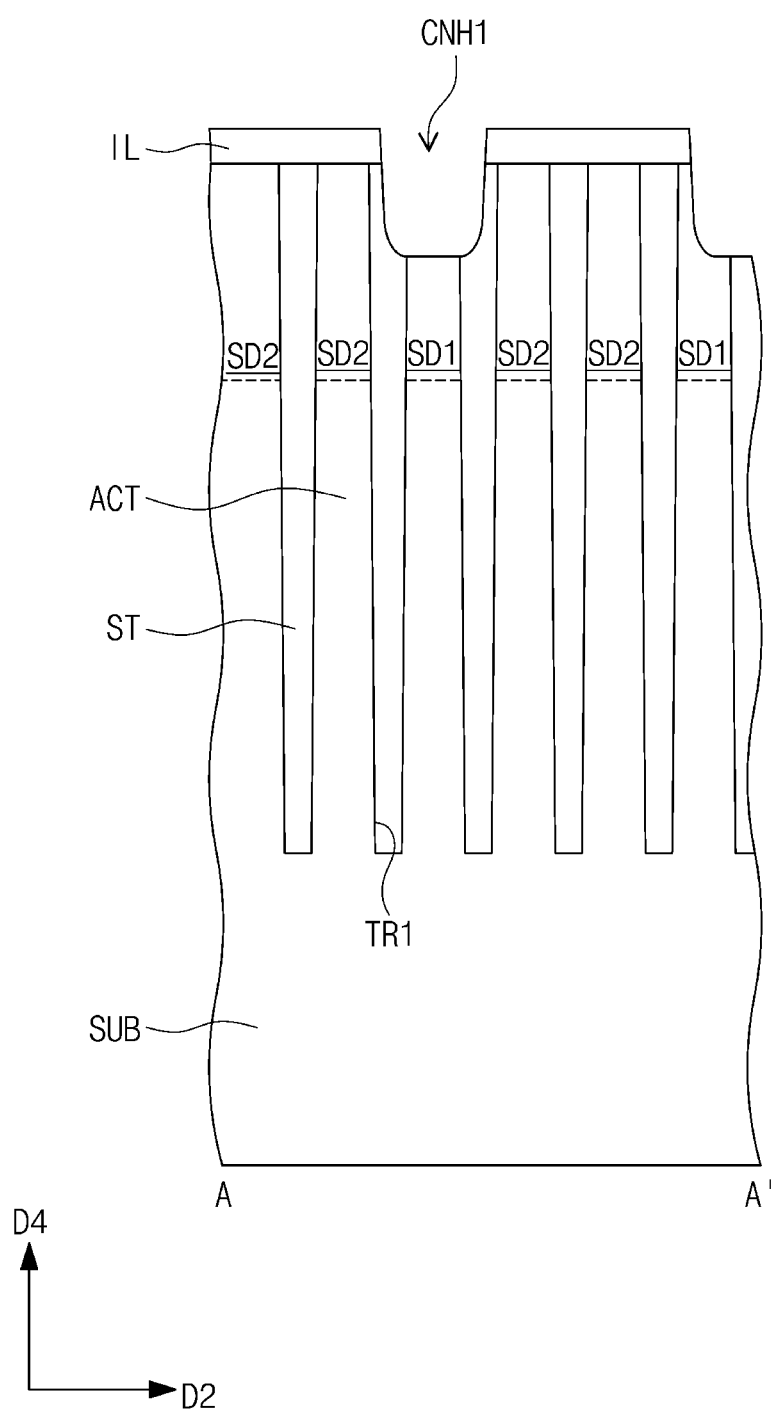
Figure 12B:
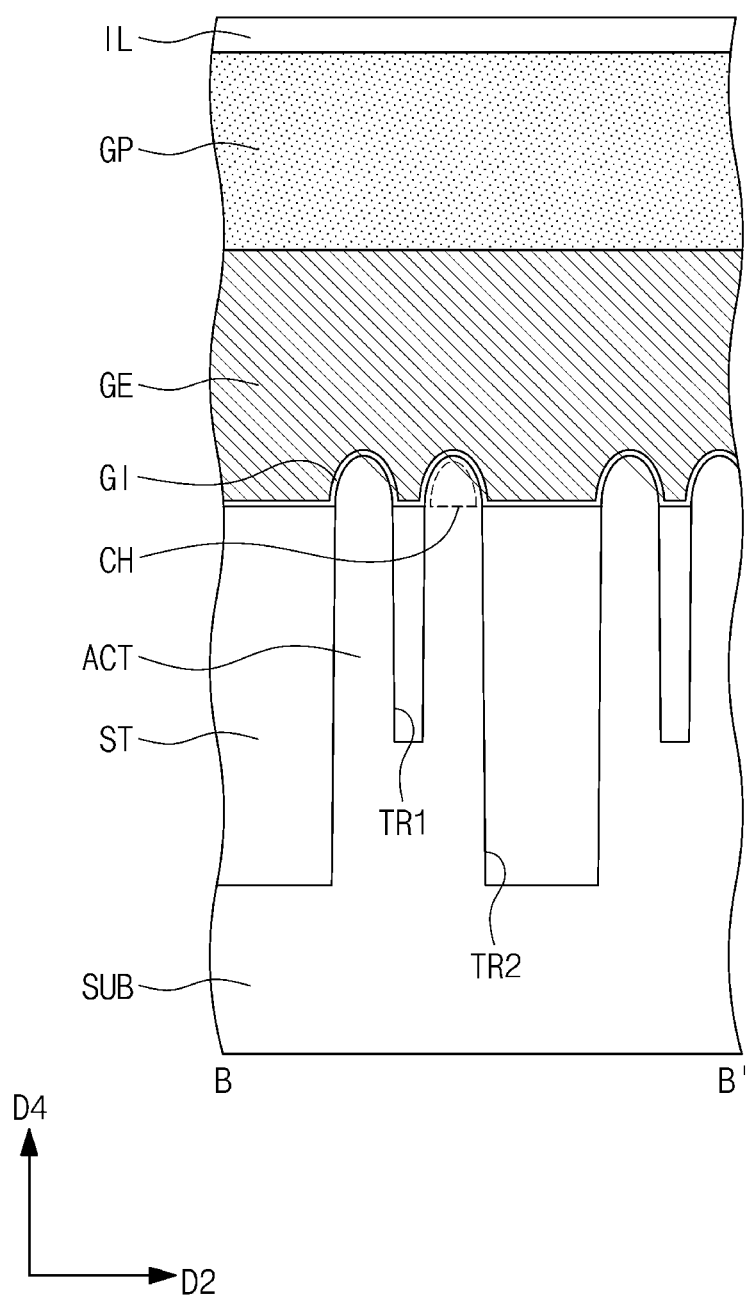
Figure 12C:
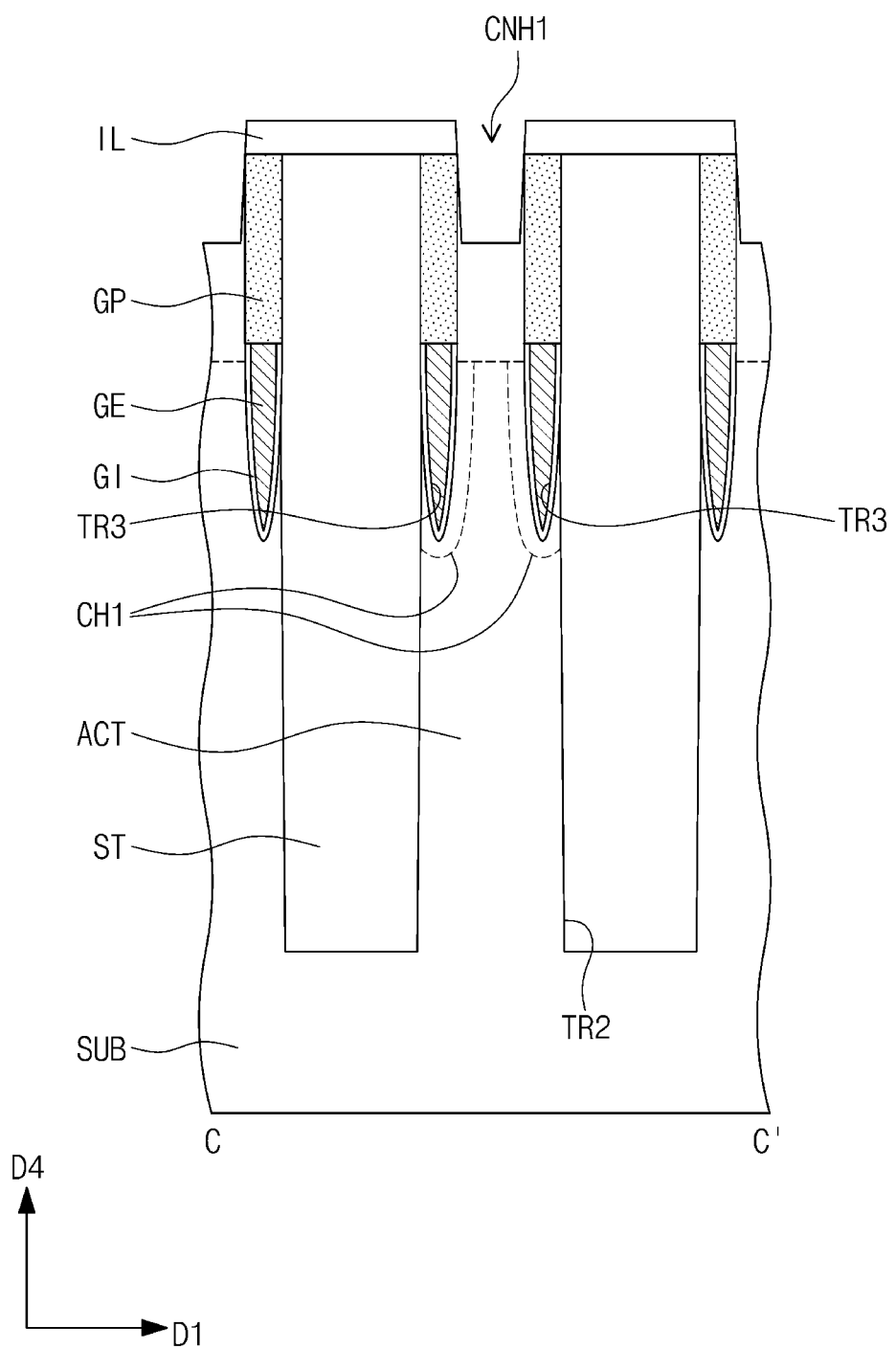
Figure 12D:
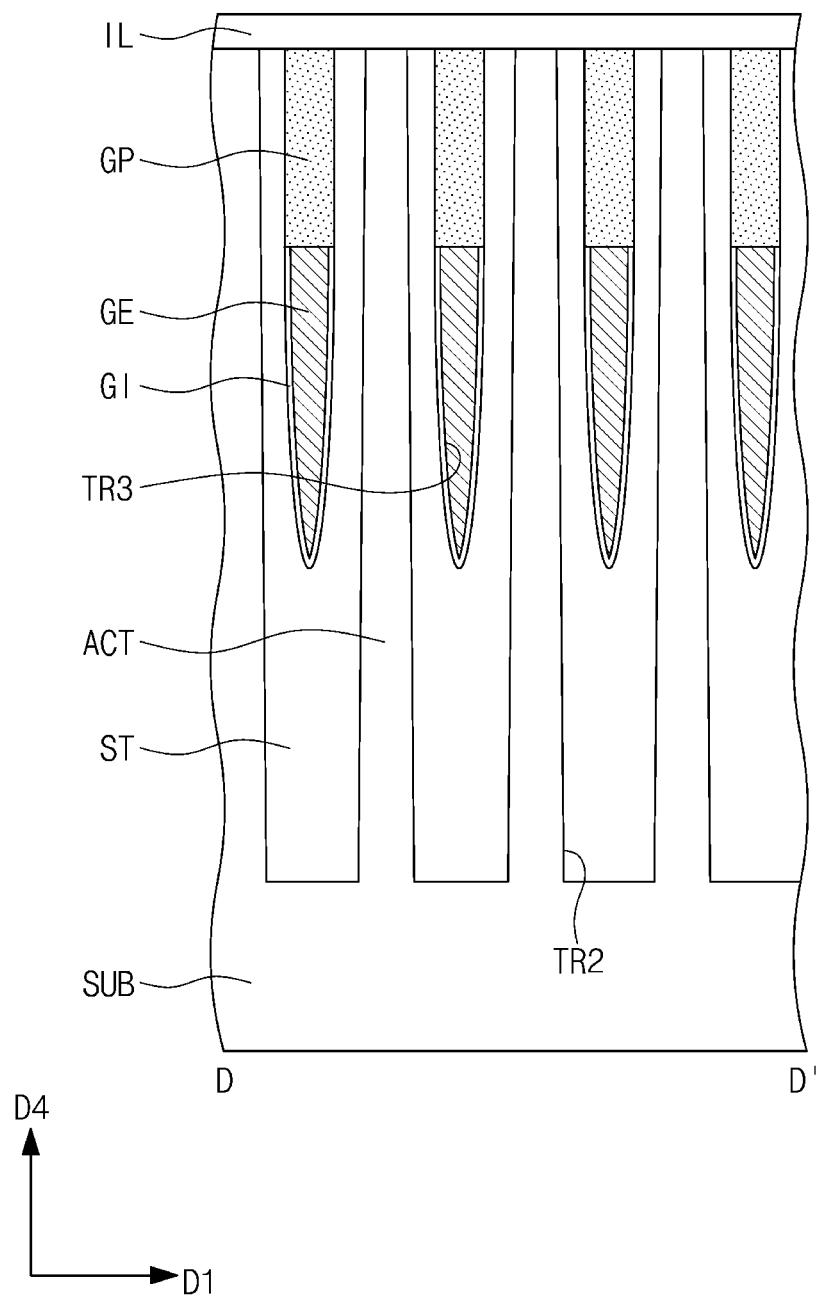
Figure 13:
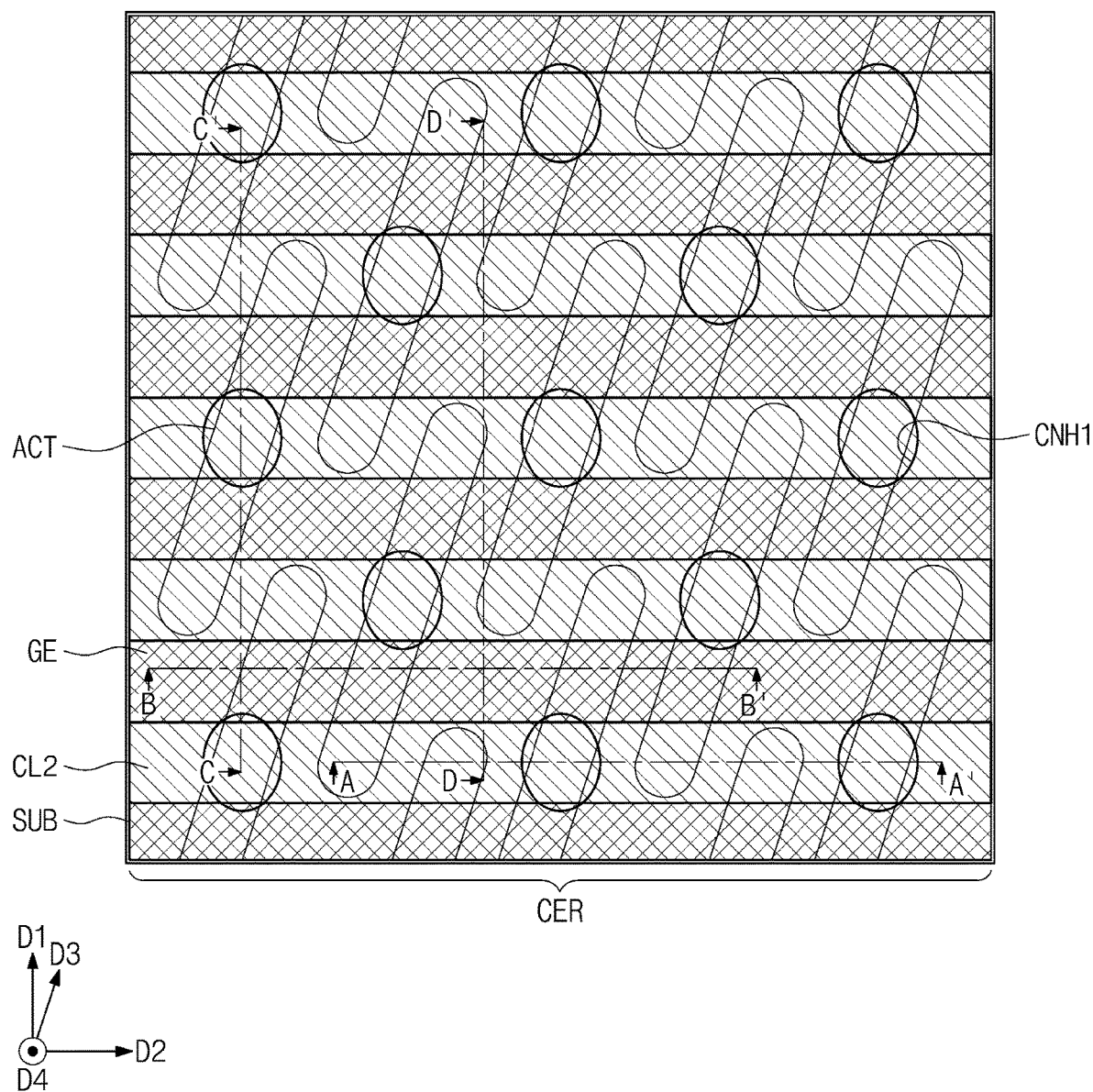
Figure 14A:
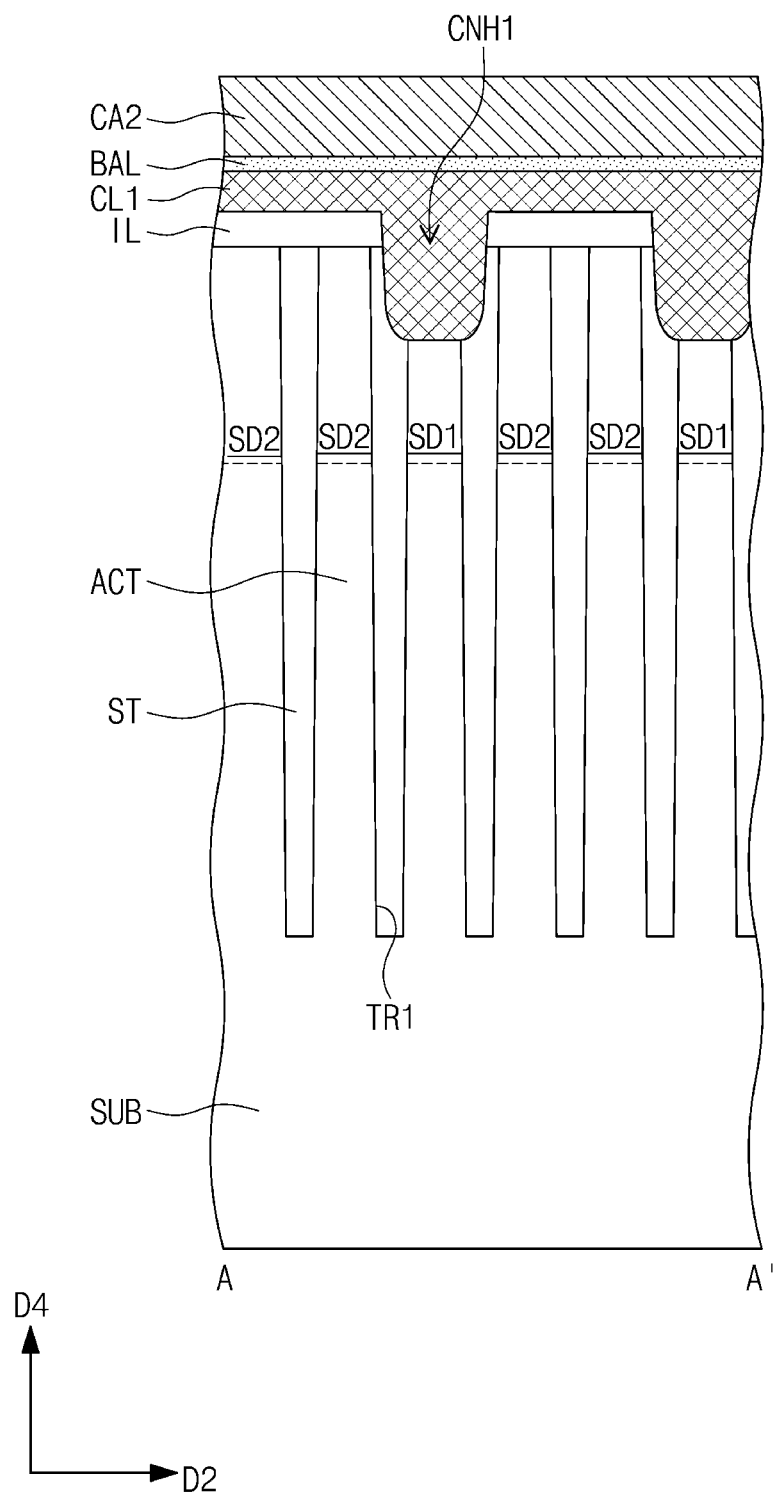
Figure 14B:
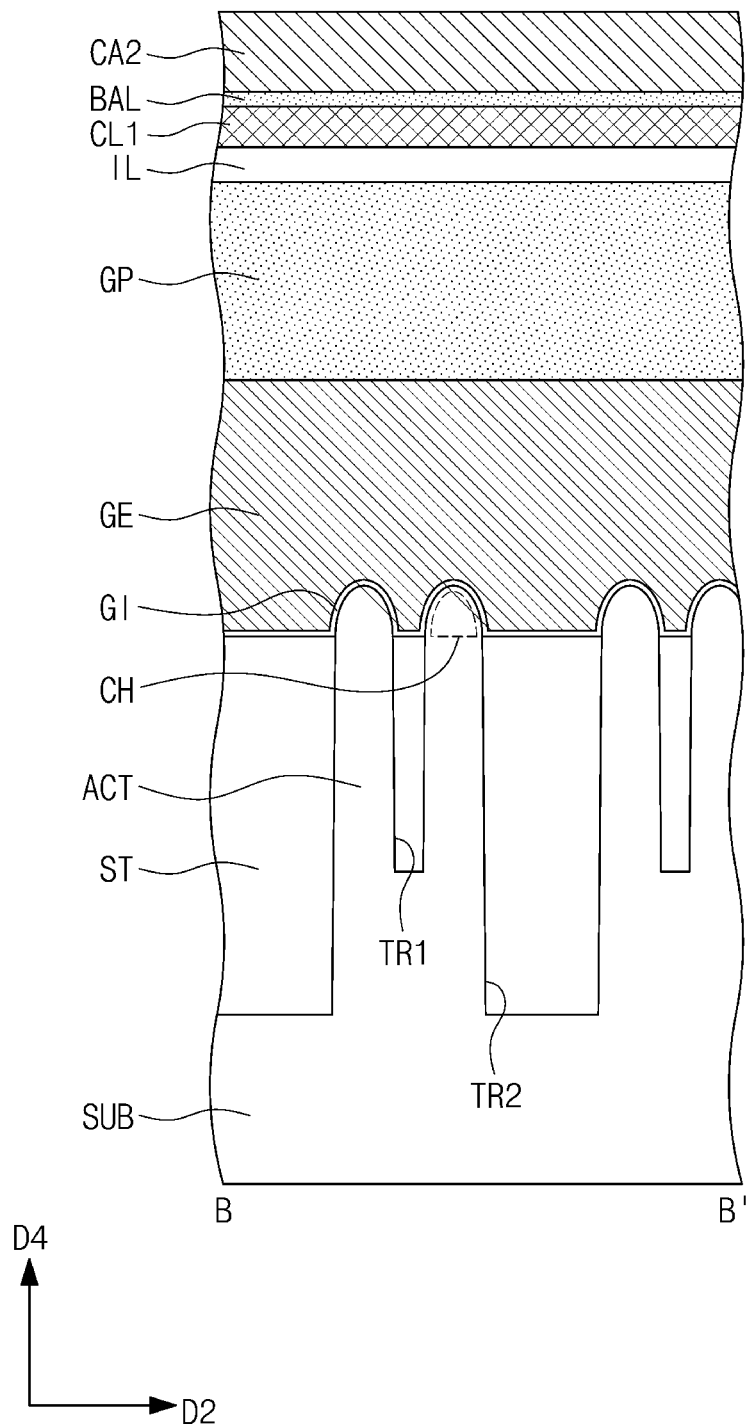
Figure 14C:
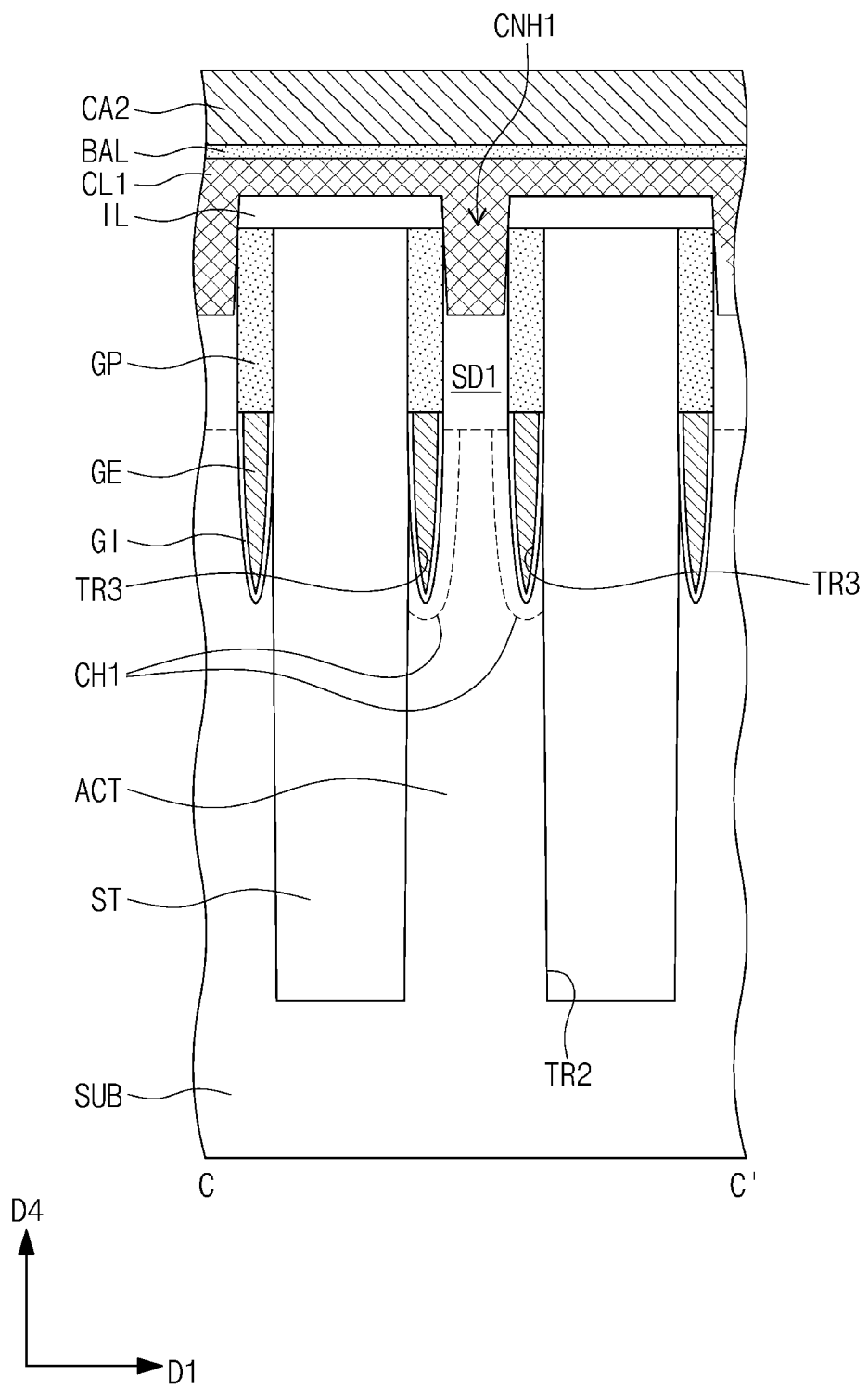
Figure 14D:
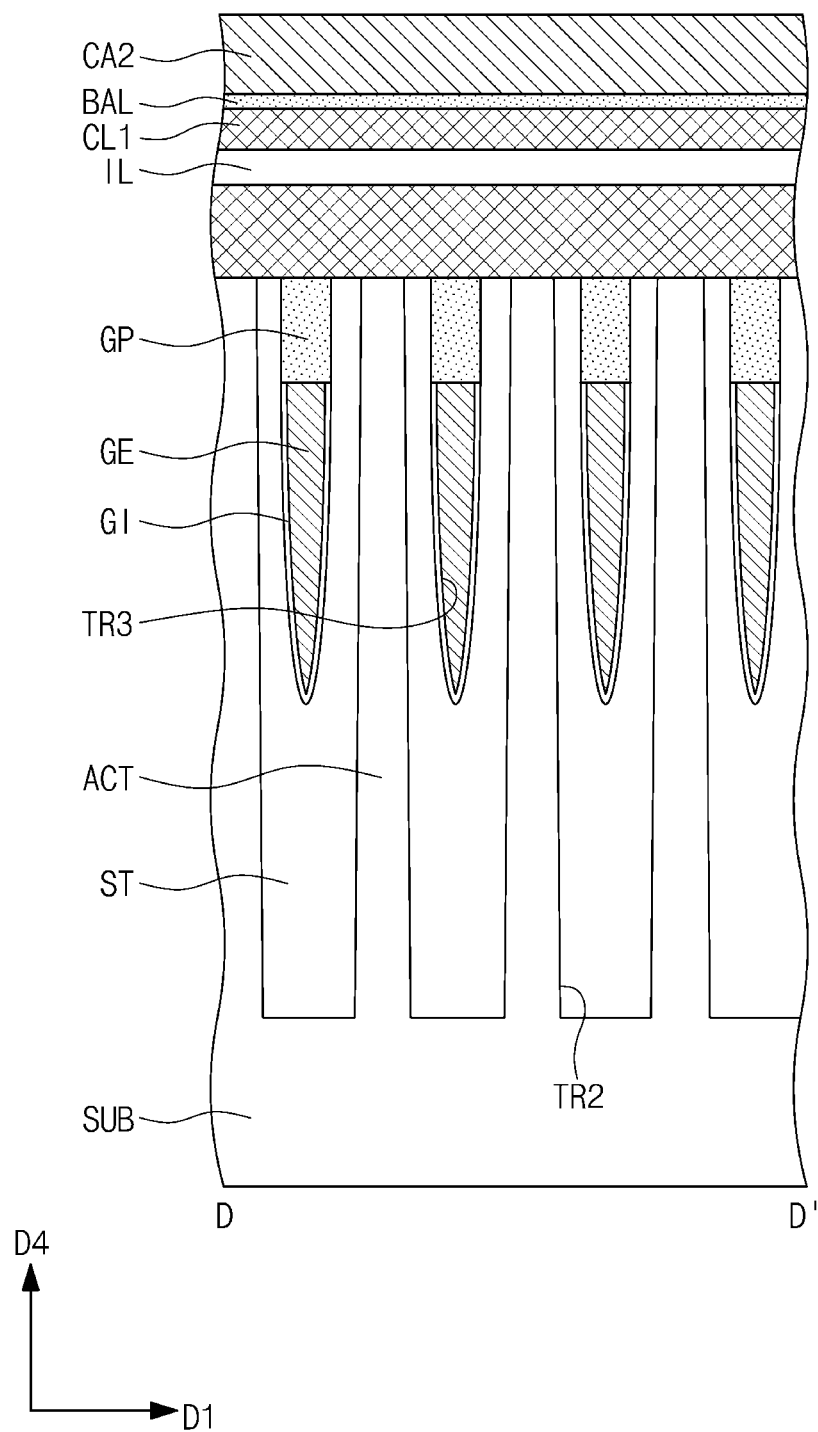
Figure 15:
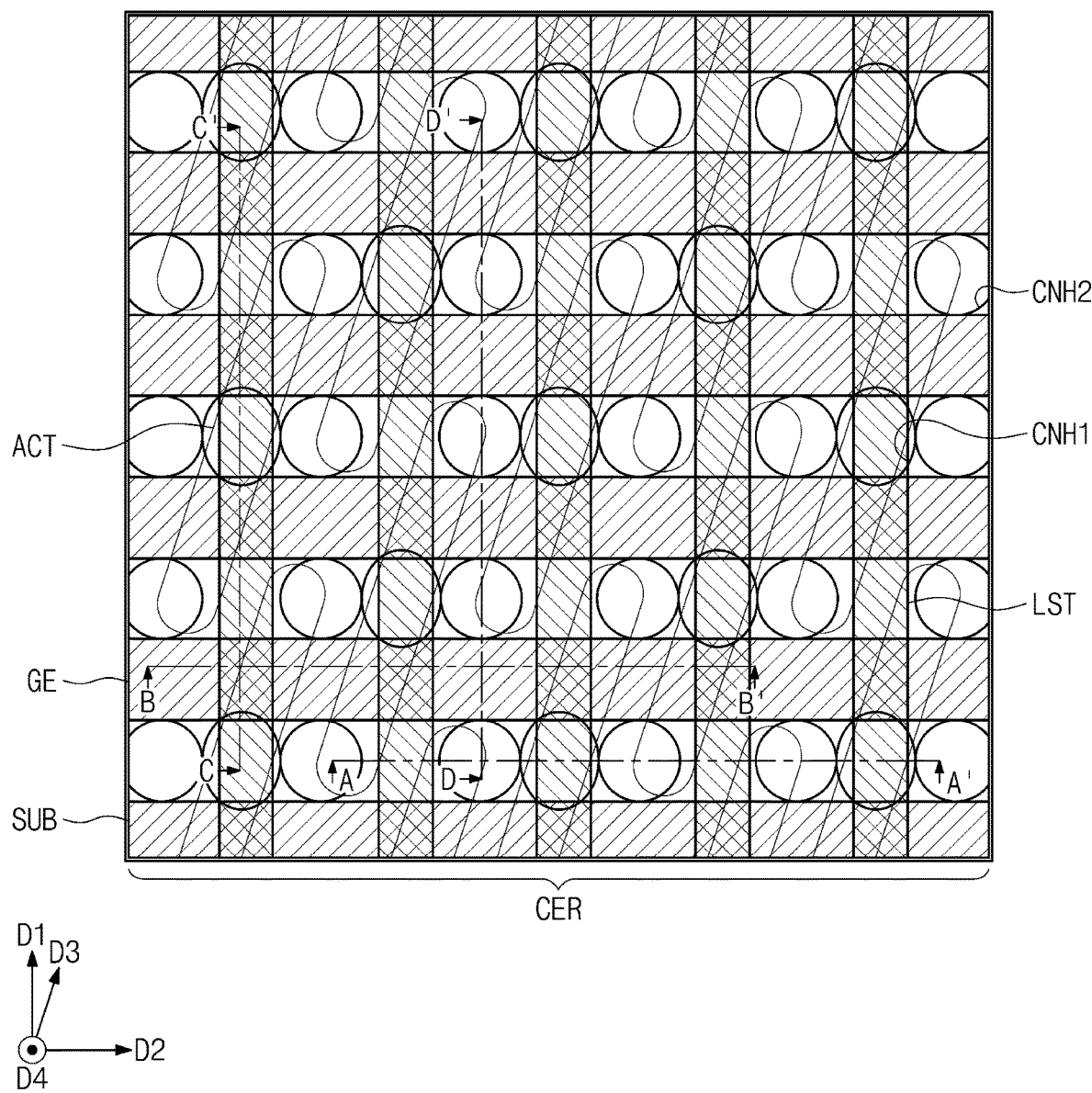
Figure 16A:
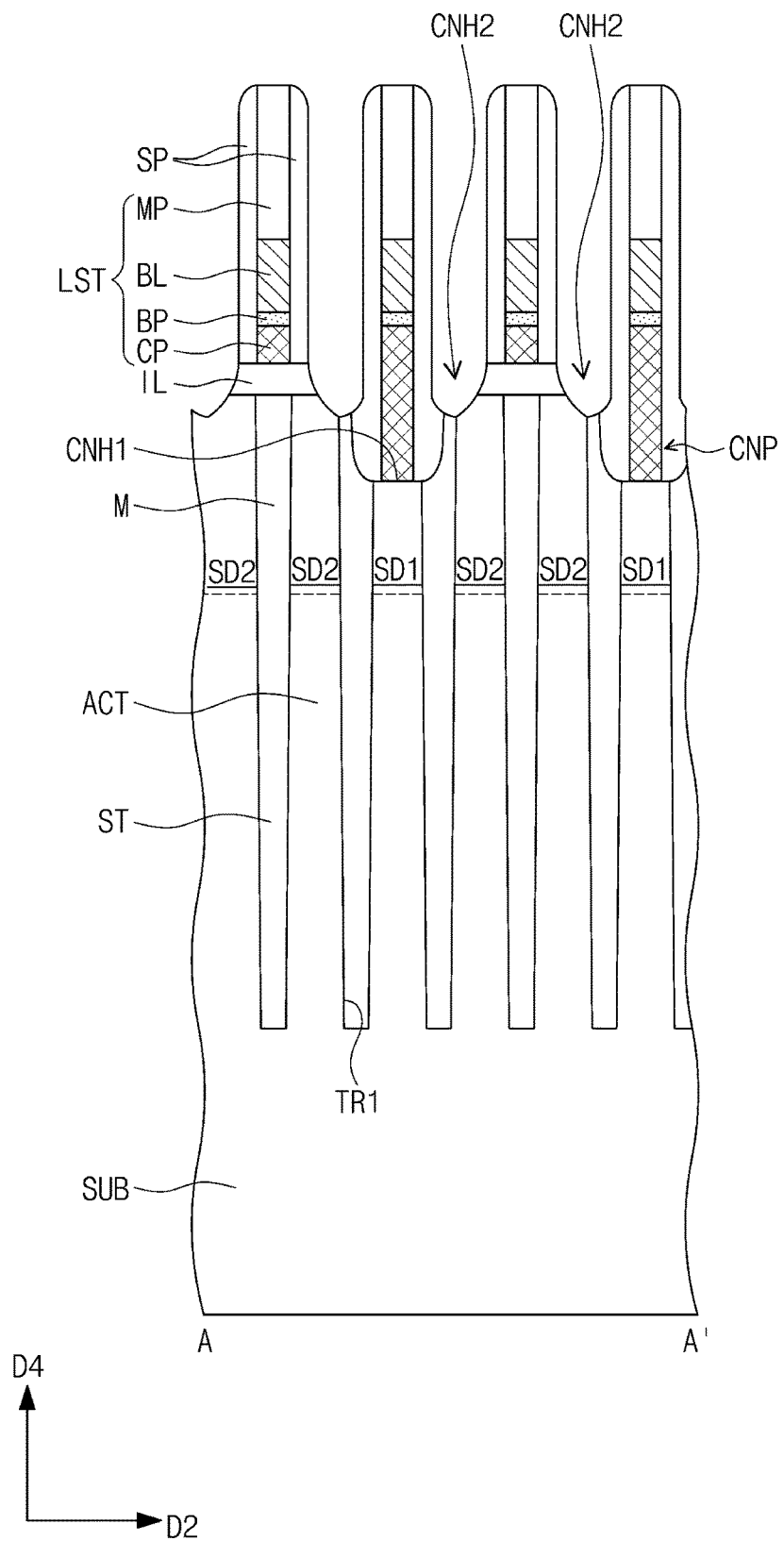
Figure 16B:
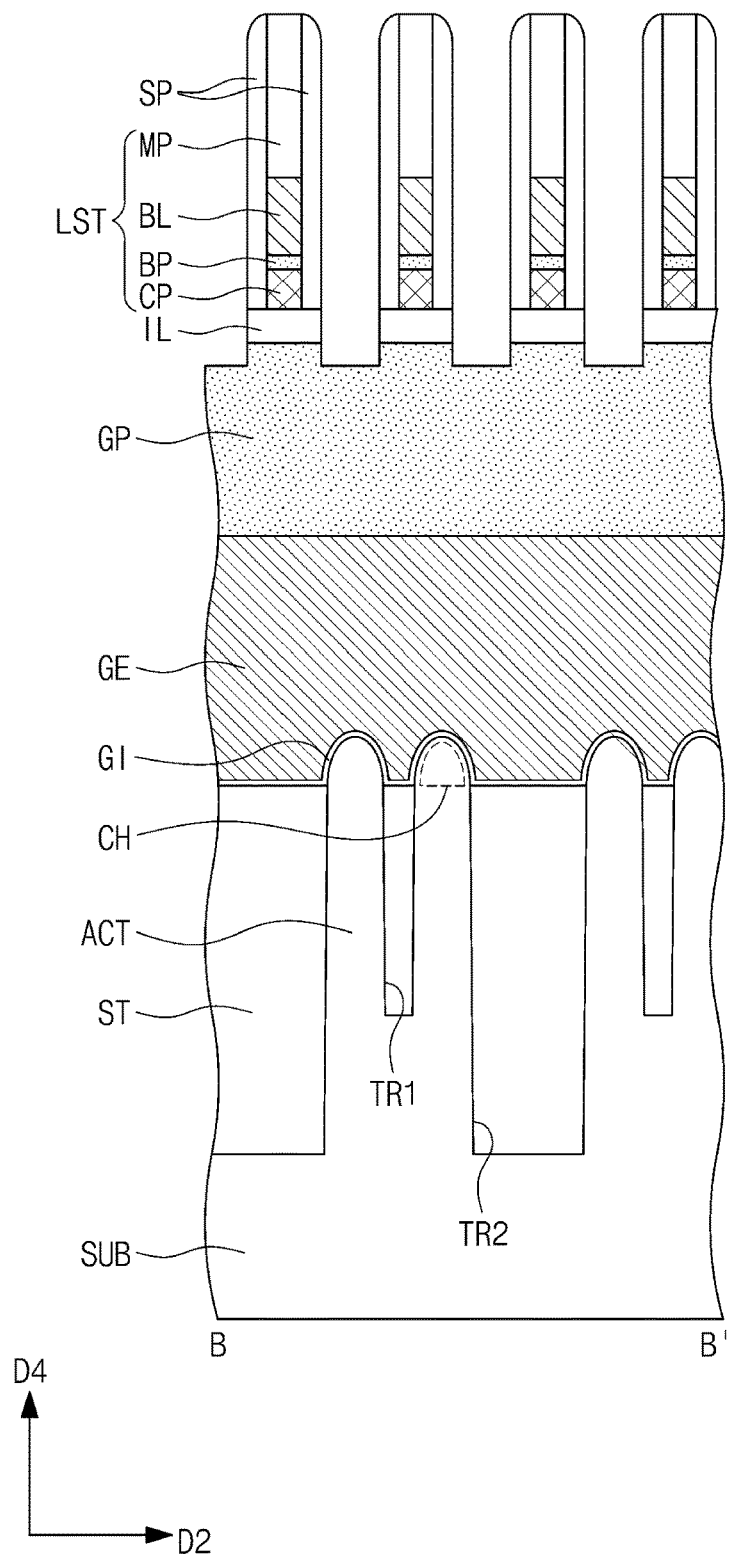
Figure 16C:
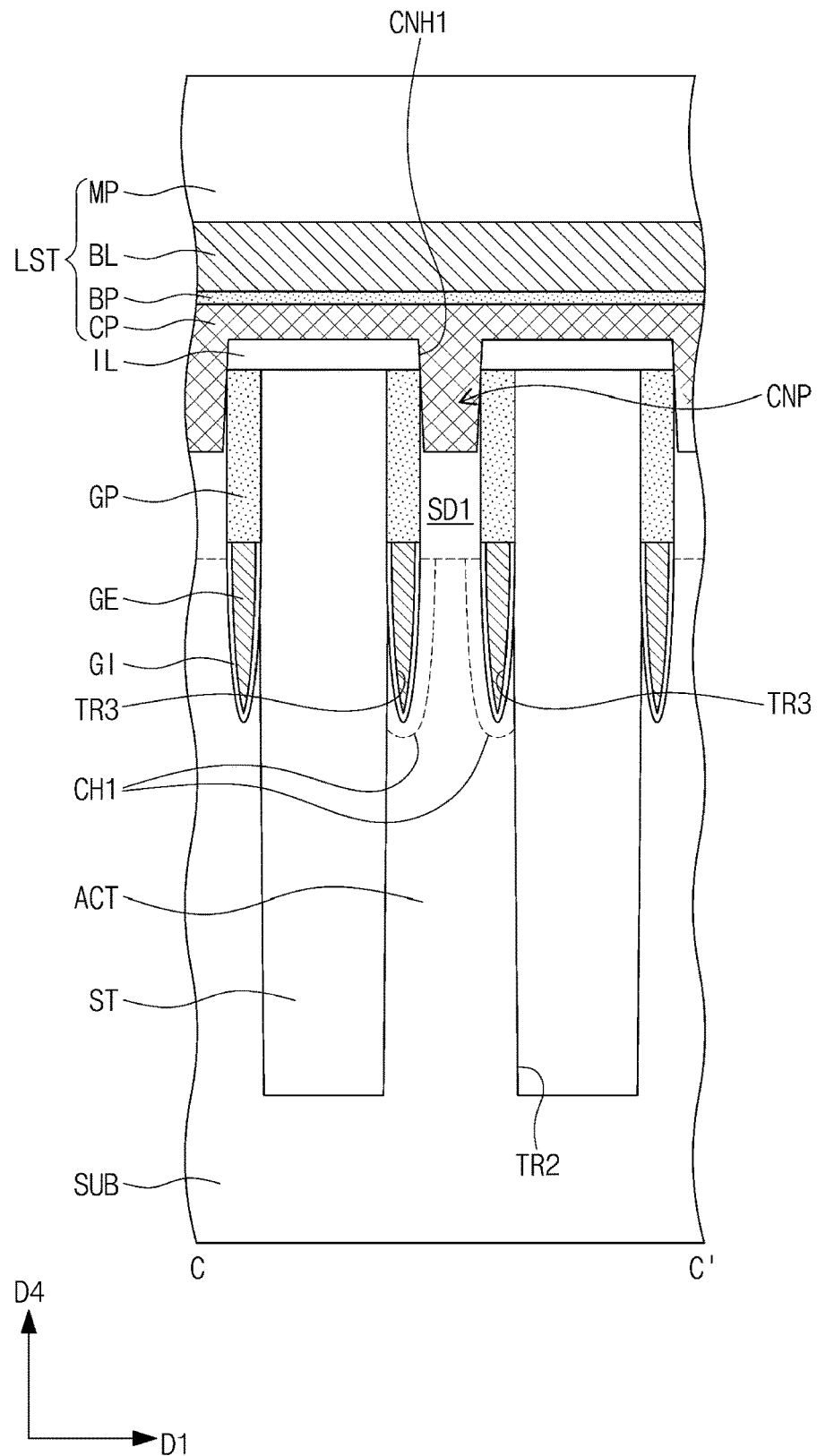
Figure 16D:
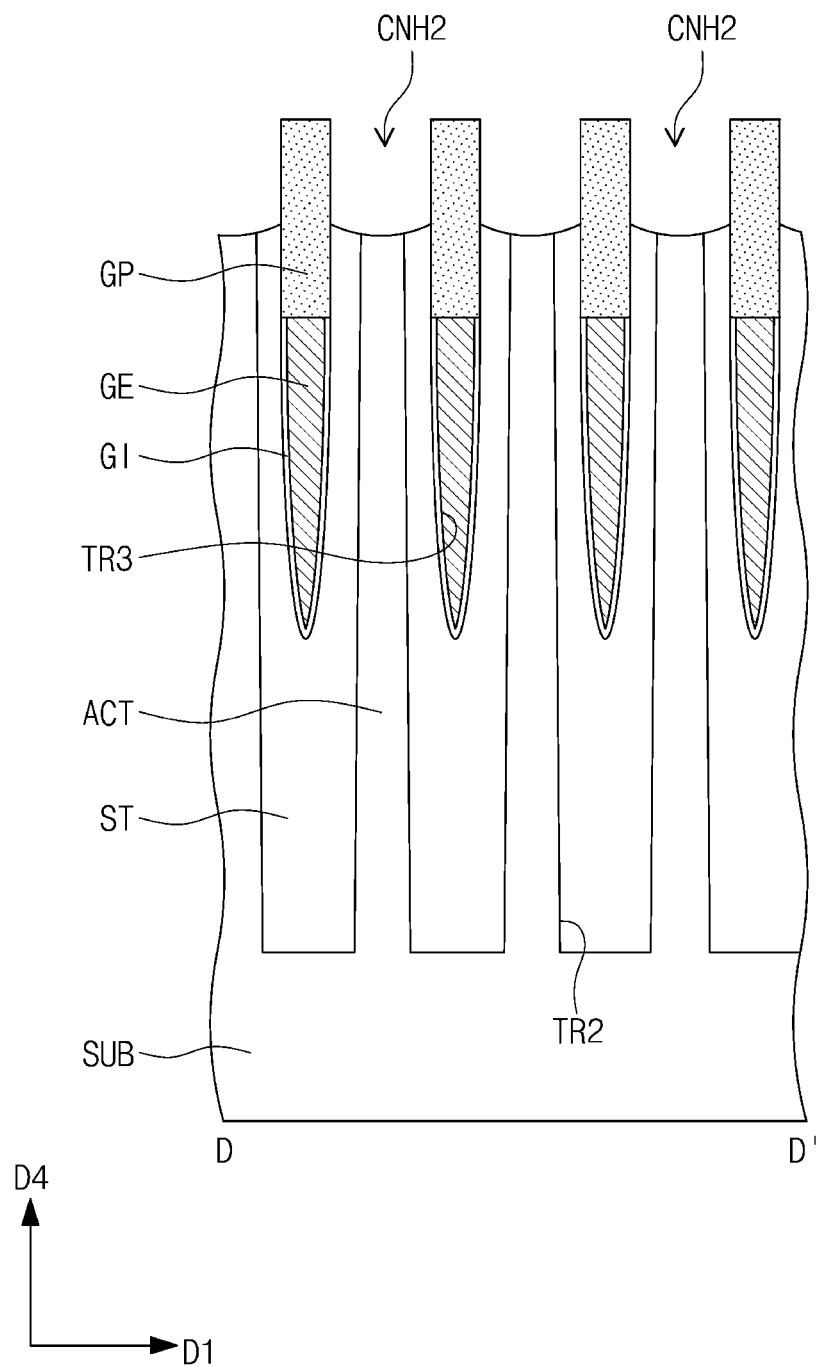
Figure 17:
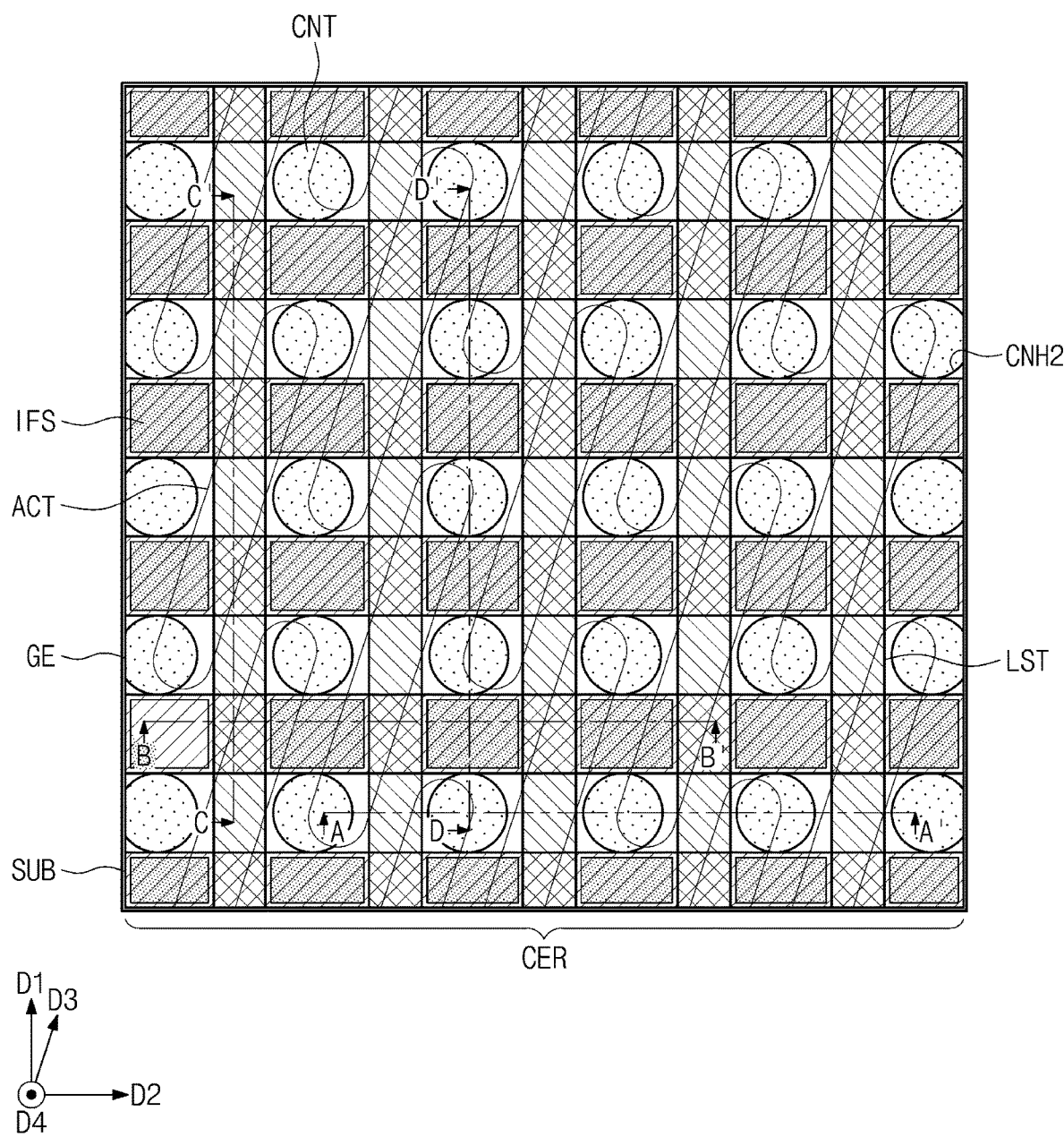
Figure 18A:
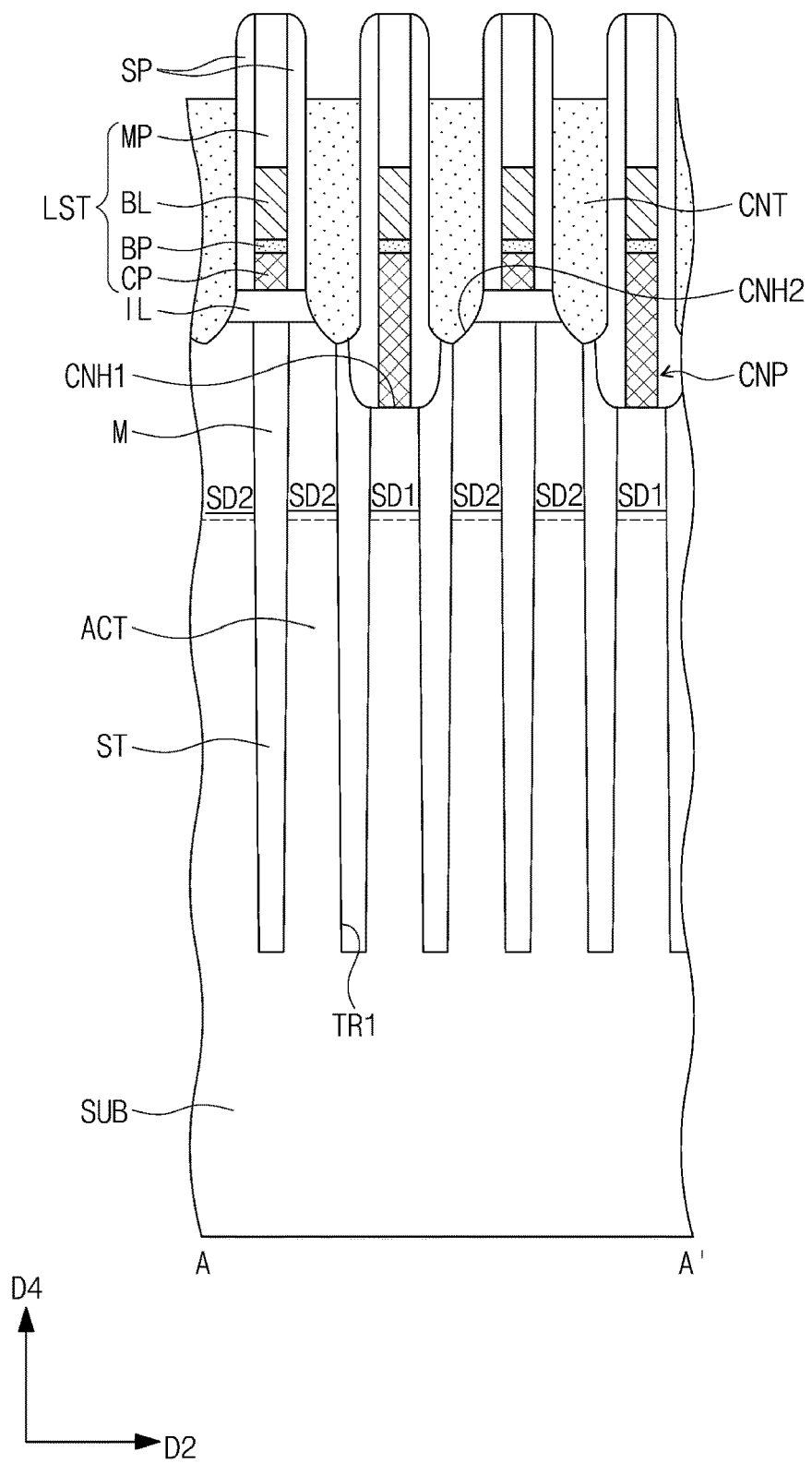
Figure 18B:
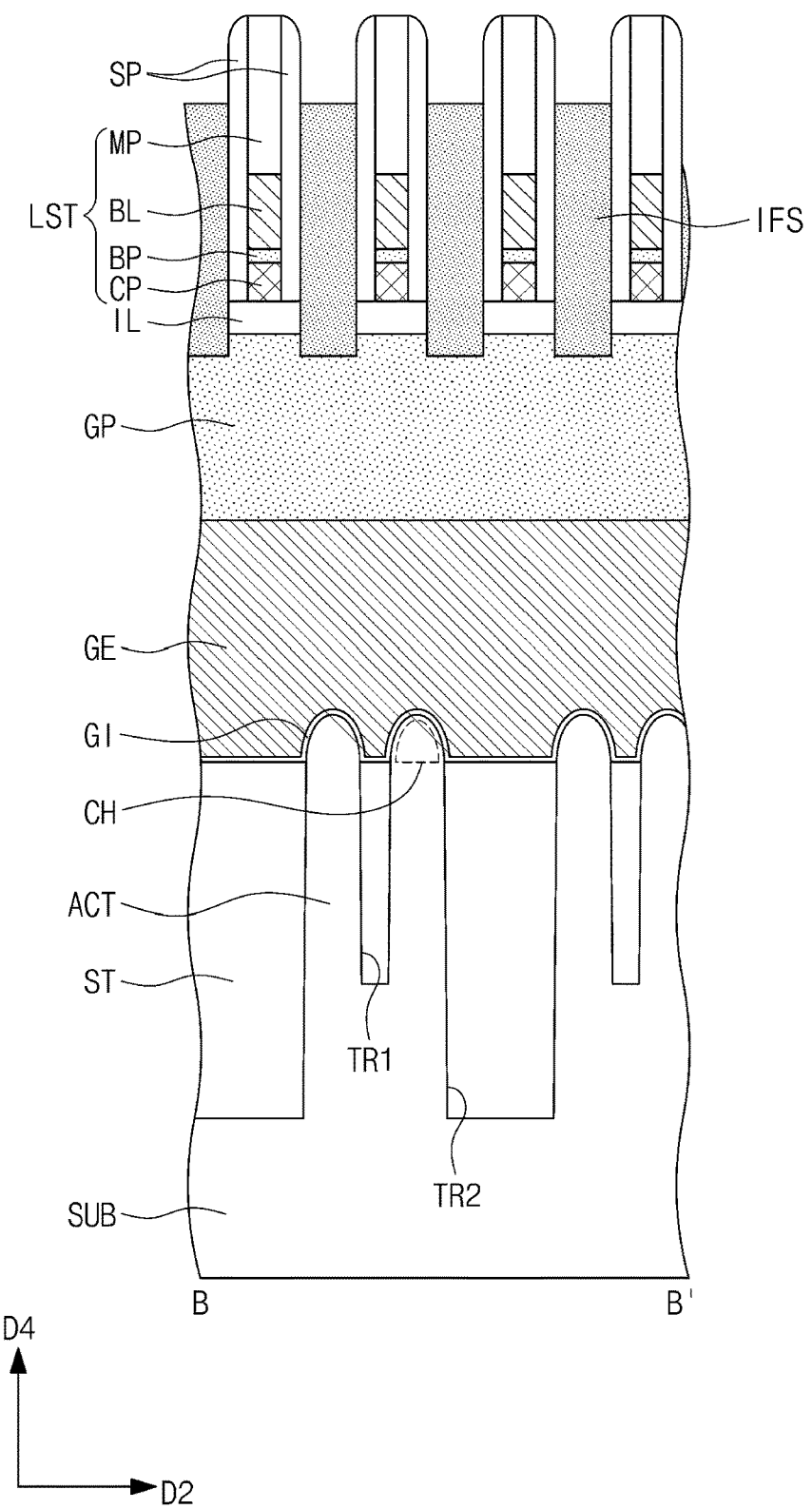
Figure 18C:
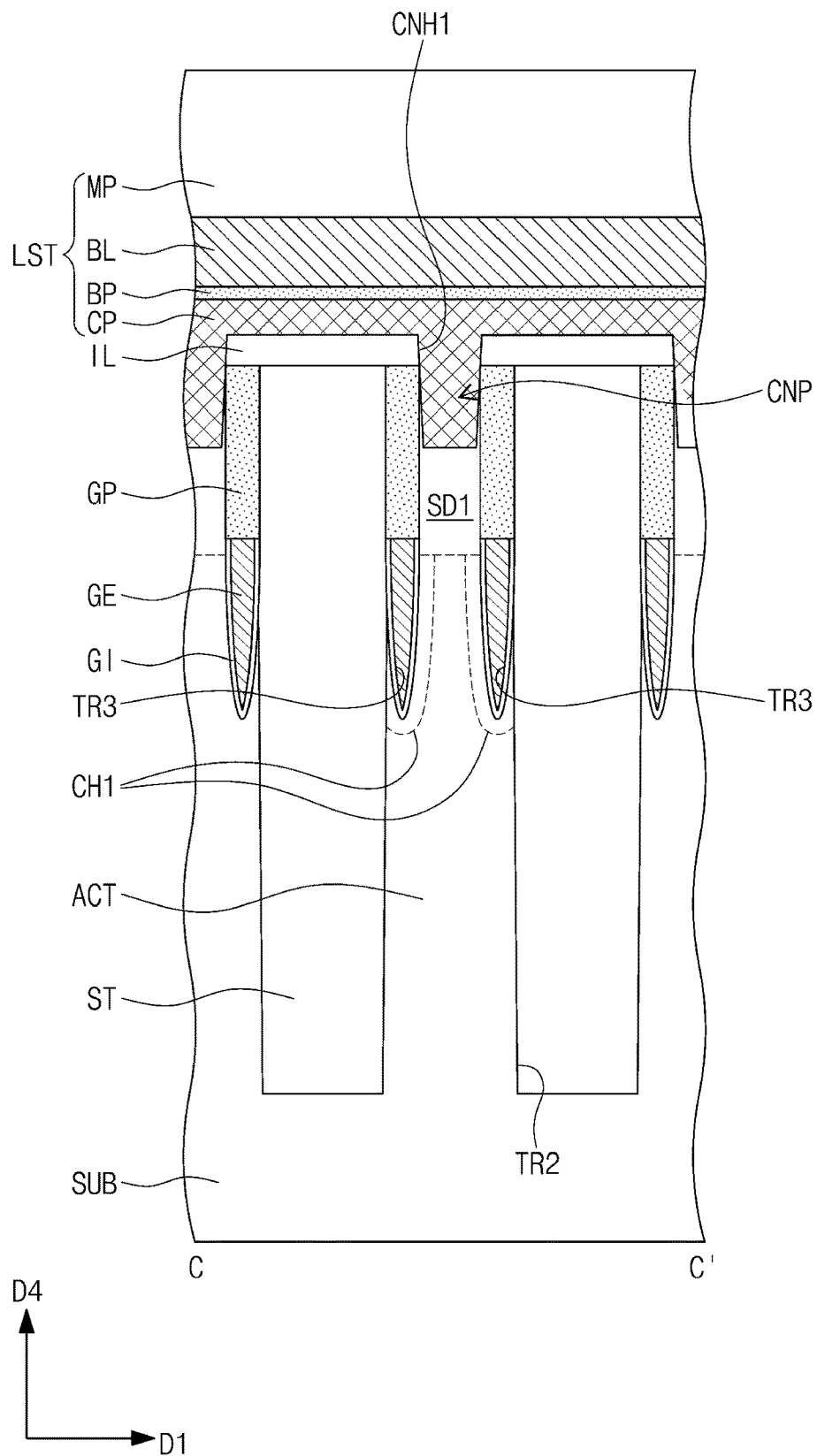
Figure 18D:
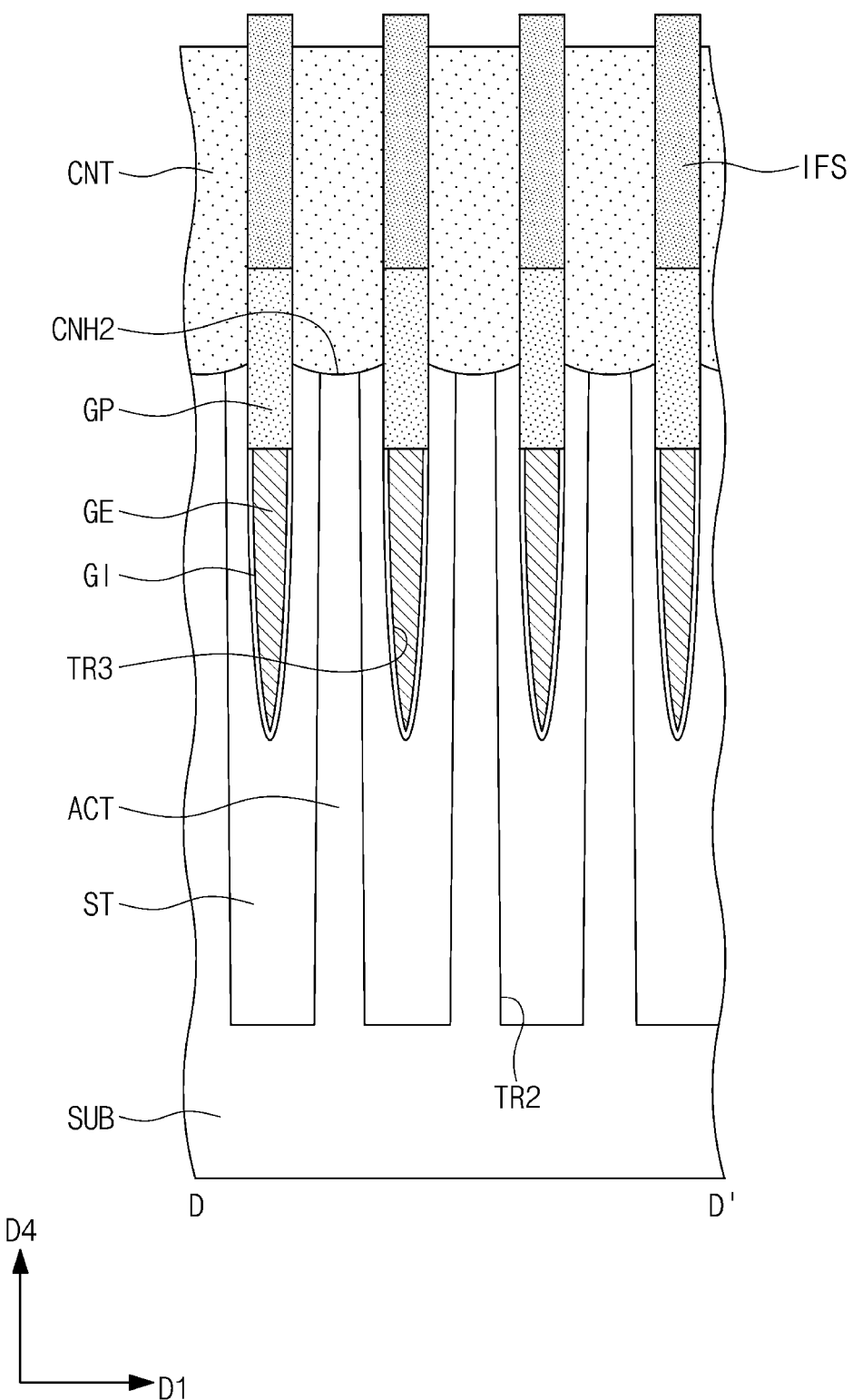

A pair of third trenches TR3 may be defined in the upper portion of each of the active patterns ACT (see FIG. 3C). Each of the third trenches TR3 may be defined between the first source/drain region SD1 and the second source/drain region SD2. The third trench TR3 may penetrate the upper portion of the active pattern ACT and downwardly extend from a top surface of the active pattern ACT toward the bottom surface of the substrate SUB. The third trench TR3 may have a floor higher than those of the first and second trenches TR1 and TR2.

Each of the active patterns ACT may further include a pair of channel regions CH on the upper portion thereof. When the substrate SUB is viewed in a plan view, the channel region CH may be interposed between the first source/drain region SD1 and the second source/drain region SD2. The channel region CH may be disposed below the third trench TR3 (see FIG. 3C). The channel region CH may thus be positioned lower than the first and second source/drain regions SD1 and SD2.

Gate electrodes GE may be provided to run across the active patterns ACT and the device isolation layer ST. The gate electrodes GE may be provided in corresponding third trenches TR3. The gate electrodes GE may extend in parallel to each other in the second direction D2. A pair of gate electrodes GE may be provided on the pair of channel regions CH of the active pattern ACT. For example, when the substrate SUB is viewed in a plan view, the gate electrode GE may be interposed between the first source/drain region SD1 and the second source/drain region SD2. The gate electrode GE may have a top surface lower than that of the active pattern ACT (e.g., that of the first source/drain region SD1 or that of the second source/drain region SD2).

Referring back to FIG. 3C, an upper portion of the gate electrode GE may be adjacent to the first source/drain region SD1 of the active pattern ACT. A lower portion of the gate electrode GE may be adjacent to the channel region CH.

Referring back to FIGS. 2 and 3A to 3D, a gate dielectric layer GI may be interposed between the gate electrode GE and the active pattern ACT. A gate capping layer GP may be provided on the gate electrode GE. The gate capping layer GP may cover the top surface of the gate electrode GE. The gate capping layer GP may have a top surface coplanar with that of the active pattern ACT.

The gate electrode GE may include one or more of conductive metal nitride (e.g., titanium nitride or tantalum nitride) and metal (e.g., titanium, tantalum, tungsten, copper, or aluminum). The gate dielectric layer GI may include one or more of a silicon oxide layer, a silicon nitride layer, a silicon oxynitride layer, and a high-k dielectric material. For example, the high-k dielectric material may include hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, or a combination thereof. The gate capping layer GP may include one or more of a silicon oxide layer, a silicon nitride layer, and a silicon oxynitride layer.

A dielectric layer IL may be provided on the substrate SUB. The dielectric layer IL may include first contact holes CNH1 that expose the first source/drain regions SD1 of the active patterns ACT. For example, the dielectric layer IL may include a first dielectric layer and a second dielectric layer that are sequentially stacked on an upper surface of the device isolation layer ST and an upper surface of the gate capping layer GP. The second dielectric layer may have a dielectric constant greater than that of the first dielectric layer. For example, the first dielectric layer may include a silicon oxide layer, and the second dielectric layer may include a silicon oxynitride layer.

The dielectric layer IL may be provided thereon with line structures LST that extend in parallel to each other in the first direction D1. The line structures LST may be arranged along the second direction D2. When the substrate SUB is viewed in a plan view, the line structures LST may orthogonally intersect the gate electrodes GE (see FIG. 2). A pair of spacers SP may be provided on opposite sidewalls of each of the line structures LST. The spacers SP may include one or more of a silicon oxide layer, a silicon nitride layer, and a silicon oxynitride layer.

Each of the line structures LST may include a conductive pattern CP, a barrier pattern BP, a bit line BL, and a mask pattern MP that are sequentially stacked. The conductive pattern CP may include a contact part CNP that fills the first contact hole CNH1 and is coupled to the first source/drain region SD1. For example, the contact part CNP may penetrate the dielectric layer IL and extend toward the bottom surface of the substrate SUB. The contact part CNP may be in contact with the first source/drain region SD1. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The barrier pattern BP may prevent the conductive pattern CP from receiving a metallic material diffused from the bit line BL. The bit line BL may be electrically connected to the first source/drain region SD1 through the barrier pattern BP and the conductive pattern CP.

The conductive pattern CP may include a doped semiconductor material (e.g., doped silicon or doped germanium). The barrier pattern BP may include conductive metal nitride (e.g., titanium nitride or tantalum nitride). The bit line BL may include a metallic material (e.g., titanium, tantalum, tungsten, copper, or aluminum).

A plurality of dielectric fences IFS may be provided on the gate capping layer GP (see FIG. 3B). Each of the dielectric fences IFS may penetrate the dielectric layer TL and extend toward an upper portion of the gate capping layer GP.

Referring back to FIG. 2, the dielectric fences IFS may be two-dimensionally arranged along the first and second directions D1 and D2. For example, the dielectric fences IFS may be arranged along the second direction D2 on the gate capping layer GP that extends in the second direction D2. The dielectric fences IFS and the line structures LST may be alternately arranged along the second direction D2.

Contacts CNT may be provided to penetrate the dielectric layer IL and to contact corresponding second source/drain regions SD2. Each of the contact CNT may fill a second contact hole CNH2 that is formed by partially etching an upper portion of the second source/drain region SD2. Referring to FIG. 3A, the contact CNT may be in contact with the second source/drain region SD2 exposed to the second contact hole CNH2. The contact CNT may contact a sidewall of the spacer SP and a top surface of the device isolation layer ST. The spacer SP may separate the contact CNT from the line structure LST adjacent to the contact CNT. Each of the contacts CNT may include or may be formed of a doped semiconductor material (e.g., germanium doped with impurities or silicon doped with impurities).

Referring back to FIG. 2, the contacts CNT may be two-dimensionally arranged along the first and second directions D1 and D2. For example, the contacts CNT and the line structures LST may be alternately arranged along the second direction D2. The contacts CNT and the dielectric fences IFS may be alternately arranged along the first direction D1.

The contacts CNT may be provided thereon with landing pads LP that are correspondingly coupled to the contacts CNT. The landing pads LP may be electrically connected through the contacts CNT to corresponding second source/drain regions SD2. The landing pad LP may be misaligned with the contact CNT. For example, the landing pad LP may be horizontally offset from a center of the contact CNT (see FIGS. 2 and 3A). The landing pads LP may include a metallic material (e.g., titanium, tantalum, tungsten, copper, or aluminum).

A dielectric pattern INP may be provided on the mask pattern MIP. The dielectric pattern INP may define planar shapes of the landing pads LP. The dielectric pattern INP may separate neighboring landing pads LP from each other.

A data storage element DS may be provided on the landing pads LP. For example, the data storage element DS may include first electrodes LEL provided on corresponding landing pads LP. The first electrodes LEL may be connected to the corresponding landing pads LP. The data storage element DS may further include a second electrode TEL on the first electrodes LEL and a dielectric layer HDL between the first electrodes LEL and the second electrode TEL. The first electrode LEL, the dielectric layer HDL, and the second electrode TEL may constitute a capacitor in which data is stored.

Each of the first electrodes LEL may have a solid pillar shape, but the present inventive concepts are not limited thereto. According to some example embodiments, each of the first electrodes LEL may have a cylindrical shape whose bottom is closed. A plurality of first electrodes LEL may be zigzag arranged along the second direction D2 to have a honeycomb-shaped arrangement. Alternatively, a plurality of first electrodes LEL may be disposed in a matrix shape along the first and second directions D1 and D2.

Each of the first electrodes LEL may be formed of, for example, impurity-doped silicon, metal such as tungsten, or conductive metal compound such as titanium nitride. The dielectric layer HDL may include a high-k dielectric material, such as hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, or a combination thereof. The second electrode TEL may include doped silicon, Ru, RuO, Pt, PtO, Ir, IrO, SRO (SrRuO), BSRO ((Ba,Sr)RuO), CRO (CaRuO), BaRuO, La(Sr,Co)O, Ti, TiN, W, WN, Ta, TaN, TiAlN, TiSiN, TaAlN, TaSiN, or any combination thereof. Although not shown, the second electrode TEL may be provided thereon with a plurality of stacked metal layers (e.g., M1, M2, M3, M4, and the like).

As a comparative example of the present inventive concepts, a multiple-patterning technique (MPT) may be employed to form fine-pitch patterns, such as the landing pads LP, on the substrate SUB. In contrast, the landing pads LP according to some example embodiments may be formed by a single patterning technique such as extreme ultraviolet (EUV) lithography. With reference to FIG. 4, the following will describe in detail a planar arrangement of the landing pads LP, formed by the EUV lithography, according to some example embodiments.

The landing pads LP may be disposed on corresponding contacts CNT that are arranged in the first direction D1, thereby constituting a single column. For example, FIG. 4 depicts by way of example first and second columns CO1 and CO2 each of which are constituted by the landing pads LP. The contacts CNT may be arranged along the first direction D1, but the landing pads LP may be zigzag arranged along the first direction D1. In such a configuration, each of the first and second columns CO1 and CO2 may include the landing pads LP that are arranged in a zigzag fashion along the first direction D1. The first and second columns CO1 and CO2 may be adjacent to each other in the second direction D2. For example, in the first column CO1, the contacts CNT may be arranged along a straight line extending in the first direction D1, and the landing pads LP may be zigzag arranged in the first direction such that landing pads in odd-numbered rows (e.g., R1, R3, and R5) may overlap left side portions, in the second direction D2, of corresponding contacts CNT, and landing pads LP in even-numbered rows (e.g., R2, R4) may overlap right side portions, in the second direction D2, of corresponding contacts. Such zigzag arrangement of the landing pads LP relative to the contacts CNT may increase a pitch between two landing pads adjacent to each other, and in turn, may increase a process margin in a process of a photolithography process using EUV lithography.

The first column CO1 may include a first landing pad LP1, a second landing pad LP2, and a third landing pad LP3 that are sequentially arranged along the first direction D1. The second column CO2 may include a fourth landing pad LP4, a fifth landing pad LP5, and a sixth landing pad LP6 that are sequentially arranged along the first direction D1.

A first pitch P1 may be provided between the landing pads LP of the first column CO1. For example, the first and second landing pads LP1 and LP2 may have the first pitch P1 as a distance between their centers. The second and third landing pads LP2 and LP3 may have the first pitch P1 as a distance between their centers. For example, the first pitch P1 may be the shortest distance between two landing pads in the first column CO1.

A second pitch P2 may be provided between the landing pads LP of the second column CO2. For example, the fourth and fifth landing pads LP4 and LP5 may have the second pitch P2 as a distance between their centers. The fifth and sixth landing pads LP5 and LP6 may have the second pitch P2 as a distance between their centers. For example, the second pitch P2 may be the shortest distance between two landing pads in the second column CO2. The second pitch P2 may be substantially the same as the first pitch P1. For example, each of the first and second pitches P1 and P2 may have a value from about 30 nm to about 100 nm. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

A distance between one landing pad LP of the first column CO1 and one landing pad LP of the second column CO2 may be different from the first pitch P1 or the second pitch P2. For example, the first and fifth landing pads LP1 and LP5 in two different rows (e.g., in the third row R3 and the fourth row R4, respectively) may have a first distance SP1 (i.e., the shorted distance therebetween in a fifth direction D5 between the third direction D3 and the second direction D2) between their centers. The second and fifth landing pads LP2 and LP5 in the same row (e.g., in the second row R2) may have a second distance SP2 (i.e., the shortest distance therebetween in the second direction D2) between their centers. The first distance SP1 may be different from the second distance SP2. The first distance SP1 may be different from the first pitch P1 or the second pitch P2. The first distance SP1 may be greater than the first pitch P1. The second distance SP2 may be different from the first pitch P1 or the second pitch P2.

A triangle may be defined when connecting centers of the first, second, and fifth landing pads LP1, LP2, and LP5. A first side of the triangle between the first landing pad LP1 and the second landing pad LP2 may correspond to the first pitch P1, a second side of the triangle between the first landing pad LP1 and the fifth landing pad LP5 may correspond to the first distance SP1, and a third side of the triangle between the fifth landing pad LP5 and the second landing pad LP2 may correspond to the second distance SP2. Since the first pitch P1, the first distance SP1, and the second distance SP2 are different from each other, the triangle may be an inequilateral triangle. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

When a multiple-patterning technique is employed to form the landing pads LP as discussed in the comparative example, the first pitch P1 and the first distance SP1 may be the same as each other. For example, when a multiple-patterning technique is used to form the landing pads LP, the triangle may be an isosceles triangle or an equilateral triangle.

In contrast, since the landing pads LP according to some example embodiments are formed by using a single patterning technique, such as EUV lithography, there may be a difference between the first pitch P1, the first distance SP1, and the second distance SP2, as discussed above.

As the EUV lithography is used to form the landing pad LP according to some example embodiments, the landing pad LP may be formed to have a relatively small size and to sufficiently overlap the contact CNT thereunder. For example, an area of each landing pad may be smaller than an area of a corresponding contact CNT, and each landing pad may overlap the center thereof. Accordingly, it may be possible to increase a process margin for the formation of the landing pads LP and as a result to increase reliability of an electrical connection between the landing pad LP and the contact CNT. Because the landing pad LP has a small size, and because neighboring landing pads LP have a large interval therebetween, process defects may be prevented in which one landing pad LP is in simultaneous contact with two contacts CNT. The zigzag arrangement of the landing pads LP relative to the contacts CNT and the smaller size of the landing pads LP relative to the contacts CNT may increase a pitch between two landing pads adjacent to each other in the shorted distance therebetween, and in turn, may increase a process margin in a process of a photolithography process using EUV lithography.

When the landing pads LP are formed by using the multiple-patterning technique of the comparative example, the landing pad LP may have a planar shape such as a rhombus, a parallelogram, a rounded rhombus, or a rounded parallelogram. However, because the landing pads LP according to some example embodiments are formed by using the single patterning technique (or the EUV process), the landing pad LP may have a substantially circular shape when the substrate SUB is viewed in a plan view. Terms such as "same," "equal," "planar," "circular," or "coplanar," as used herein encompass near identicality including variations that may occur, for example, due to manufacturing processes. The term "substantially" may be used herein to emphasize this meaning, unless the context or other statements indicate otherwise.

The key region KER will be discussed in detail with reference to FIGS. 1, 2, and 3E. When the chip regions CHR of the substrate SUB is divided into a plurality of dies, a cutting action may remove most of the scribe line region SL. Nevertheless, the scribe line region SL may have a remaining portion adjacent to the chip region CHR, and the remaining scribe line region SL may include the key region KER shown in FIGS. 2 and 3E.

The key region KER according to some example embodiments of the present inventive concepts may include key patterns, which include one or more of an alignment key and an overlay key that are used to align upper and lower layers in semiconductor processes.

The substrate SUB may include first key patterns KEP1 on an upper portion thereof. The first key patterns KEP1 may be formed together with the active patterns ACT. For example, the first key patterns KEP1 may have the same width and pitch as those of the active patterns ACT. The device isolation layer ST may fill between the first key patterns KEP1.

The dielectric layer IL may be provided on the substrate SUB. An upper portion of the substrate SUB may be recessed to define second key patterns KEP2. The second key patterns KEP2 may be formed together with the first contact holes CNH1.

An upper layer MAL may be provided on the dielectric layer TL. The upper layer MAL may include the same material as that of the line structure LST on the cell region CER. For example, although not shown, the upper layer MAL may include a first layer that corresponds to the conductive pattern CP, a second layer that corresponds to the barrier pattern BP, a third layer that corresponds to the bit line BL, and a fourth layer that corresponds to the mask pattern MP.

A third key pattern KEP3 may be provided on the upper layer MAL. The third key pattern KEP3 may be formed together with the landing pads LP. Therefore, the third key pattern KEP3 may include the same metallic material as that of the landing pad LP.

The third key pattern KEP3 may include a plurality of openings OP. The openings OP may each have a linear shape that extends in the first direction D1. The openings OP may be arranged in the second direction D2 at a regular pitch (i.e., at the same pitch). The openings OP may expose the upper layer MAL. The dielectric patterns INP may fill corresponding openings OP.

A dummy structure DUS may be provided on the third key pattern KEP3. The dummy structure DUS may be formed together with the data storage element DS. Therefore, the dummy structure DUS may include the first electrode LEL, the second electrode TEL, and the dielectric layer HDL between the first and second electrodes LEL and TEL.

FIGS. 5, 7, 9, 11, 13, 15, and 17 illustrate plan views showing a method of fabricating a semiconductor device according to some example embodiments of the present inventive concepts. FIGS. 6A, 8A, 10A, 12A, 14A, 16A, and 18A illustrate cross-sectional views taken along line A-A' of FIGS. 5, 7, 9, 11, 13, 15, and 17, respectively. FIGS. 6B, 8B, 10B, 12B, 14B, 16B, and 18B illustrate cross-sectional views taken along line B-B' of FIGS. 5, 7, 9, 11, 13, 15, and 17, respectively. FIGS. 6C, 8C, 10C, 12C, 14C, 16C, and 18C illustrate cross-sectional views taken along line C-C' of FIGS. 5, 7, 9, 11, 13, 15, and 17, respectively. FIGS. 6D, 8D, 10D, 12D, 14D, 16D, and 18D illustrate cross-sectional views taken along line D-D' of FIGS. 5, 7, 9, 11, 13, 15, and 17, respectively. The following will focus on a fabrication method according to some example embodiments performed on the cell region CER.

Referring to FIGS. 5 and 6A to 6D, an upper portion of a substrate SUB may be patterned to form active patterns ACT. Each of the active patterns ACT may extend in a third direction D3 parallel to a top surface of the substrate SUB. The active patterns ACT may be two-dimensionally arranged along first and second directions D1 and D2. The active patterns ACT may be spaced apart from each other in the third direction D3.

According to some example embodiments of the present inventive concepts, an extreme ultraviolet (EUV) lithography process may be adopted as a patterning process for the formation of the active patterns ACT. The EUV lithography process may include exposure and development processes that use extreme ultraviolet radiation (EUV) irradiated to a photoresist layer. For example, the photoresist layer may be an organic photoresist that contains an organic polymer, such as polyhydroxystyrene. The organic photoresist may further include a photosensitive compound that is sensitive to the EUV. The organic photoresist may additionally include a material whose EUV absorption coefficient is high, for example, an organometallic material, an iodine-containing material, or a fluorine-containing material. For another example, the photoresist layer may be an inorganic photoresist that contains an inorganic material, such as tin oxide.

The photoresist layer may be formed relatively thin. The photoresist layer exposed to the EUV may undergo a development process to form photoresist patterns. When the substrate SUB is viewed in a plan view, the photoresist patterns may have a linear shape that extends in one direction, an island shape, a zigzag shape, a honeycomb shape, or a circular shape.

The photoresist patterns may be used as an etching mask to pattern one or more mask layers that are stacked below the photoresist patterns, and thus mask patterns may be formed. The mask patterns may be used as an etching mask to pattern a target layer to form desired patterns on a wafer.

A value equal to or less than about 45 nm may be given as a minimum pitch between the active patterns ACT achieved by the EUV lithography process according to some example embodiments. For example, the EUV lithography process may be performed in which only one photomask is enough to accomplish the active patterns ACT that are elaborate and delicate.

First and second trenches TR1 and TR2 may be defined between the active patterns ACT. The first trench TR1 may be defined between a pair of active patterns ACT that are adjacent to each other in the second direction D2. The second trench TR2 may be defined between a pair of active patterns ACT that are adjacent to each other in the third direction D3.

A device isolation layer ST may be formed to fill the first and second trenches TR1 and TR2. The device isolation layer ST may be formed to completely fill the first and second trenches TR1 and TR2 and to cover the active patterns ACT. A planarization process may be performed on the device isolation layer ST until top surfaces of the active patterns ACT are exposed.

Referring to FIGS. 7 and 8A to 8D, the active patterns ACT and the device isolation layer ST may be patterned to form third trenches TR3. When the substrate SUB is viewed in a plan view, each of the third trenches TR3 may have a linear shape that extends in the second direction D2.

The formation of the third trenches TR3 may include forming a hardmask pattern that has openings, and then performing an etching process in which the hardmask pattern is used as an etching mask to etch the exposed active patterns ACT and the device isolation layer ST. The third trench TR3 may be formed shallower than the first trench TR1.

Referring to FIGS. 9 and 10A to 10D, a gate dielectric layer GI, a gate electrode GE, and a gate capping layer GP may be sequentially formed in each of the third trenches TR3. For example, the gate dielectric layer GI may be conformally formed in the third trench TR3. The gate dielectric layer GI may include one or more of a silicon oxide layer, a silicon nitride layer, a silicon oxynitride layer, and a high-k dielectric material.

The gate electrode GE may be formed by forming on the gate dielectric layer GI a conductive layer that fills the third trench TR3. The conductive layer may include one or more of metal and conductive metal nitride.

The gate dielectric layer GI and the gate electrode GE may be recessed, and then the gate capping layer GP may be formed on the recessed gate electrode GE. The gate capping layer GP may have a top surface coplanar with that of the active pattern ACT.

The active patterns ACT may undergo an ion implantation process to form a first source/drain region SD1 and a pair of second source/drain regions SD2 on an upper portion of the active pattern ACT. The pair of second source/drain regions SD2 may be spaced apart in the third direction D3 from each other across the first source/drain region SD1. For example, the first and second source/drain regions SD1 and SD2 may be doped with the same impurity.

A channel region CH may be defined on the active pattern ACT positioned below the gate electrode GE. When the substrate SUB is viewed in a plan view, the channel region CH may be interposed between the first source/drain region SD1 and the second source/drain region SD2. The gate electrode GE may be provided on a top surface and opposite sidewalls of the channel region CH (see FIG. 10B).

Referring to FIGS. 11 and 12A to 12D, a dielectric layer IL may be formed on an entire surface of the substrate SUB. For example, the dielectric layer IL may have a multiple-layered structure in which a silicon oxide layer and a silicon oxynitride layer are stacked. The dielectric layer IL may be patterned to form first contact holes CNH1 that correspondingly expose the first source/drain regions SD1 of the active patterns ACT. When the first contact hole CNH1 is formed, the first source/drain region SD1 may be recessed at its upper portion. When the first contact hole CNH1 is formed, the device isolation layer ST may be recessed at its upper portion around the first source/drain region SD1.

Referring to FIGS. 13 and 14A to 14D, a first conductive layer CL1, a barrier layer BAL, and a second conductive layer CL2 may be sequentially formed on the dielectric layer IL. The first conductive layer CL1 may fill the first contact holes CNH1. For example, the first conductive layer CL1 may contact the first source/drain regions SD1 of the active patterns ACT. The dielectric layer IL may vertically separate the first conductive layer CL1 from the second source/drain regions SD2 of the active patterns ACT. The first conductive layer CL1 may include a doped semiconductor material.

The barrier layer BAL may be formed to lie between the first conductive layer CL1 and the second conductive layer CL2. The barrier layer BAL may include conductive metal nitride. The second conductive layer CL2 may include a metallic material. The barrier layer BAL may prevent the first conductive layer CL1 from receiving a metallic material diffused from the second conductive layer CL2.

Referring to FIGS. 15 and 16A to 16D, line structures LST may be formed to extend in parallel to each other in the first direction D1 on the dielectric layer IL. The line structures LST may be arranged along the second direction D2.

For example, mask patterns MP may be formed on the second conductive layer CL2. The mask patterns MP may be formed to have their linear shapes that extend in the first direction D1. For example, the mask patterns MP may include a silicon nitride layer or a silicon oxynitride layer.

The mask patterns MP may be used as a mask to sequentially etch the second conductive layer CL2, the barrier layer BAL, and the first conductive layer CL1 to respectively form a bit line BL, a barrier pattern BP, and a conductive pattern CP. The mask pattern MP, the bit line BL, the barrier pattern BP, and the conductive pattern CP may vertically overlap each other. The mask pattern MP, the bit line BL, the barrier pattern BP, and the conductive pattern CP may constitute the line structure LST. When the substrate SUB is viewed in a plan view, the bit lines BL may extend while intersecting the gate electrodes GE.

The conductive pattern CP may include contact parts CNP that correspondingly fill the first contact holes CNH1. The conductive pattern CP may be connected through the contact part CNP to the first source/drain region SD1. For example, the bit line BL may be electrically connected through the conductive pattern CP to the first source/drain region SD1.

A pair of spacers SP may be formed on opposite sidewalls of each of the line structures LST. The formation of the spacers SP may include conformally forming a spacer layer on the entire surface of the substrate SUB and then anisotropically etching the spacer layer.

The spacers SP and the mask patterns MP may be used as a mask to perform an etching process to form second contact holes CNH2 that correspondingly expose the second source/drain regions SD2. For example, the second contact hole CNH2 may penetrate the dielectric layer TL and downwardly extend from the top surface of the substrate SUB. When the second contact hole CNH2 is formed, the second source/drain region SD2 may be recessed at its upper portion. When the second contact hole CNH2 is formed, the device isolation layer ST may be recessed at its upper portion around the second source/drain region SD2.

Referring to FIGS. 17 and 18A to 18D, a plurality of dielectric fences IFS may be formed on the gate capping layer GP. The dielectric fences IFS do not overlap, but expose the second contact holes CNH2.

The second contact holes CNH2 may be filled with a conductive material to form contacts CNT in corresponding second contact holes CNH2. The contacts CNT may be connected to the second source/drain regions SD2. For example, the conductive material may be formed on the entire surface of the substrate SUB, and thereafter, the conductive material may be recessed such that a top surface of the conductive material may become lower than top surfaces of the dielectric fences IFS. The dielectric fences IFS may divide the conductive material into pieces, and thus the contacts CNT may be correspondingly formed in the second contact holes CNH2. The contacts CNT and the dielectric fences IFS may be alternately arranged along the first direction D1.

A doped semiconductor material may be adopted as the conductive material that fills the second contact holes CNH2. A doped semiconductor may fill the second contact holes CNH2, and then impurities in the semiconductor may be allowed to diffuse toward the second source/drain regions SD2.

Referring back to FIGS. 1 and 2A to 2D, landing pads LP may be formed on corresponding contacts CNT. For example, a metal layer may be formed on the contacts CNT and the dielectric fences IFS. The metal layer may be patterned to form a plurality of landing pads LP. A gap between the plurality of landing pads LP may be filled with a dielectric material to form a dielectric pattern INP. First electrodes LEL may be formed on corresponding landing pads LP. A dielectric layer HDL may be conformally formed on the first electrodes LEL. A second electrode TEL may be formed on the dielectric layer HDL. The first electrode LEL, the dielectric layer HDL, and the second electrode TEL may constitute a data storage element DS, for example, a capacitor. Although not shown, wiring layers (e.g., M1, M2, M3, M4, and the like) may be stacked on the second electrode TEL.

FIGS. 19, 21, 23, 25, 27, and 29 illustrate plan views showing a method of forming a landing pad and a third key pattern according to some example embodiments of the present inventive concepts. FIGS. 20, 22, 24, 26, 28, and 30 illustrate cross-sectional views taken along lines A-A' and B-B' of FIGS. 19, 21, 23, 25, 27, and 29, respectively. For example, the following will discuss a method of forming the landing pad LP and the third key pattern KEP3 respectively on the cell region CER and the key region KER shown in FIGS. 2 and 3A to 3E.

Figure 19:
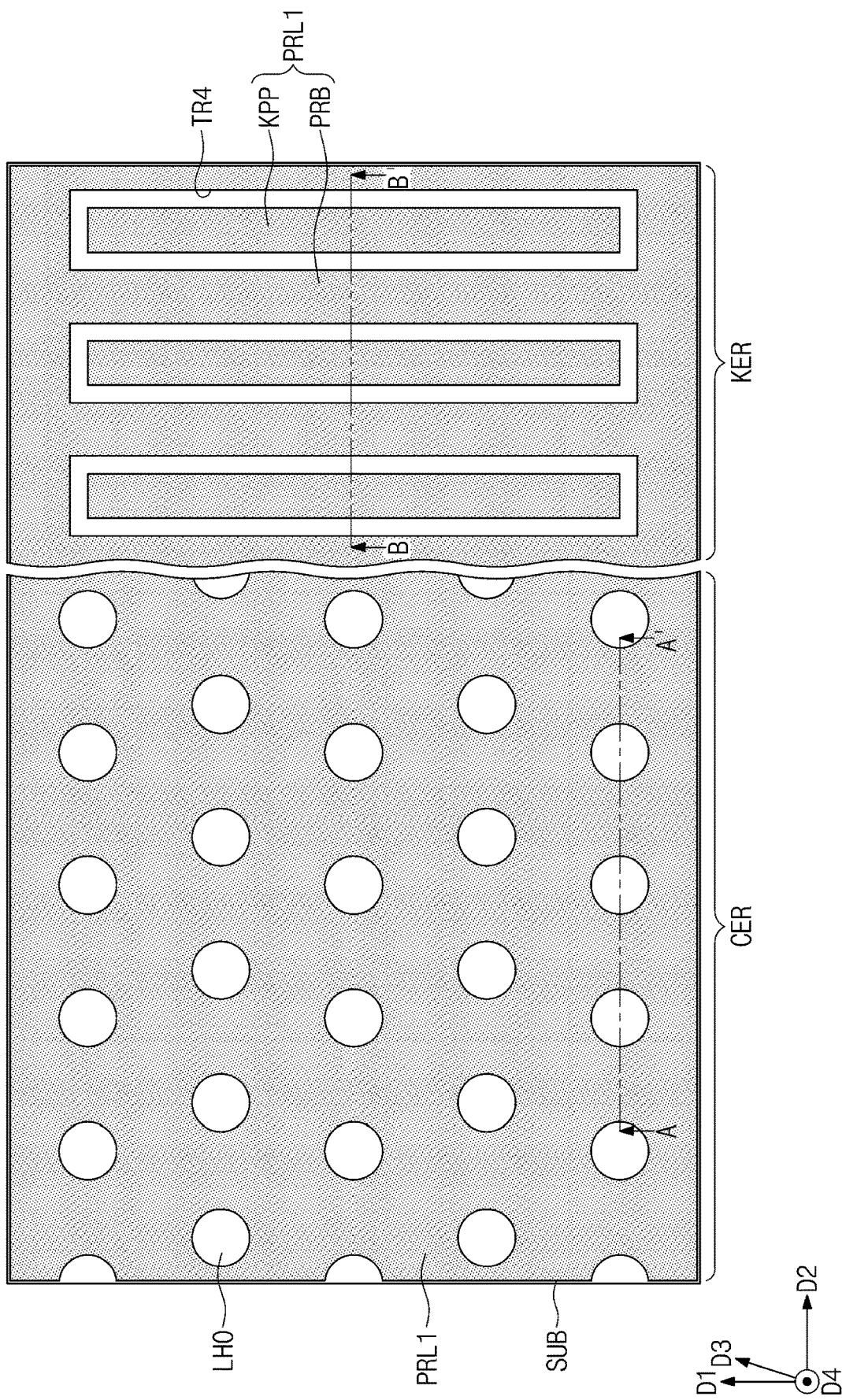
FIGS. 19, 21, 23, 25, 27, and 29 illustrate plan views showing a method of forming a landing pad and a third key pattern according to some example embodiments of the present inventive concepts.
Figure 20:
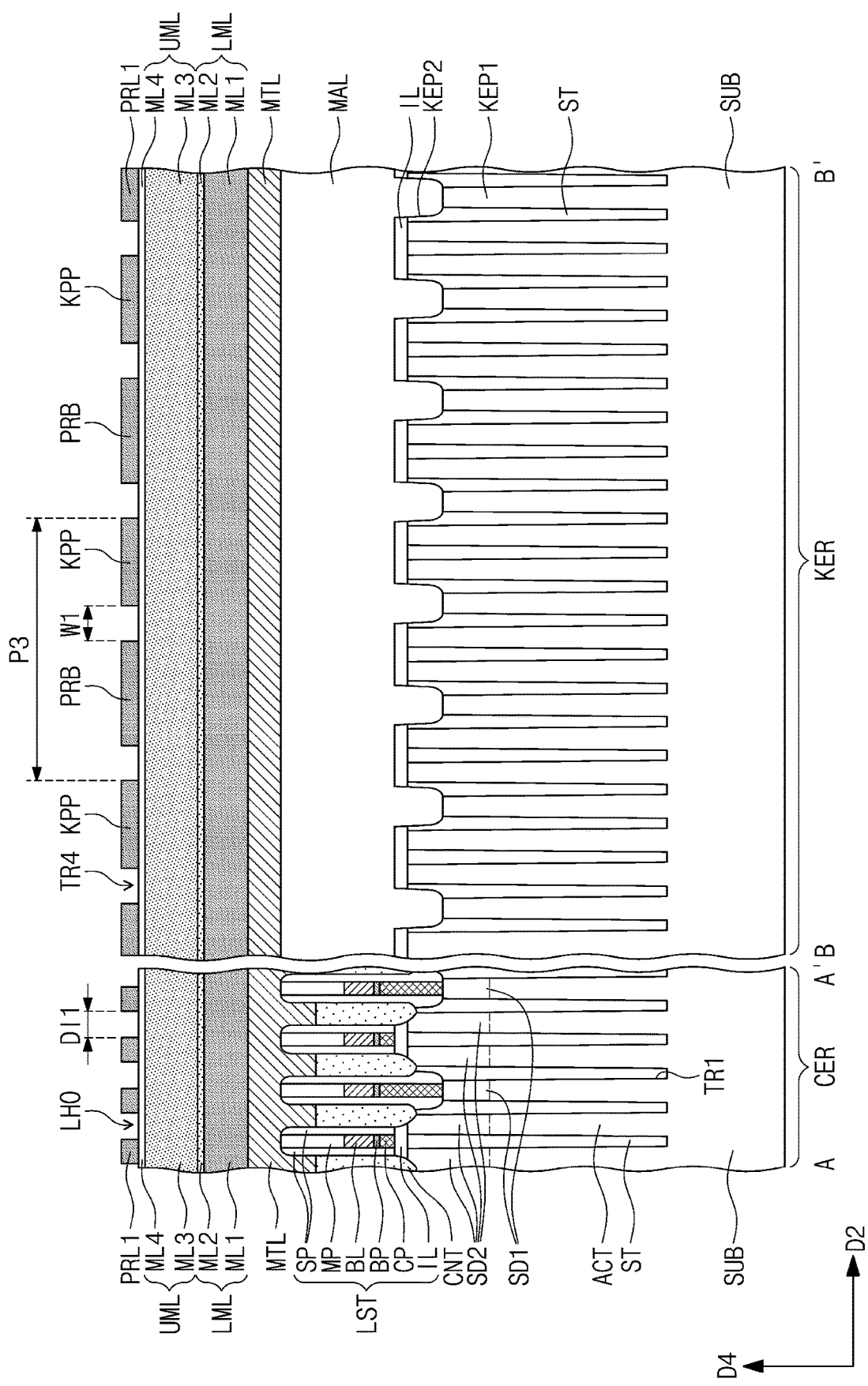
FIGS. 20, 22, 24, 26, 28, and 30 illustrate cross-sectional views taken along lines A-A' and B-B' of FIGS. 19, 21, 23, 25, 27, and 29, respectively.

Referring to FIGS. 19 and 20, a metal layer MTL, a first mask layer ML1, a second mask layer ML2, a third mask layer ML3, a fourth mask layer ML4, and a first photoresist layer PRL1 may be sequentially formed on a resultant structure of FIGS. 17 and 18A to 18D. The metal layer MTL may be an etching target layer in the present embodiment.

A top surface of the upper layer MAL on the key region KER may be located at substantially the same level as that of a top surface of the line structure LST on the cell region CER. The metal layer MTL may cover not only top surfaces of the contacts CNT, but also the top surface of each of the line structure LST and the upper layer MAL. The metal layer MTL may be planarized.

The first and second mask layers ML1 and ML2 may constitute a lower mask layer LML. The third and fourth mask layers ML3 and ML4 may constitute an upper mask layer UML. For example, the first mask layer ML1 may include an amorphous carbon layer (ACL). The second mask layer ML2 may include a silicon layer. The third mask layer ML3 may include a spin-on-carbon (SOC) layer or a spin-on-hardmask (SOH) layer. The fourth mask layer ML4 may include a silicon nitride layer or a silicon oxynitride layer. The first photoresist layer PRL1 may include an organic photoresist discussed above.

An extreme ultraviolet (EUV) lithography process may be performed on the first photoresist layer PRL1. The EUV lithography process may be substantially the same as that used for forming the active patterns ACT discussed with reference to FIGS. 5 and 6A to 6D.

The first photoresist layer PRL1 may undergo exposure and development processes in which extreme ultraviolet radiation (EUV) is used to form holes LHO and fourth trenches TR4 on the cell region CER and the key region KER, respectively. The holes LHO and the fourth trenches TR4 may expose a top surface of the fourth mask layer ML4.

The holes LHO on the cell region CER may define positions where the landing pads LP will be formed. Each of the holes LHO may have a first diameter DI1. For example, the first diameter DI1 may have a value from about 20 nm to about 50 nm. A planar shape and arrangement of the holes LHO may be substantially the same as those of the landing pads LP shown in FIG. 4 discussed above.

The first photoresist layer PRL1 on the key region KER may include a first preliminary key pattern KPP defining the fourth trench TR4. For example, the fourth trench TR4 is disposed between two adjacent first preliminary key patterns KPP in the second direction D2. The first preliminary key pattern KPP may have a bar shape that extends in the first direction D1. When the substrate SUB is viewed in a plan view, the fourth trench TR4 may surround the first preliminary key pattern KPP. A plurality of first preliminary key patterns KPP on the key region KER may define positions to form the openings OP of the third key pattern KEP3 shown in FIG. 2. The first preliminary key patterns KPP may have a third pitch P3 therebetween. For example, the third pitch P3 may have a value from about 200 nm to about 2,000 nm.

The first photoresist layer PRL1 may further include a first bar pattern PRB between the first preliminary key patterns KPP that are adjacent to each other. A fourth trench TR4 may be positioned between the first preliminary key pattern KPP and the first bar pattern PRB. The fourth trench TR4 may have a first width W1. The first width W1 may be greater than the first diameter DI1. For example, the first width W1 may have a value from about 50 nm to about 70 nm.

Figure 21:
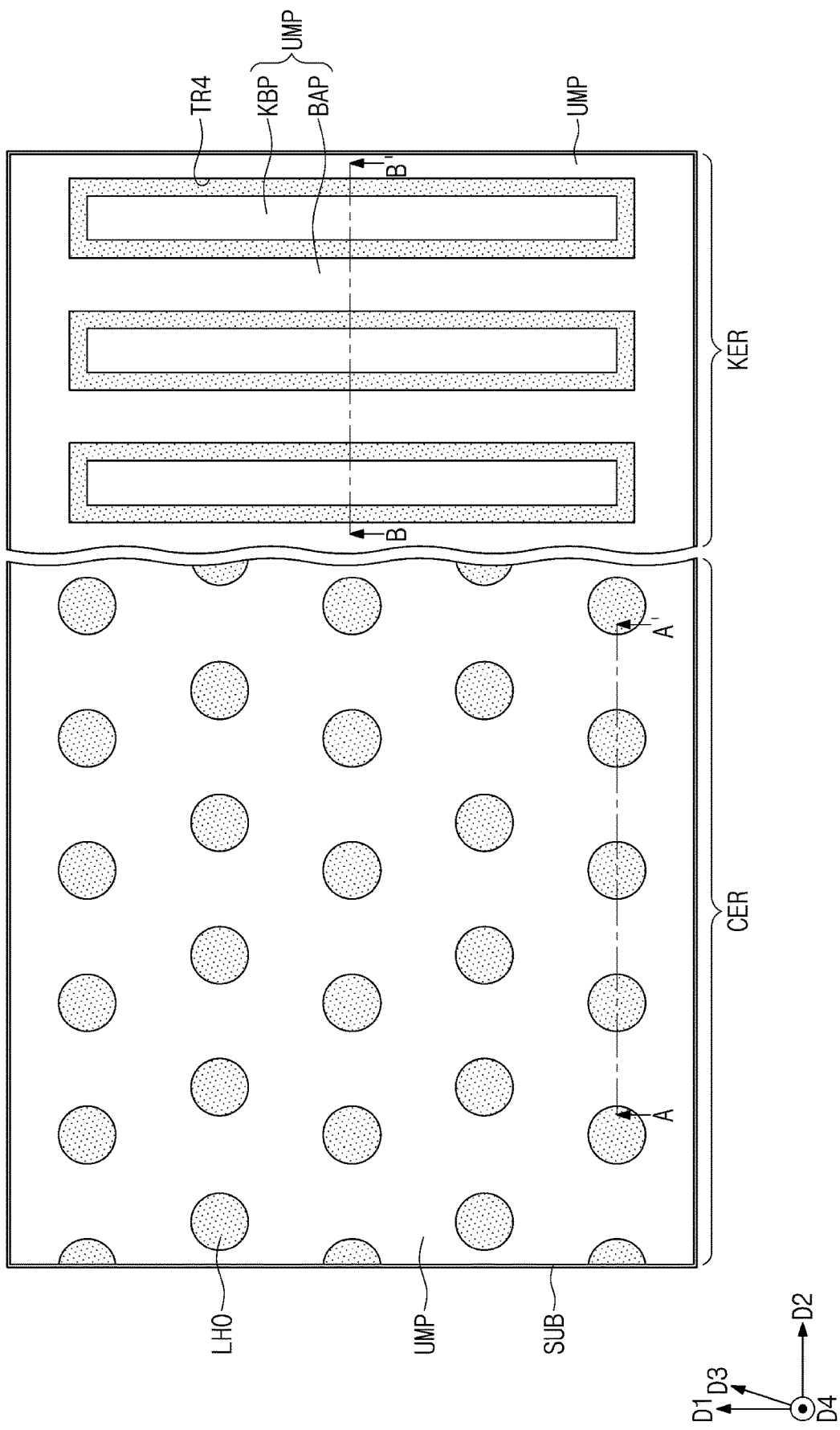
Figure 22:
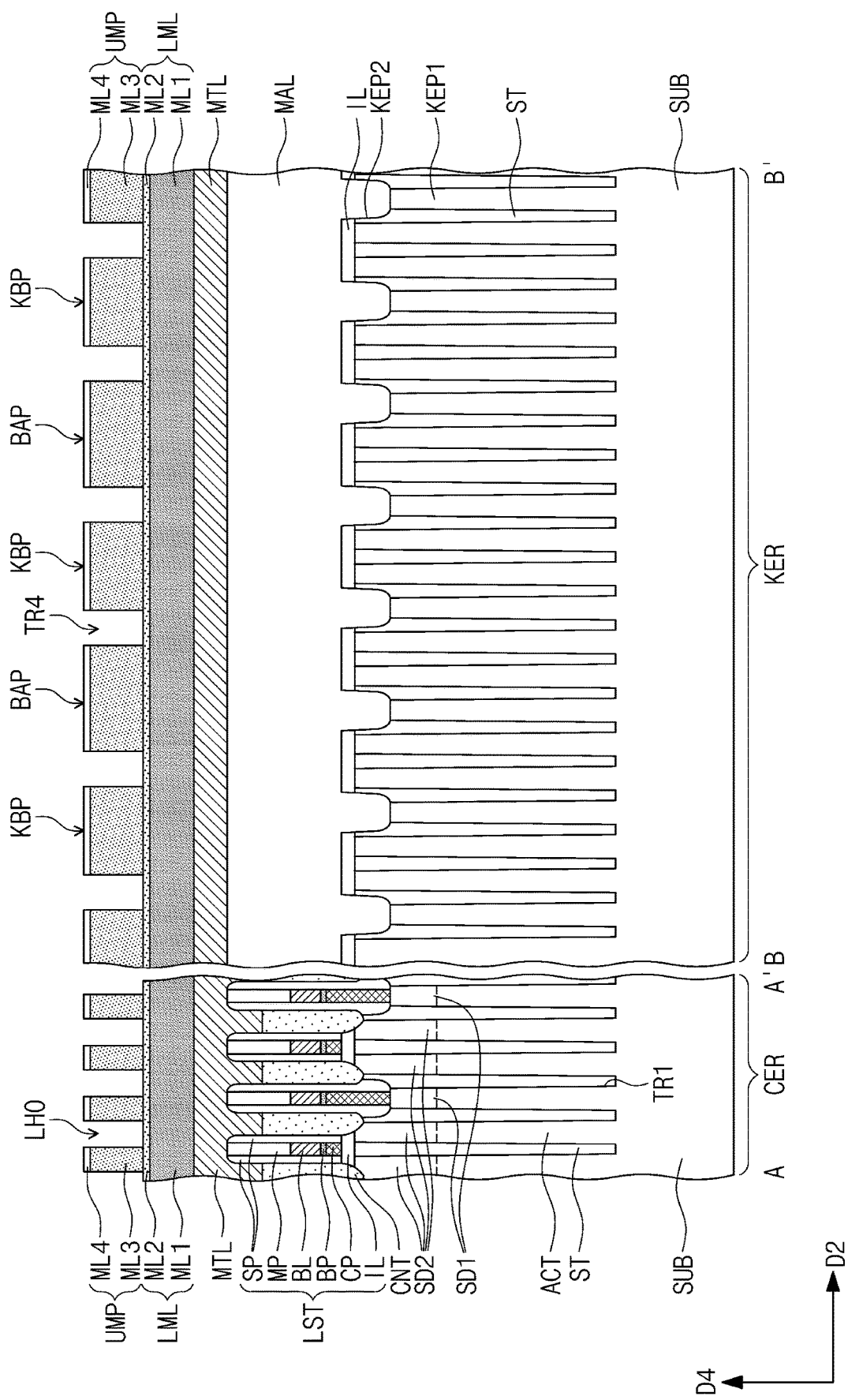

Referring to FIGS. 21 and 22, the first photoresist layer PRL1 may be used as an etching mask to pattern the upper mask layer UML to form upper mask patterns UMP. The upper mask pattern UMP may include a third mask layer ML3 and a fourth mask layer ML4.

For example, the formation of the upper mask patterns UMP may include using the first photoresist layer PRL1 as an etching mask to pattern the fourth mask layer ML4, and then using the patterned fourth mask layer ML4 to pattern the third mask layer ML3. When the third mask layer ML3 is patterned, the first photoresist layer PRL1 may be completely removed.

The upper mask pattern UMP on the cell region CER may include holes LHO. When the substrate SUB is viewed in a plan view, the holes LHO of the upper mask pattern UMP may have substantially the same size and shape as those of the holes LHO of the first photoresist layer PRL1. The holes LHO of the upper mask pattern UMP may expose a top surface of the second mask layer ML2.

The upper mask patterns UMP on the key region KER may include second preliminary key patterns KBP and second bar patterns BAP. The second preliminary key patterns KBP may correspond to corresponding first preliminary key patterns KPP of the first photoresist layer PRL1, and the second bar patterns BAP may correspond to corresponding first bar patterns PRB of the first photoresist layer PRL1.

The upper mask patterns UMP on the key region KER may further include a fourth trench TR4 between the second preliminary key pattern KBP and the second bar pattern BAP. When the substrate SUB is viewed in a plan view, the fourth trench TR4 of the upper mask pattern UMP may have substantially the same size and shape as those of the fourth trench TR4 of the first photoresist layer PRL1. The fourth trench TR4 of the upper mask pattern UMP may expose the top surface of the second mask layer ML2.

Figure 23:
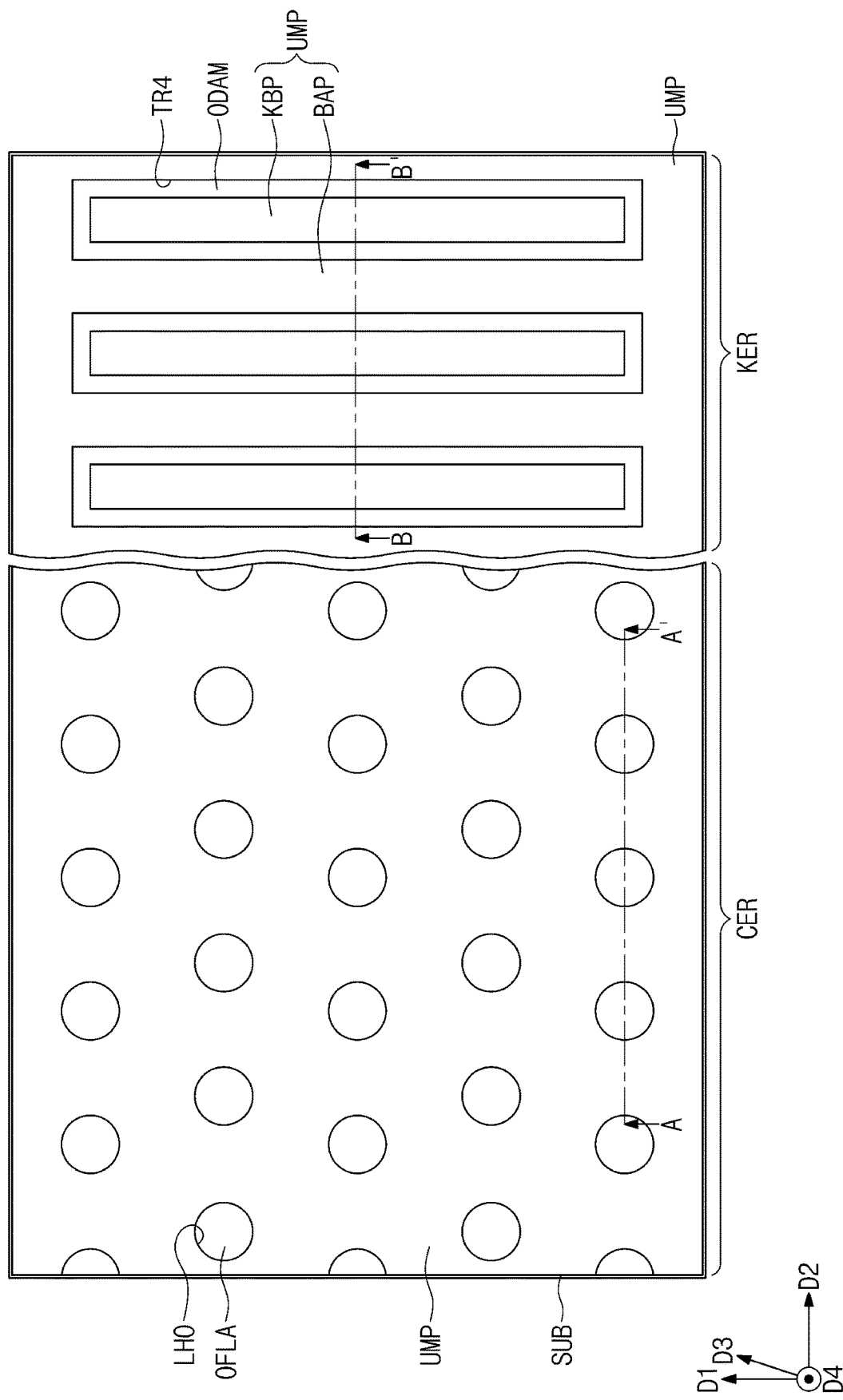
Figure 24:
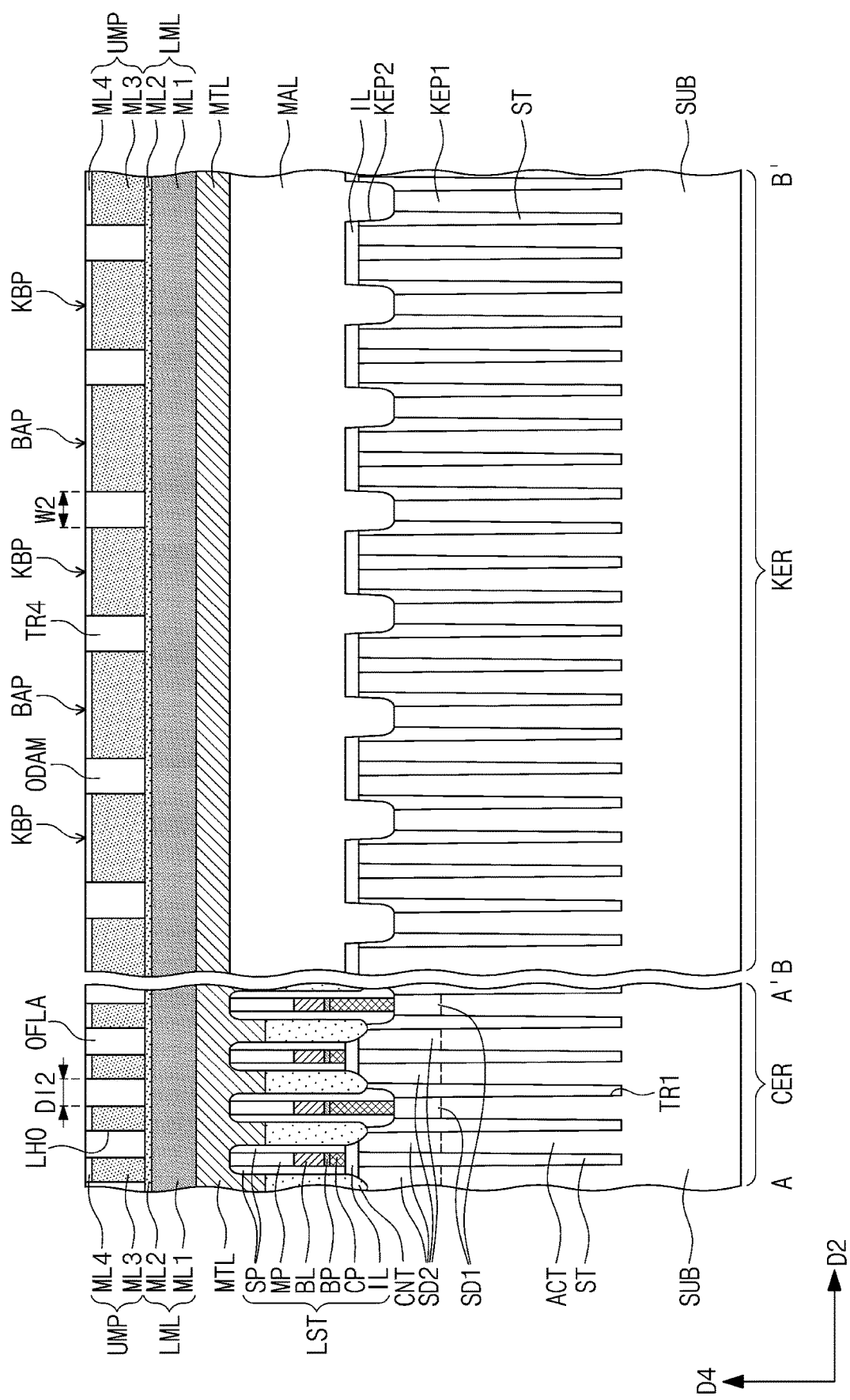

Referring to FIGS. 23 and 24, pillar patterns OFLA may be formed in corresponding holes LHO on the cell region CER and dam patterns ODAM may be formed in corresponding fourth trenches TR4 on the key region KER.

For example, the formation of the pillar patterns OFLA and the dam patterns ODAM may include conformally forming a dielectric layer on the entire surface of the substrate SUB, and then etching-back the dielectric layer to expose the top surface of the fourth mask layer ML4. The dielectric layer may be deposited to have a thickness sufficient enough to fill the holes LHO and the fourth trenches TR4 respectively on the cell region CER and the key region KER. For example, the fourth trench TR4 may have a first width W1, and the dielectric layer may be deposited to have a thickness greater than half the first width W1.

Each of the pillar patterns OFLA may have a second diameter DI2. For example, the second diameter DI2 may have a value from about 20 nm to about 50 nm. Each of the dam patterns ODAM may have a second width W2. The second width W2 may be greater than the second diameter DI2. For example, the second width W2 may have a value from about 50 nm to about 70 nm. The pillar patterns OFLA and the dam patterns ODAM may include a material having etch selectivity with respect to the third mask layer ML3. For example, the pillar patterns OFLA and the dam patterns ODAM may include silicon oxide, silicon nitride, or silicon oxynitride.

Figure 25:
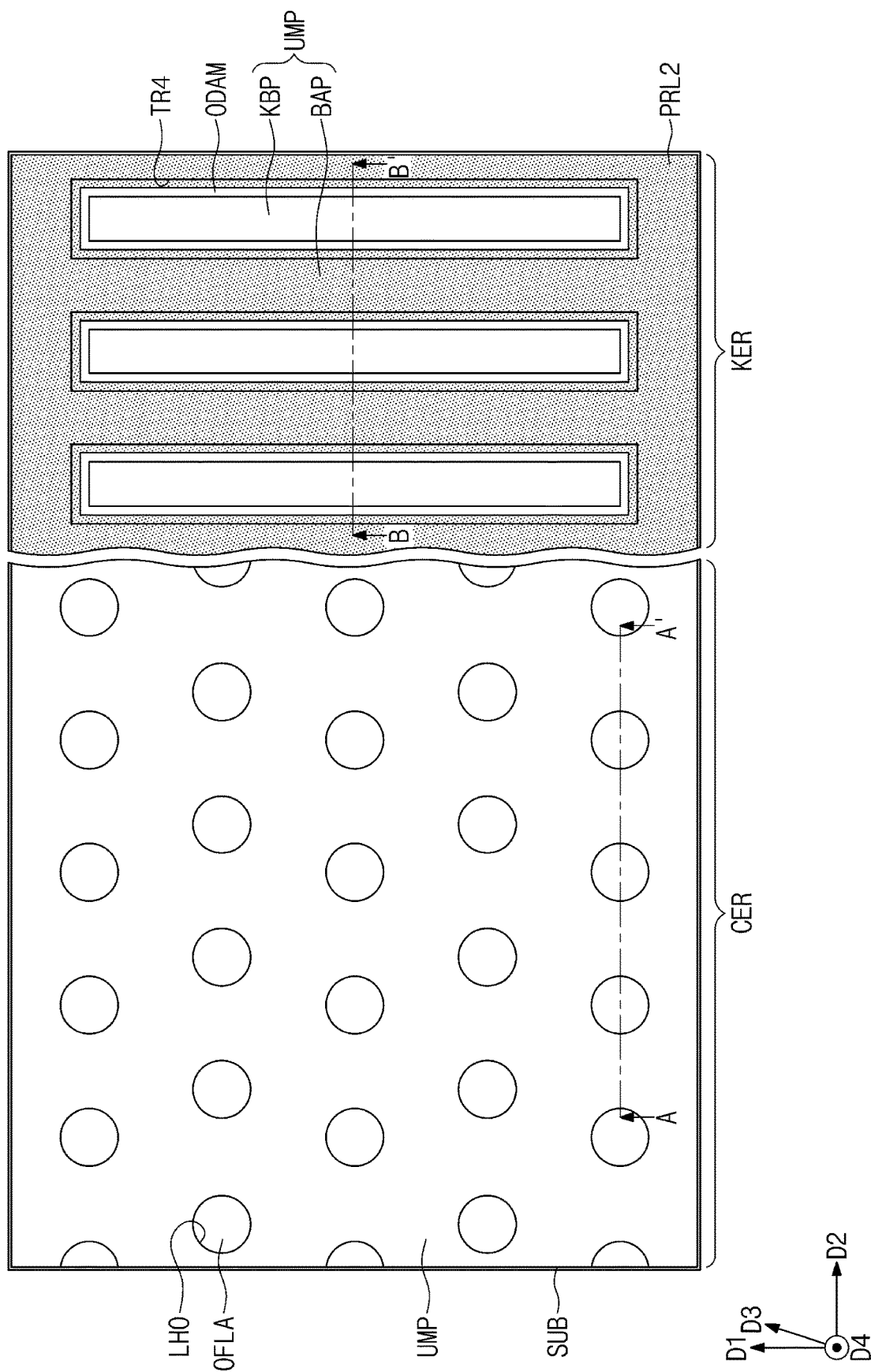
Figure 26:
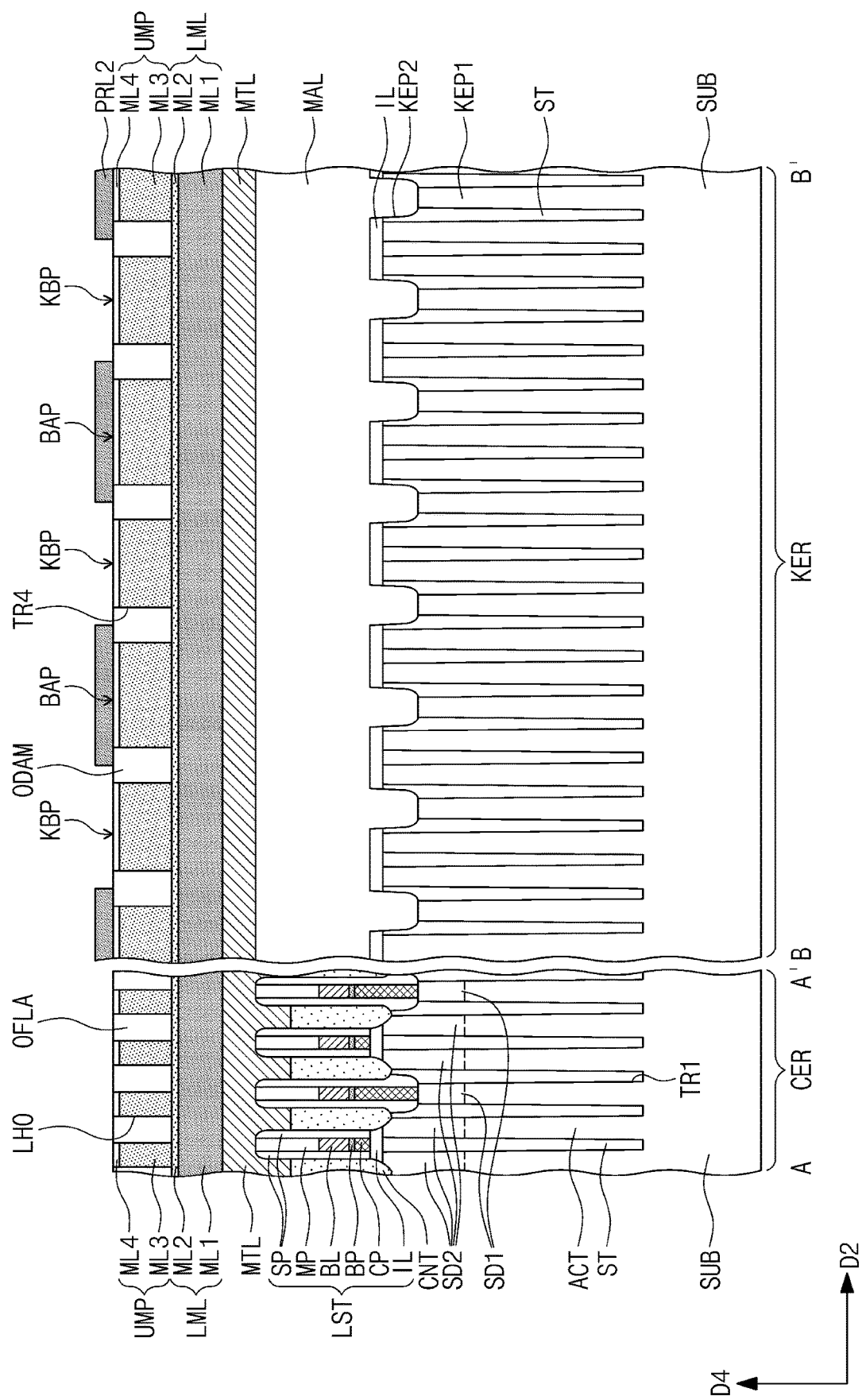

Referring to FIGS. 25 and 26, a second photoresist layer PRL2 may be selectively formed on the key region KER except for the cell region CER. The second photoresist layer PRL2 may open or expose the cell region CER.

The second photoresist layer PRL2 may be exposed and developed to expose the second preliminary key patterns KBP. The second photoresist layer PRL2 may cover the second bar patterns BAP. The second photoresist layer PRL2 may be formed to cover a portion of a top surface of each dam pattern ODAM and to expose a remaining portion of the top surface of each dam pattern ODAM.

Figure 27:
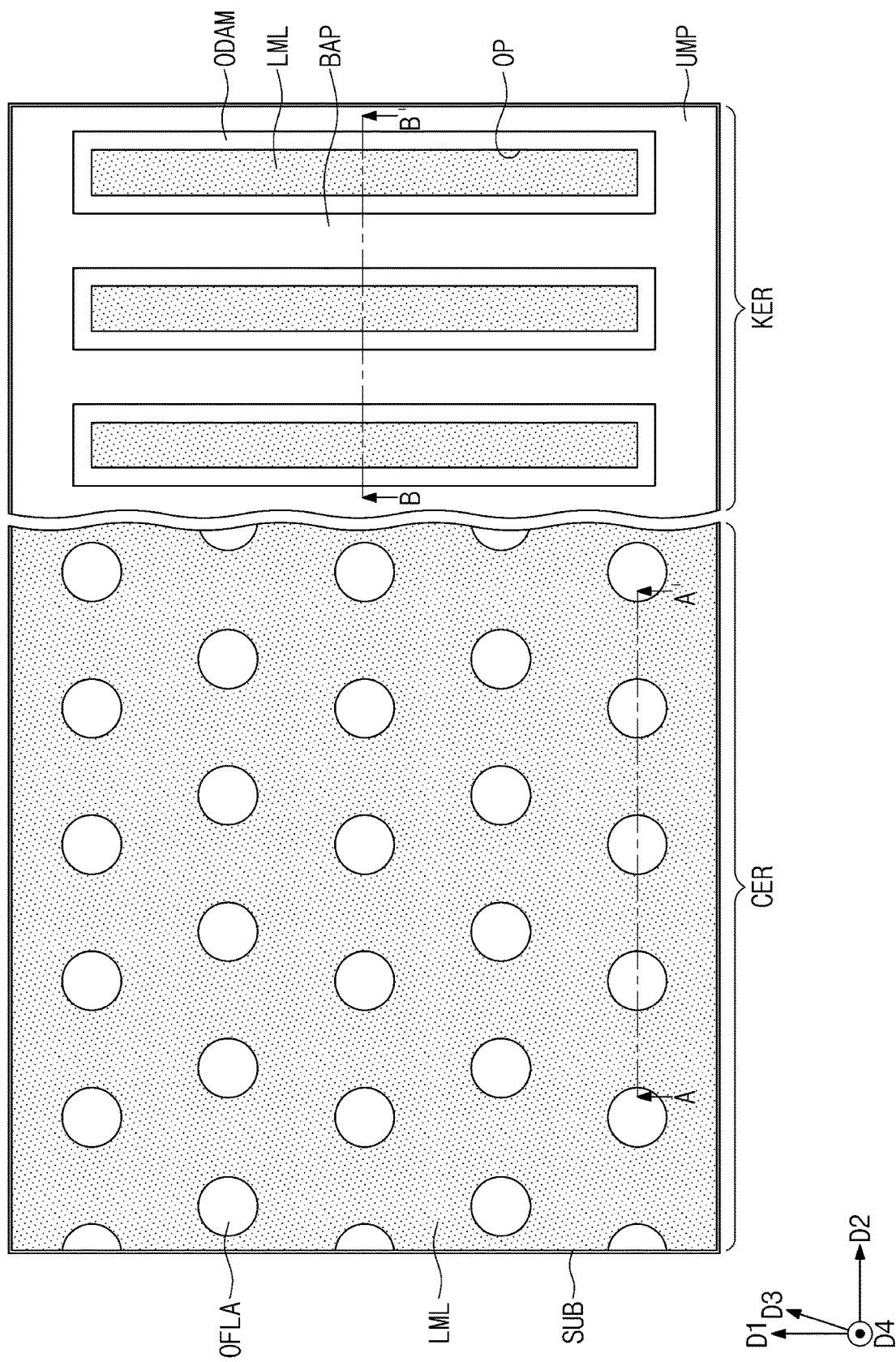
Figure 28:
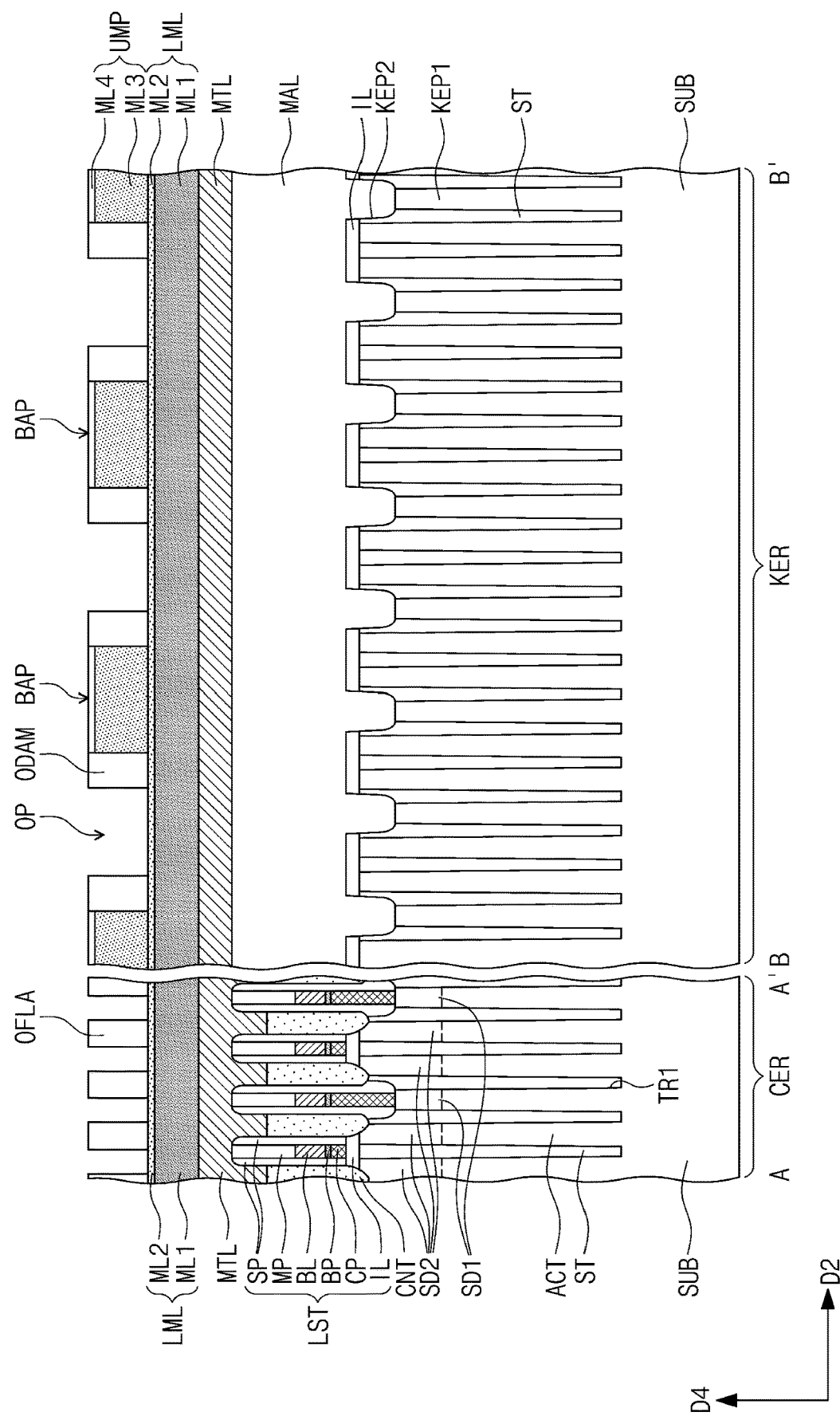

Referring to FIGS. 27 and 28, a selective removal may be performed on the upper mask patterns UMP exposed by the second photoresist layer PRL2. Because the second photoresist layer PRL2 completely opens or exposes the cell region CER, the upper mask pattern UMP may be entirely removed from the cell region CER. Because the pillar patterns OFLA have etch selectivity with respect to the upper mask pattern UMP, the pillar patterns OFLA may remain without being removed.

Because the second photoresist layer PRL2 exposes the second preliminary key patterns KBP on the key region KER, the second preliminary key patterns KBP may all be removed from the key region KER. Because the second photoresist layer PRL2 covers the second bar patterns BAP on the key region KER, the second bar patterns BAP may remain without being removed. Because the pillar patterns OFLA have etch selectivity with respect to the upper mask pattern UMP, the dam patterns ODAM may remain without being removed. As a result, the second preliminary key patterns KBP may be selectively removed from the key region KER.

The removal of the second preliminary key pattern KBP may form an opening OP surrounded by the dam pattern ODAM. When the substrate SUB is viewed in a plan view, the opening OP may have substantially the same size and shape as those of the first preliminary key pattern KPP of the first photoresist layer PRL1 discussed above. The opening OP may expose the top surface of the second mask layer ML2.

Figure 29:
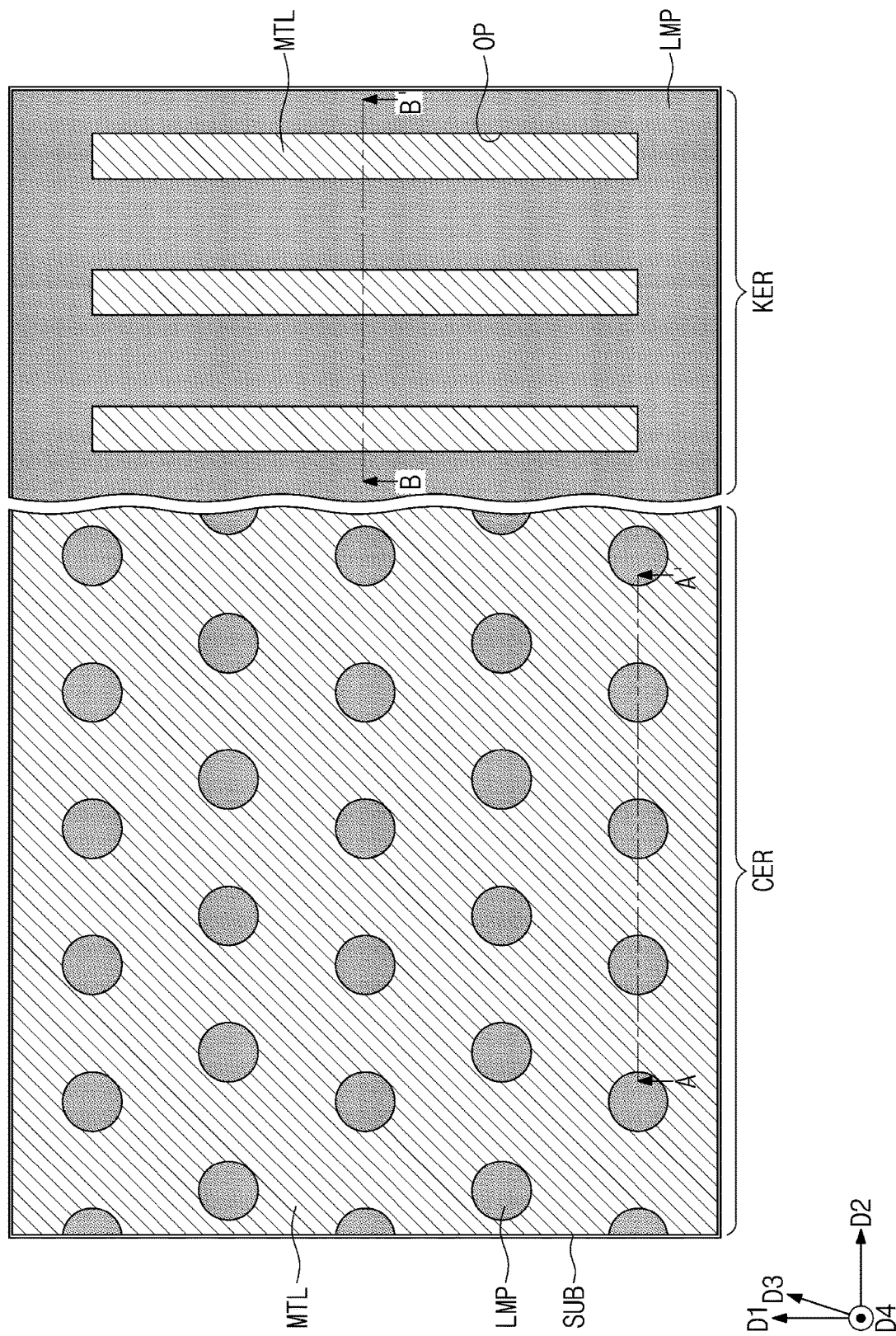
Figure 30:
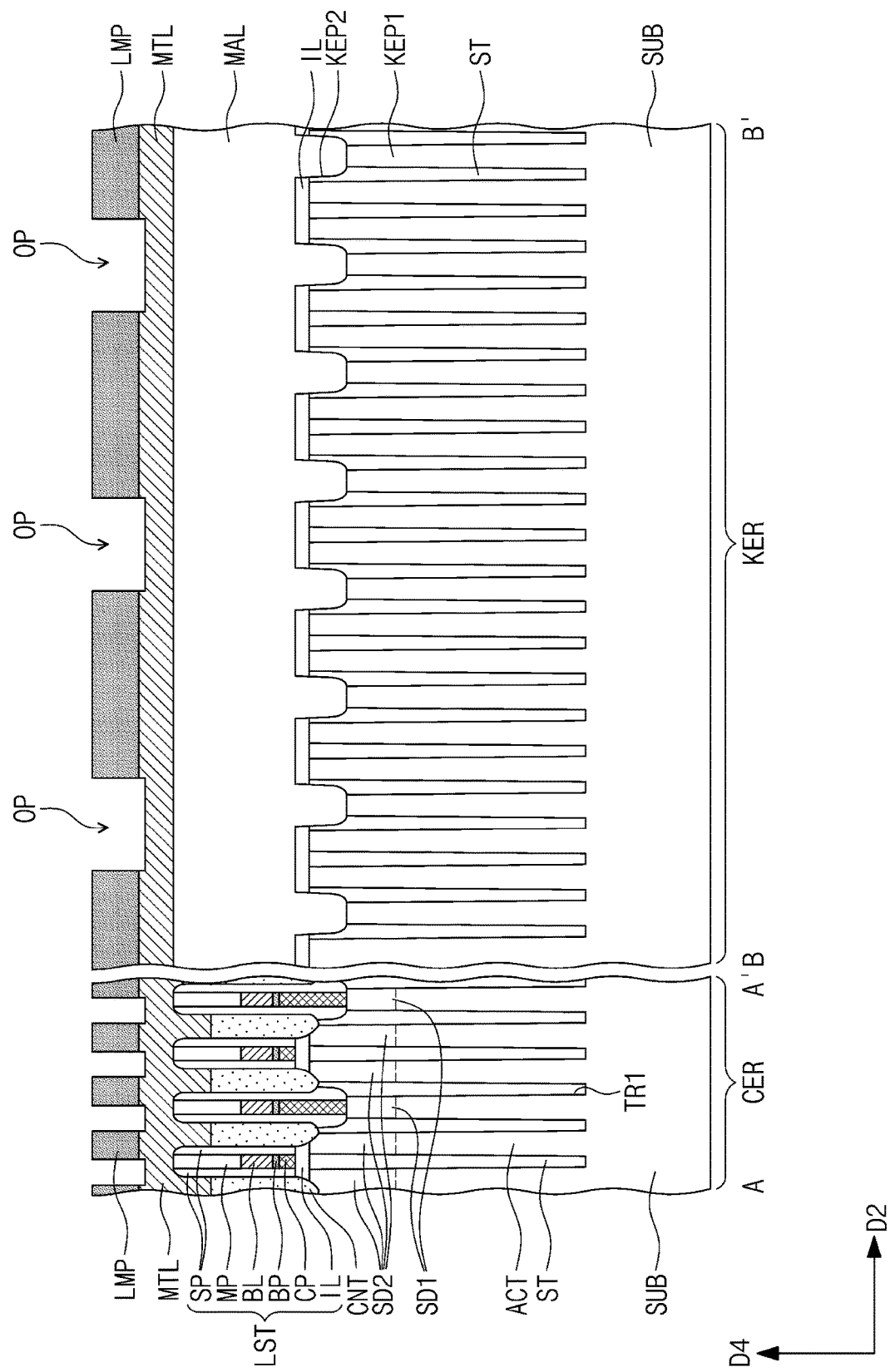

Referring to FIGS. 29 and 30, the pillar patterns OFLA on the cell region CER may be used as an etching mask to pattern the lower mask layer LML to form lower mask patterns LMP. A top surface of the metal layer MTL may be exposed between the lower mask patterns LMP. When the substrate SUB is viewed in a plan view, the lower mask patterns LMP may have substantially the same size and shape as those of the pillar patterns OFLA.

The upper mask pattern UMP and the dam patterns ODAM on the key region KER may be used as an etching mask to pattern the lower mask layer LML to form a lower mask pattern LMP. The lower mask pattern LMP may have its openings OP that expose the top surface of the metal layer MTL.

Referring back to FIGS. 2, 3A, and 3E, the lower mask patterns LMP on the cell region CER may be used as an etching mask to pattern the metal layer MTL to form the landing pads LP. The lower mask pattern LMP on the key region KER may be used as an etching mask to pattern the metal layer MTL to form the third key pattern KEP3 including a plurality of openings OP.

The following will discuss a method of forming a landing pad and a third key pattern according to a comparative example of the present inventive concepts. FIGS. 31, 33, 35, and 37 illustrate plan views showing a method of forming a landing pad and a third key pattern according to a comparative example of the present inventive concepts. FIGS. 32, 34, 36, and 38 illustrate cross-sectional views taken along lines A-A' and B-B' of FIGS. 31, 33, 35, and 37, respectively.

Figure 31:
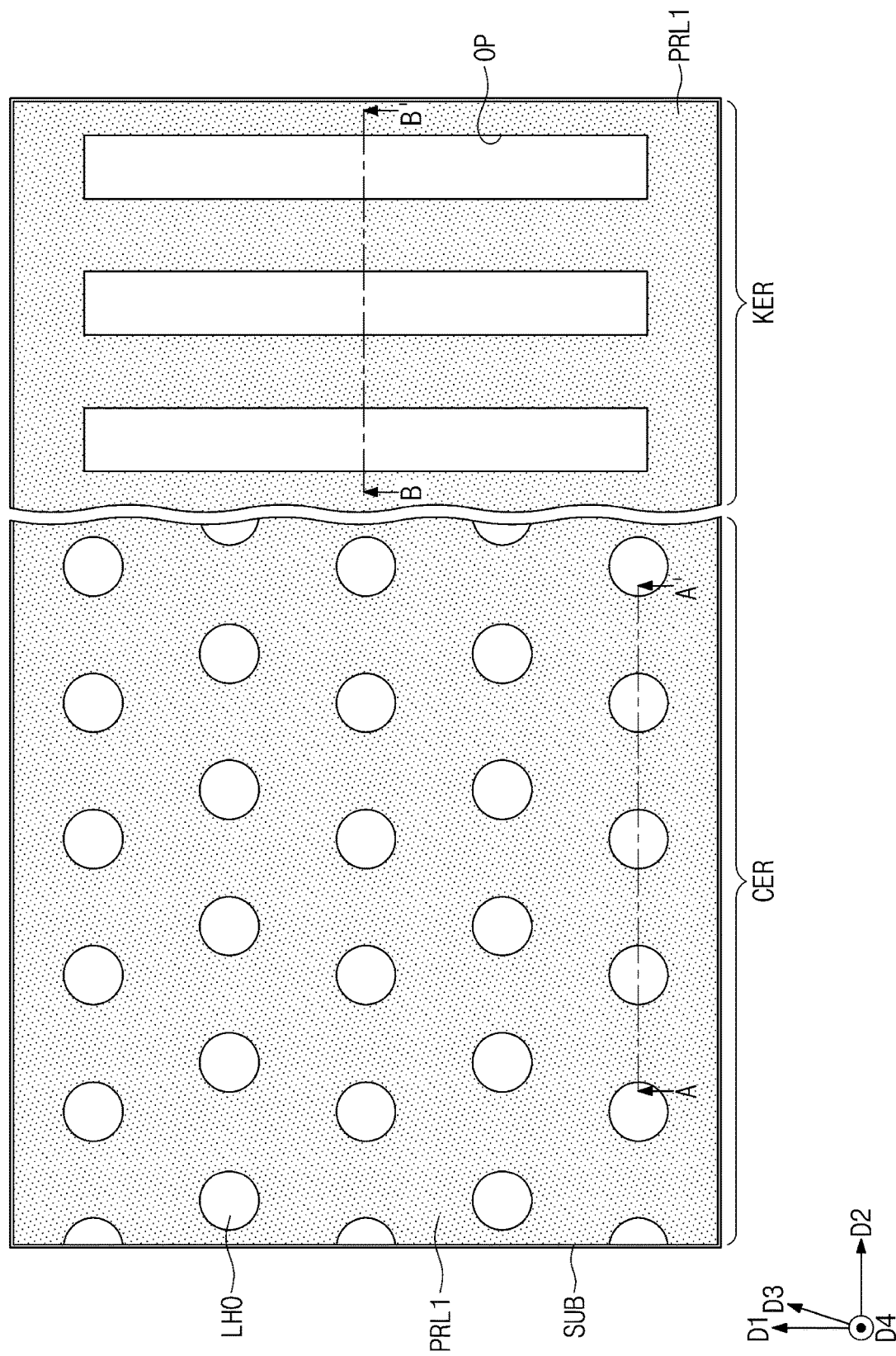
FIGS. 31, 33, 35, and 37 illustrate plan views showing a method of forming a landing pad and a third key pattern according to a comparative example of the present inventive concepts.
Figure 32:
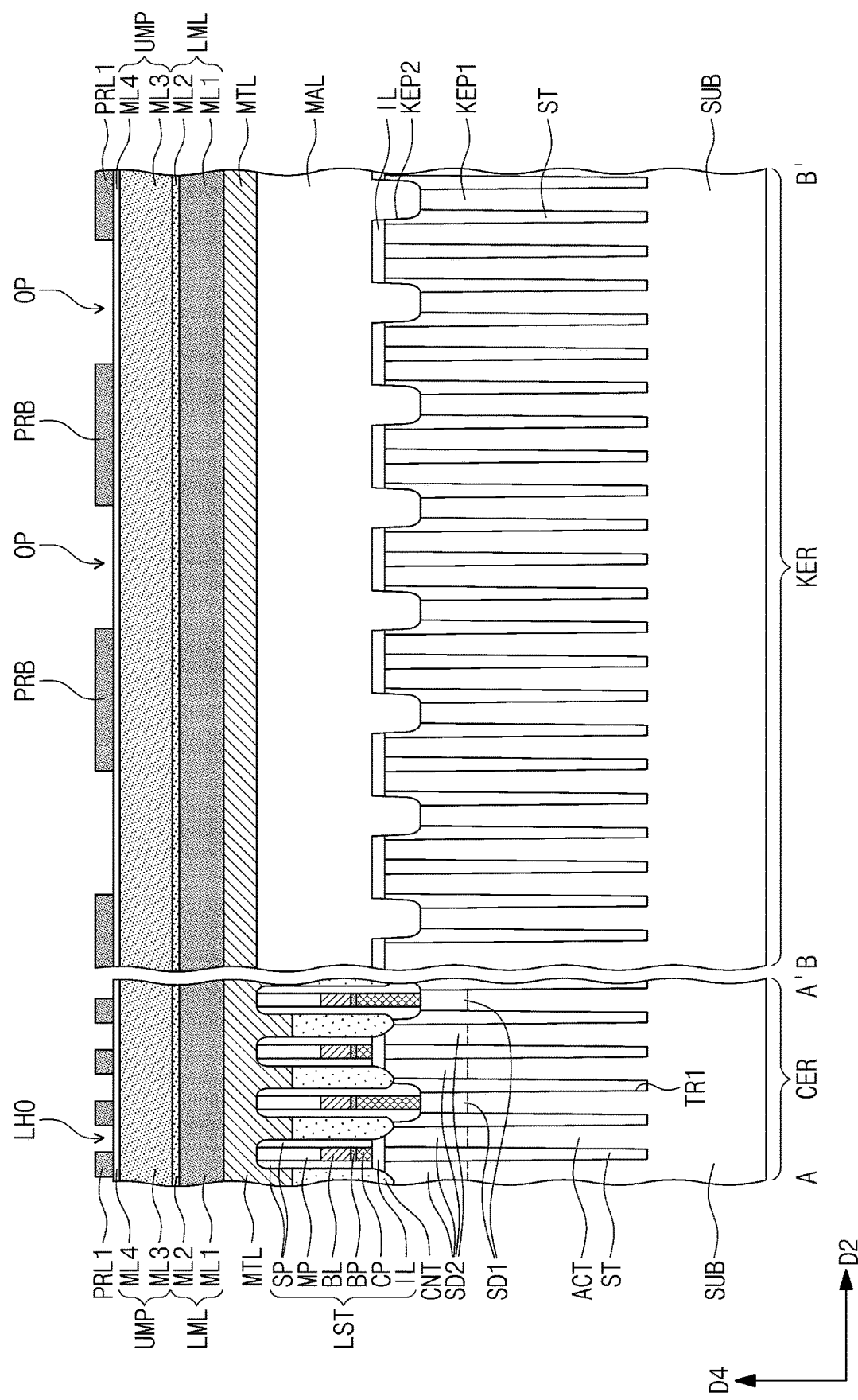
FIGS. 32, 34, 36, and 38 illustrate cross-sectional views taken along lines A-A' and B-B' of FIGS. 31, 33, 35, and 37, respectively.

Referring to FIGS. 31 and 32, different from that shown in FIGS. 19 and 20, the first photoresist layer PRL1 on the key region KER does not include the first preliminary key pattern KPP. The first photoresist layer PRL1 on the key region KER may include bar-shaped openings OP.

Figure 33:
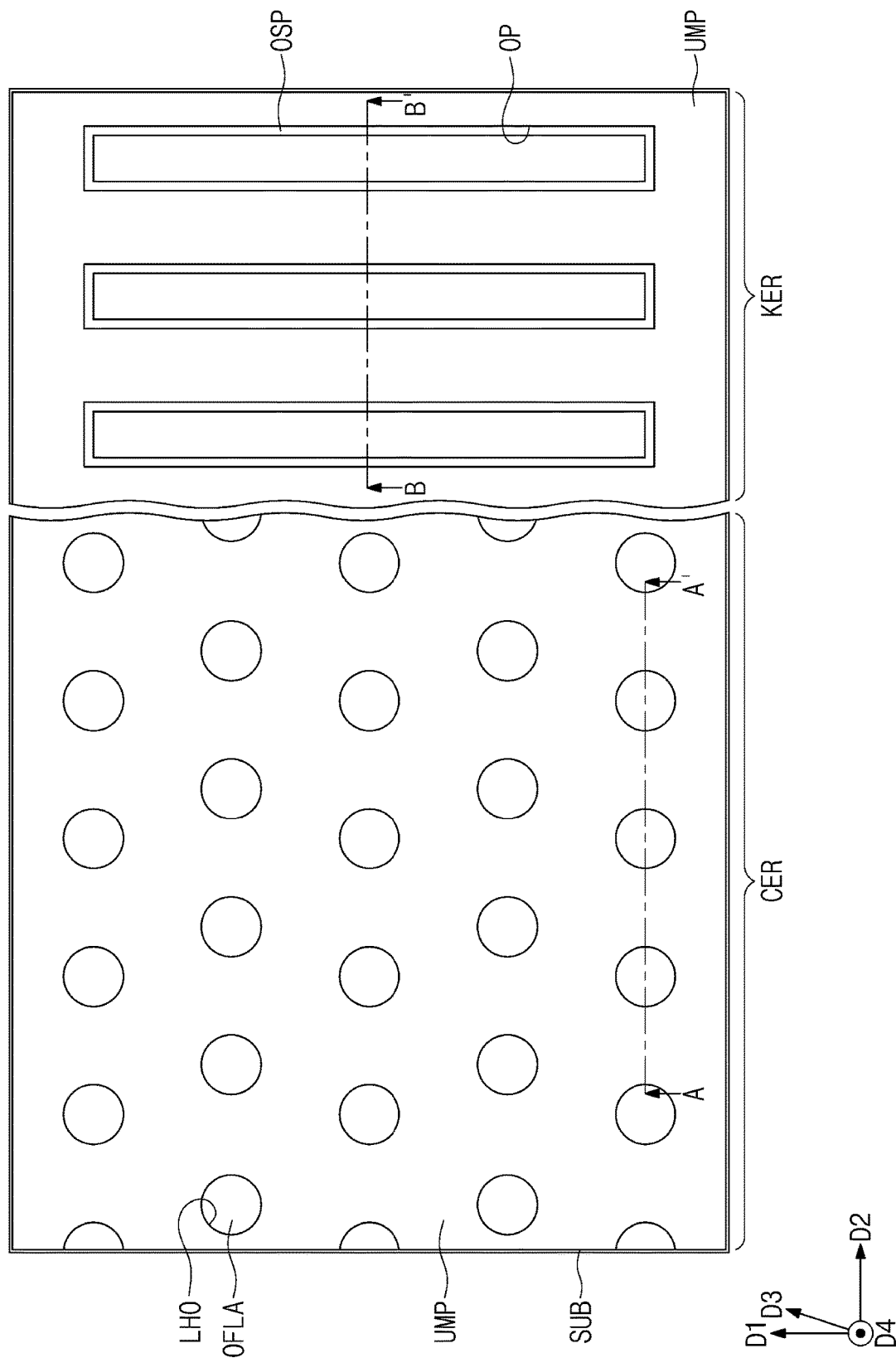
Figure 34:
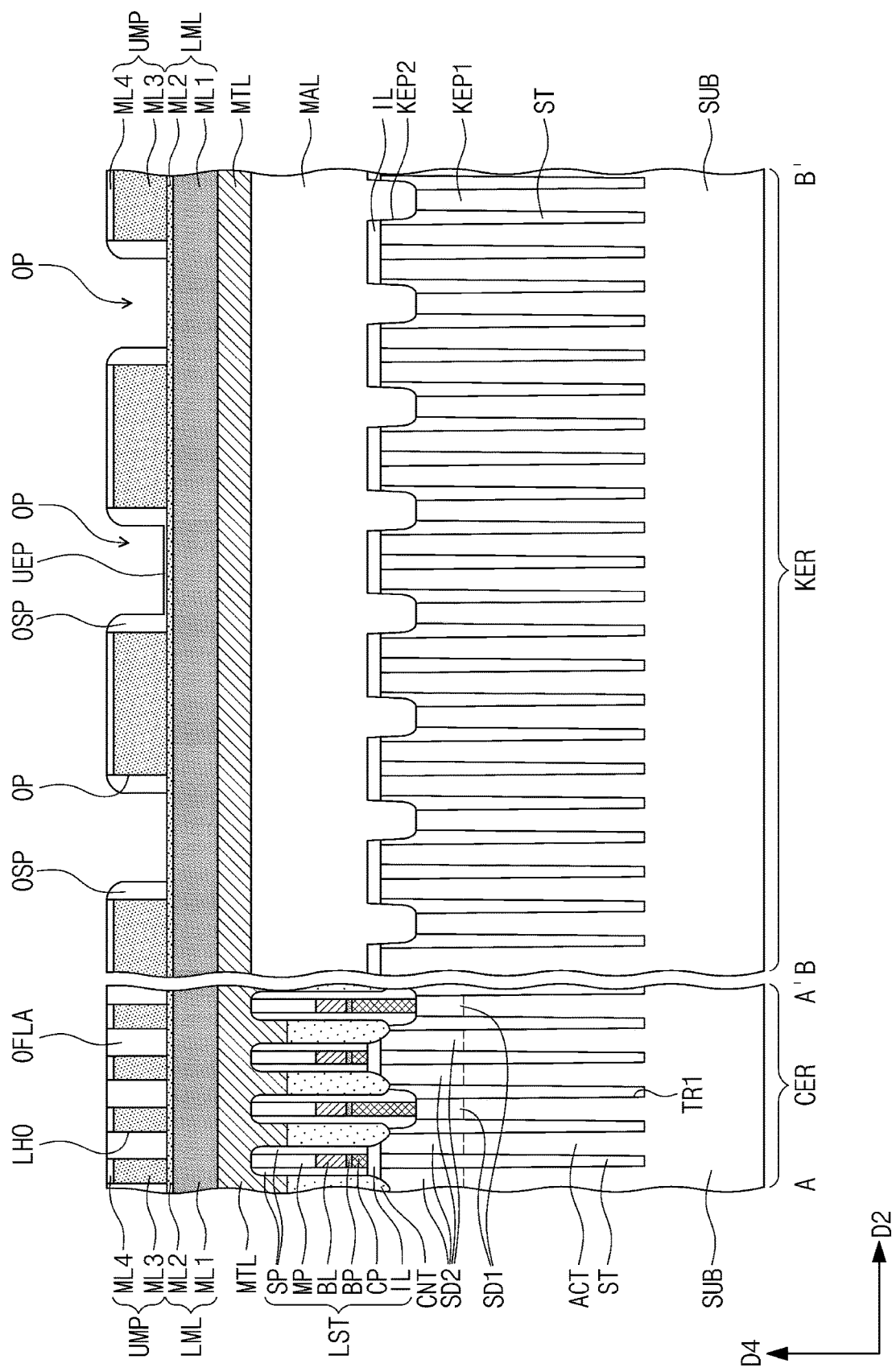

Referring to FIGS. 33 and 34, while the pillar patterns OFLA are formed on the cell region CER, spacer patterns OSP may be formed on the key region KER. The spacer pattern OSP may be formed to cover an inner sidewall of the opening OP in the upper mask pattern UMP.

For example, the formation of the pillar patterns OFLA and the spacer patterns OSP may include conformally forming a dielectric layer on the entire surface of the substrate SUB, and then etching-back the dielectric layer to expose the top surface of the fourth mask layer MHL4. The opening OP may have a width that is relatively larger than a deposition thickness of the dielectric layer, and thus the dielectric layer may be conformally deposited in the opening OP, without completely filling the opening OP. The subsequent etch-back process may allow the dielectric layer to remain as the spacer pattern OSP in the opening OP.

When the etch-back process is performed to form the pillar patterns OFLA on the cell region CER, the dielectric layer on the key region KER may be insufficiently etched back to form a residue UEP that remains on a floor of the opening OP. For example, the opening OP does not expose the top surface of the second mask layer ML2, but instead the residue UEP may cover the top surface of the second mask layer ML2. This phenomenon may induce process defects in forming the third key pattern KEP3.

Figure 35:
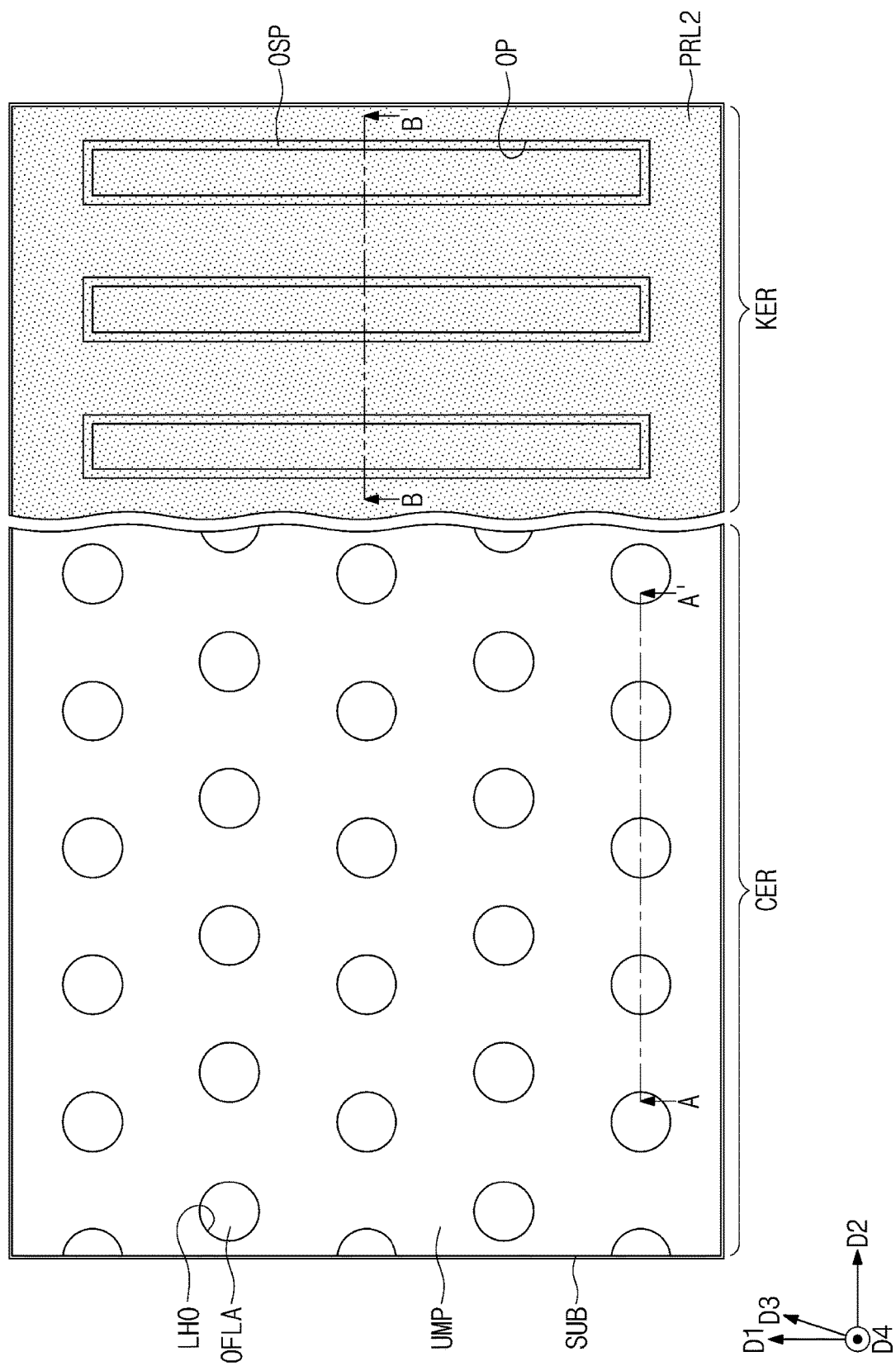
Figure 36:
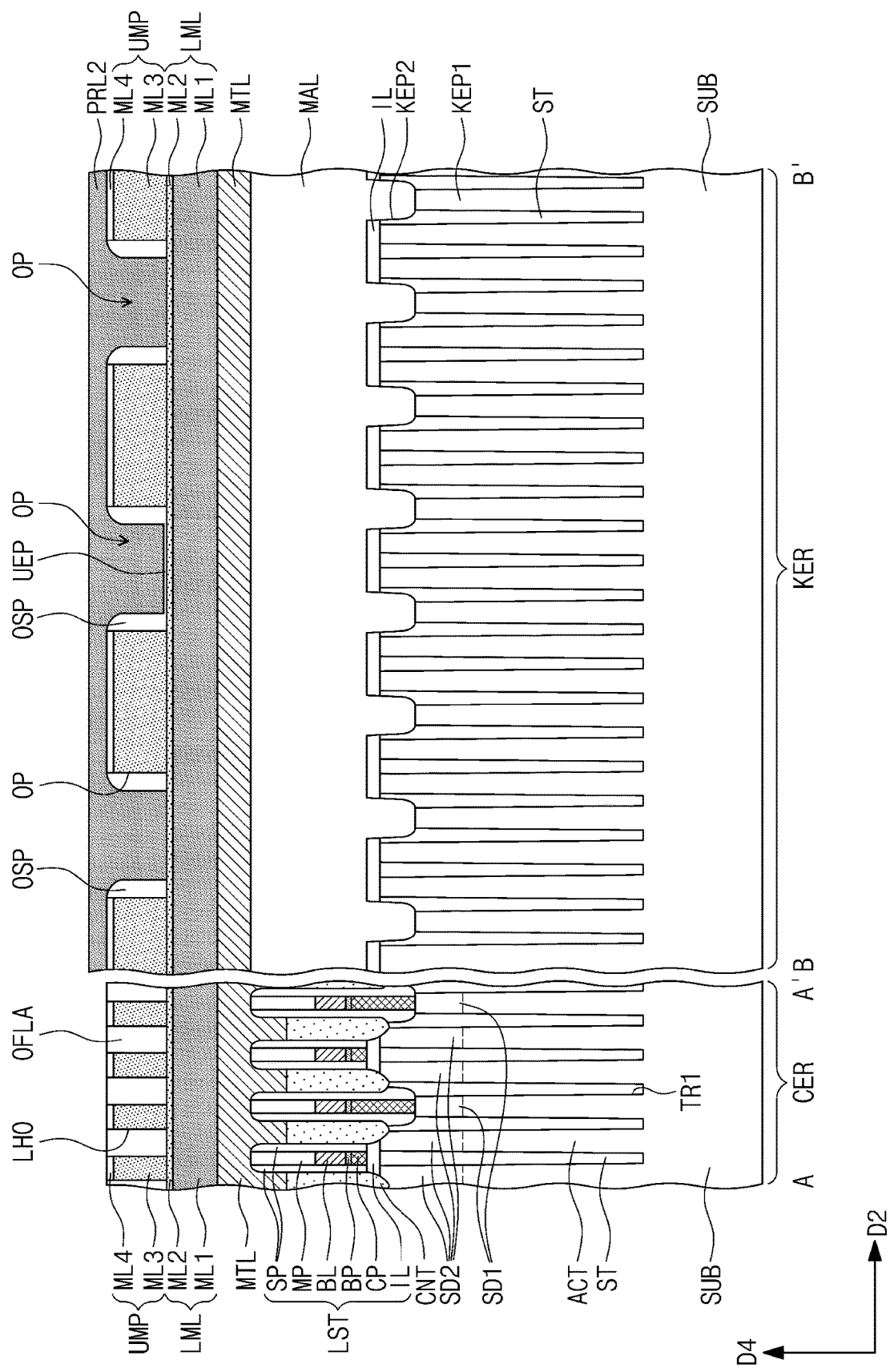

Referring to FIGS. 35 and 36, the second photoresist layer PRL2 may be selectively formed on the key region KER except for the cell region CER. The second photoresist layer PRL2 may open the cell region CER. The second photoresist layer PRL2 may completely cover the key region KER.

Figure 37:
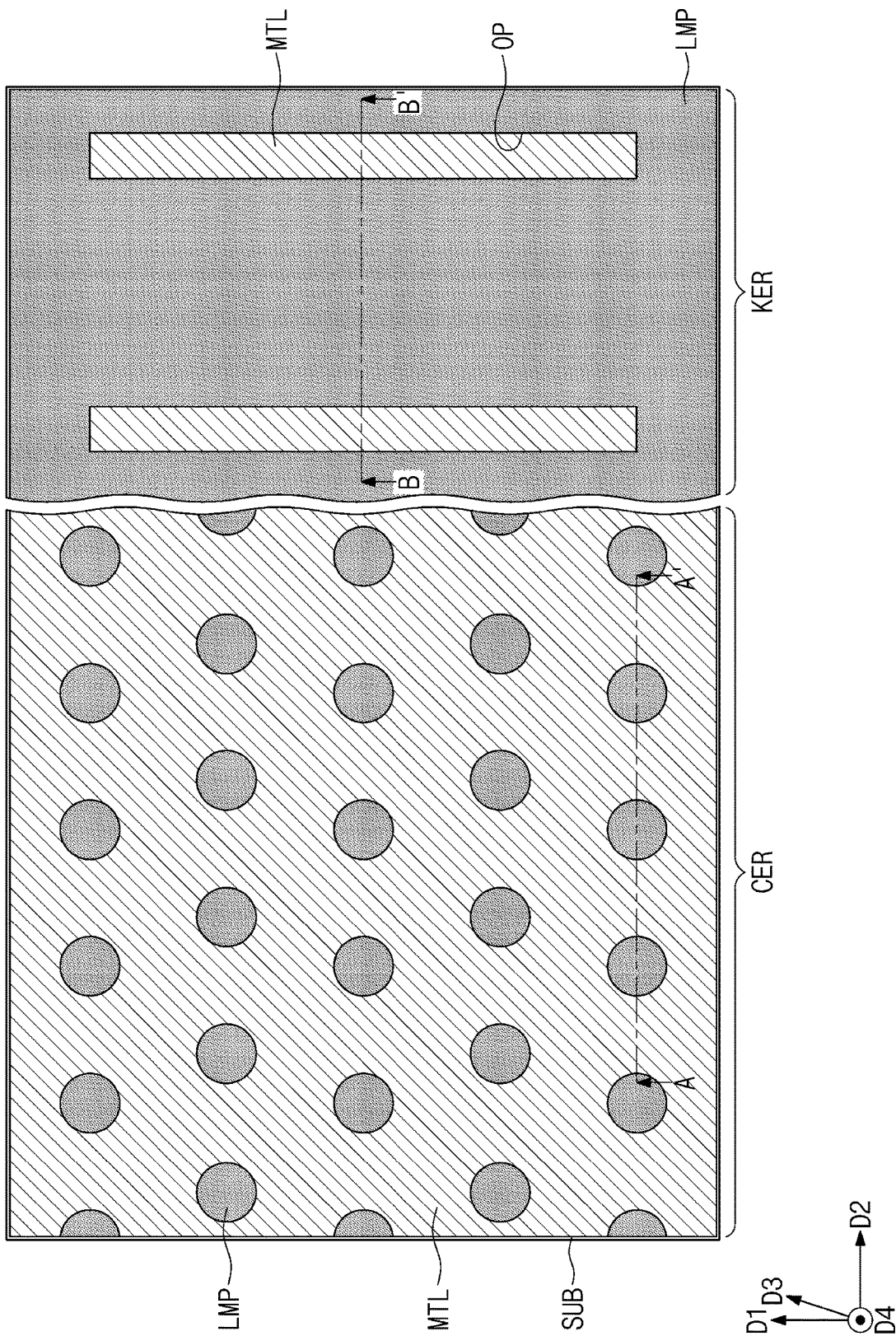
Figure 38:
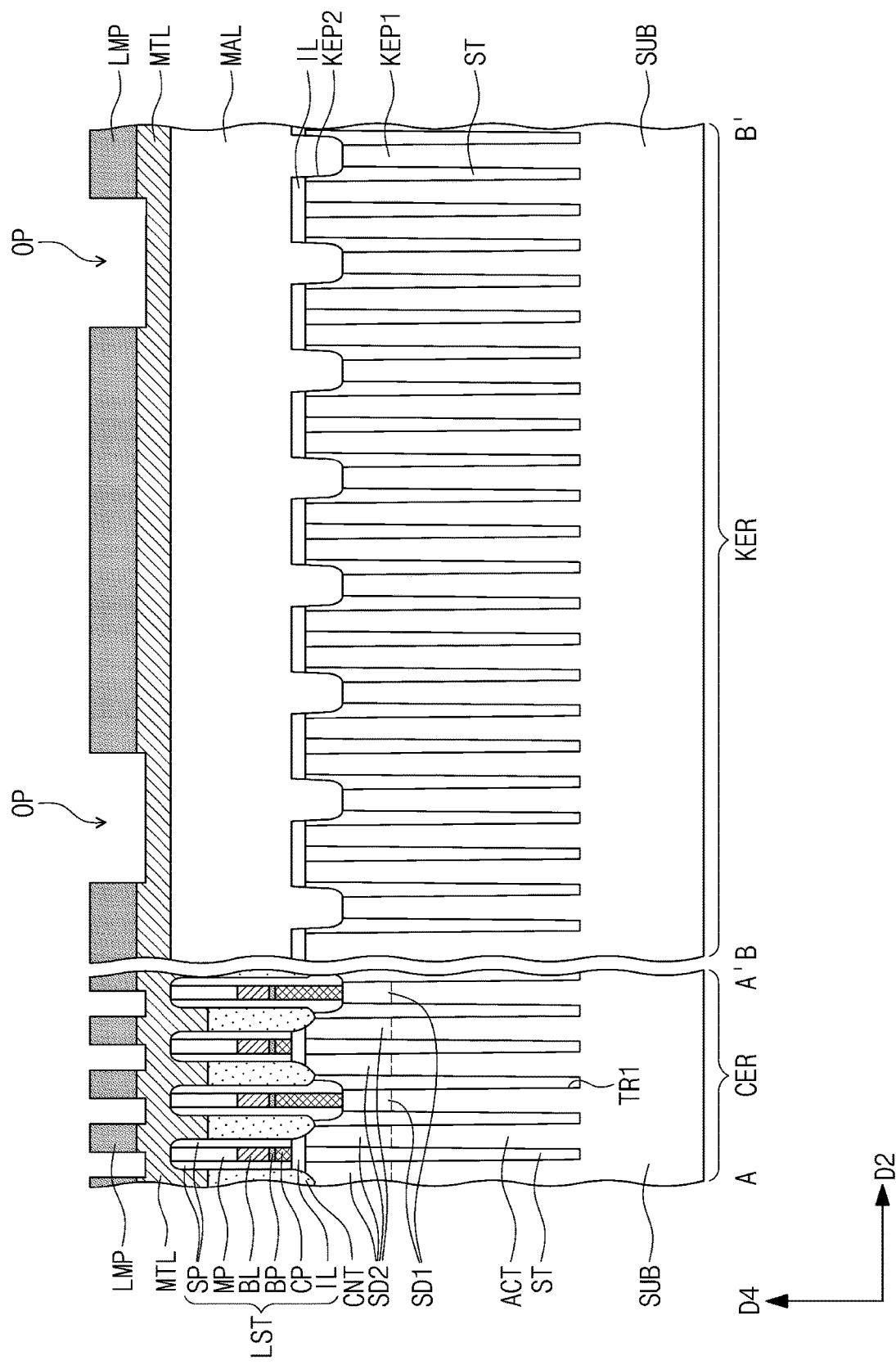

Referring to FIGS. 37 and 38, on the cell region CER, a selective removal may be performed on the upper mask pattern UMP exposed by the second photoresist layer PRL2. On the key region KER, the upper mask pattern UMP may remain because the second photoresist layer PRL2 protects the upper mask pattern UMP.

The pillar patterns OFLA on the cell region CER may be used as an etching mask to pattern the lower mask layer LML to form the lower mask patterns LMP. The upper mask pattern UMP and the spacer patterns OSP on the key region KER may be used as an etching mask to pattern the lower mask layer LML to form a lower mask pattern LMP. The lower mask pattern LMP on the key region KER may include openings OP that expose the top surface of the metal layer MTL.

The spacer pattern OSP on the key region KER may include the residue UEP, and thus the residue UEP may interrupt the formation of the opening OP on a target position. Alternatively, the residue UEP may prevent the opening OP from being formed to have a sufficient size. Therefore, the third key pattern KEP3 may be formed to have an abnormal shape, and as a result, there may be a problem that has a negative effect on reliability of a semiconductor device.

In contrast, according to some example embodiments, a method of forming the third key pattern KEP3 may fundamentally prevent the spacer pattern OSP from being formed into the residue UEP on the key region KER, and thus the method may effectively prohibit process defects that possibly occur in the comparative example discussed above. Accordingly, a semiconductor device may increase in reliability.

Furthermore, according to some example embodiments of the present inventive concepts, the key region KER may include the dam patterns ODAM that are formed to correspond to the pillar patterns OFLA on the cell region CER. Therefore, even when an etch-back process is performed to form the pillar patterns OFLA, the dam patterns ODAM may also be stably formed together with the pillar patterns OFLA. As a result, according to the present inventive concepts, the degree of freedom of semiconductor fabrication increases such that the fabrication of the cell region CER is performed to stably form key patterns on the key region KER, with the result that a semiconductor device may increase in reliability.

According to a semiconductor device fabrication method according to some example embodiments of the present inventive concepts, although the fabrication is performed to focus on the formation of target patterns on a cell region, key patterns may be stably formed on a key region. In conclusion, the present inventive concepts may increase the degree of freedom of semiconductor fabrication in the formation of the cell region, and may improve in device reliability.

Although the present inventive concepts have been described in connection with some example embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the present inventive concepts.

What is claimed is:

1. A method of fabricating a semiconductor device, the method comprising:
    forming an etching target layer on a substrate that includes a cell region and a key region;
    sequentially forming a lower mask layer and an upper mask layer on the etching target layer;

performing a first photolithography process to pattern the upper mask layer to form an upper mask pattern, the upper mask pattern including a plurality of holes on the cell region, a preliminary key pattern on the key region, a bar pattern on the key region, and a trench between the preliminary key pattern and the bar pattern;

forming a pillar pattern and a dam pattern that correspondingly fill the plurality of holes and the trench of the upper mask pattern;

performing a second photolithography process to selectively remove the upper mask pattern except for the bar pattern;

patterning, using the pillar pattern, the dam pattern, and the bar pattern as an etching mask, the lower mask layer to form a lower mask pattern; and patterning, using the lower mask pattern as an etching mask, the etching target layer to form an etching target pattern on the cell region and a key pattern on the key region.

2. The method of claim 1, wherein performing the first photolithography process includes:

forming a first photoresist layer on the upper mask layer;

performing exposure and development processes on the first photoresist layer to form the plurality of holes on the cell region and the trench on the key region, the trench defining the preliminary key pattern; and using the first photoresist layer as an etching mask to pattern the upper mask layer.

3. The method of claim 1, wherein the first photolithography process is an extreme ultraviolet (EUV) lithography process.

4. The method of claim 3, wherein the plurality of holes are arranged in a first column and a second column such that the plurality of holes in each of the first column and the second column are zigzag arranged in a first direction, wherein the plurality of holes of the first column are spaced apart from each other at a first pitch, wherein the plurality of holes of the second column are spaced apart from each other at a second pitch substantially the same as the first pitch, and wherein the first pitch is different from a distance between a center of a first hole included in the first column and a center of a second hole included in the second column, the second hole being adjacent to the first hole.

5. The method of claim 1, wherein a diameter of each of the plurality of holes is less than a width of the trench.

6. The method of claim 5, wherein the width of the trench has a value from about 50 nm to about 70 nm.

7. The method of claim 5, wherein forming the pillar pattern and the dam pattern includes:

forming a dielectric layer on the upper mask pattern; and performing an etch-back process on the dielectric layer to expose a top surface of the upper mask pattern on the cell region, wherein the dielectric layer is deposited to have a thickness greater than half the width of the trench.

8. The method of claim 1, wherein, when the substrate is viewed in a plan view, the trench surrounds the preliminary key pattern.

9. The method of claim 1, wherein performing the second photolithography process includes:

forming a second photoresist layer that exposes the cell region and covers the key region;

performing exposure and development processes on the second photoresist layer such that the second photoresist layer covers the bar pattern and exposes the preliminary key pattern; and selectively removing the preliminary key pattern on the key region and the upper mask pattern on the cell region exposed by the second photoresist layer.

10. The method of claim 9, wherein the second photoresist layer covers a portion of a top surface of the dam pattern and exposes a remaining portion of the top surface of the dam pattern.

11. A method of fabricating a semiconductor device, the method comprising:

forming a metal layer on a substrate that includes a cell region and a key region;

forming a mask pattern on the metal layer, the mask pattern on the cell region including a plurality of holes, and the mask pattern on the key region including a trench that extends in a first direction;

forming on the mask pattern a dielectric layer that fills the plurality of holes and the trench;

performing an etch-back process on the dielectric layer to expose a top surface of the mask pattern on the cell region, thereby forming a plurality of pillar patterns to fill the plurality of holes and a dam pattern to fill the trench;

removing the mask pattern; and patterning, using the plurality of pillar patterns and the dam pattern as an etching mask, the metal layer to form a plurality of landing pads on the cell region and a key pattern on the key region.

12. The method of claim 11, wherein a diameter of each of the plurality of holes is less than a width of the trench.

13. The method of claim 11, wherein the dielectric layer is deposited to have a thickness greater than half a width of the trench.

14. The method of claim 11, further comprising:

before forming of the metal layer, forming an active pattern on the cell region;

forming a gate electrode that extends across the active pattern in a second direction different from the first direction;

forming on the active pattern a bit line that extends in the first direction; and forming on a sidewall of the bit line a contact connected to the active pattern, wherein the contact is connected to a corresponding landing pad of the plurality of landing pads.

15. The method of claim 11, wherein the plurality of landing pads are zigzag arranged in a first column and a second column such that the plurality of landing pads in each of the first column and the second column are zigzag arranged in the first direction, wherein the plurality of landing pads of the first column are spaced apart from each other at a first pitch, wherein the plurality of landing pads of the second column are spaced apart from each other at a second pitch substantially the same as the first pitch, and wherein the first pitch is different from a distance between a center of a first landing pad included in the first column and a center of a second landing pad included in the second column, the second landing pad being adjacent to the first landing pad.

16. A method of fabricating a semiconductor device, the method comprising:
forming a first trench by performing a patterning process on a substrate that includes a cell region and a key region, the first trench defining an active pattern on the cell region;
forming a device isolation layer that fills the first trench;
forming a second trench by patterning an upper portion of the active pattern and an upper portion of the device isolation layer, the second trench extending in a first direction;
forming a gate electrode in the second trench;
forming on the active pattern a line structure that extends in a second direction different from the first direction, the line structure including a contact part and a bit line on the contact part, the contact part being coupled to a first region of the active pattern;
forming on a first sidewall of the line structure a contact coupled to a second region of the active pattern;
forming a metal layer on the cell region and the key region;
patterning the metal layer to form a landing pad on the cell region and a key pattern on the key region, the landing pad being connected to the contact; and
forming a capacitor on the landing pad,
wherein forming the landing pad and the key pattern includes:
sequentially forming a lower mask layer and an upper mask layer on the metal layer;
performing a first photolithography process to pattern the upper mask layer to form an upper mask pattern, the upper mask pattern including a hole on the cell region and a trench on the key region;
forming a pillar pattern and a dam pattern that correspondingly fill the hole and the trench of the upper mask pattern;
removing the upper mask pattern;
patterning, using the pillar pattern and the dam pattern as a first etching mask, the lower mask layer to form a lower mask pattern; and
patterning, using the lower mask pattern as a second etching mask, the metal layer to form the landing pad on the cell region and the key pattern on the key region.

17. The method of claim 16,
wherein the first photolithography process is an extreme ultraviolet (EUV) lithography process.

18. The method of claim 16,
wherein the upper mask pattern further includes a preliminary key pattern and a bar pattern that are on the key region,
wherein the trench is defined between the preliminary key pattern and the bar pattern, and
wherein removing the upper mask pattern includes performing a second photolithography process to selectively remove the upper mask pattern except for the bar pattern.

19. The method of claim 18,
wherein patterning the lower mask pattern includes using the bar pattern together with the dam pattern as the second etching mask.

20. The method of claim 16,
wherein forming the pillar pattern and the dam pattern includes:
forming a dielectric layer on the upper mask pattern; and
performing an etch-back process on the dielectric layer to expose a top surface of the upper mask pattern on the cell region,
wherein the dielectric layer is deposited to have a thickness greater than half a width of the trench.

* * * * *